(12) United States Patent
Misaka

(10) Patent No.: US 7,790,337 B2
(45) Date of Patent: Sep. 7, 2010

(54) PHOTOMASK, PATTERN FORMATION METHOD USING THE SAME AND MASK DATA CREATION METHOD

(75) Inventor: Akio Misaka, Osaka (JP)

(73) Assignee: Panasonic Corporation, Osaka (JP)

( * ) Notice: Subject to any disclaimer, the term of this patent is extended or adjusted under 35 U.S.C. 154(b) by 632 days.

(21) Appl. No.: 11/701,511

(22) Filed: Feb. 2, 2007

(65) Prior Publication Data

US 2007/0184361 A1 Aug. 9, 2007

(30) Foreign Application Priority Data

Feb. 3, 2006 (JP) ............... 2006-027592

(51) Int. Cl.
*G03F 1/00* (2006.01)
*H01L 21/00* (2006.01)
(52) U.S. Cl. .......................... 430/5; 430/311
(58) Field of Classification Search ............ 430/5
See application file for complete search history.

(56) References Cited

U.S. PATENT DOCUMENTS 5,786,113 A * 7/1998 Hashimoto et al. ............ 430/5
6,207,333 B1 * 3/2001 Adair et al. ..................... 430/5
6,503,666 B1 * 1/2003 Pierrat ............................ 430/5
2004/0081899 A1 * 4/2004 Misaka ........................... 430/5
2004/0121244 A1 * 6/2004 Misaka ........................... 430/5
2004/0265708 A1 * 12/2004 Misaka ........................... 430/5

FOREIGN PATENT DOCUMENTS

| JP | 05-165194 | 6/1993 |
|----|-----------|--------|
| JP | 2000-206667 | 7/2000 |
| JP | 3708875 | 8/2005 |
| WO | WO 01/35166 A1 | 5/2001 |

* cited by examiner

*Primary Examiner*—Stephen Rosasco
*Assistant Examiner*—Jonathan Jelsma
(74) *Attorney, Agent, or Firm*—McDermott Will & Emery LLP

(57) ABSTRACT

A principal pattern made of a plurality of isolated transparent portions is formed in a light-shielding portion disposed on a transparent substrate having a transparent property against exposing light. The principal pattern includes a first principal pattern and a second principal pattern adjacent to each other at a given distance, and a first auxiliary pattern made of a phase shifter portion for transmitting the exposing light in an opposite phase to the exposing light passing through the transparent portion is formed between the first principal pattern and the second principal pattern.

36 Claims, 29 Drawing Sheets

STRUCTURE A

STRUCTURE B

STRUCTURE C

STRUCTURE D

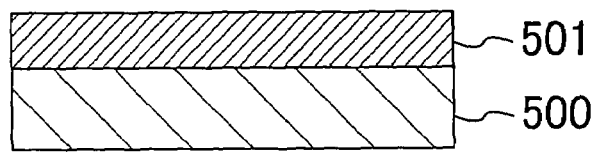
FIG. 17A
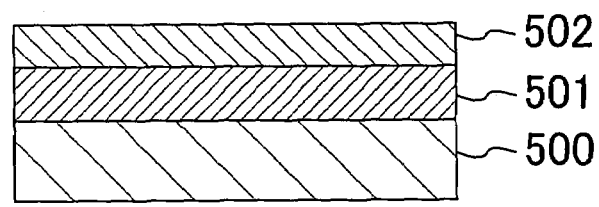
FIG. 17B
FIG. 17C
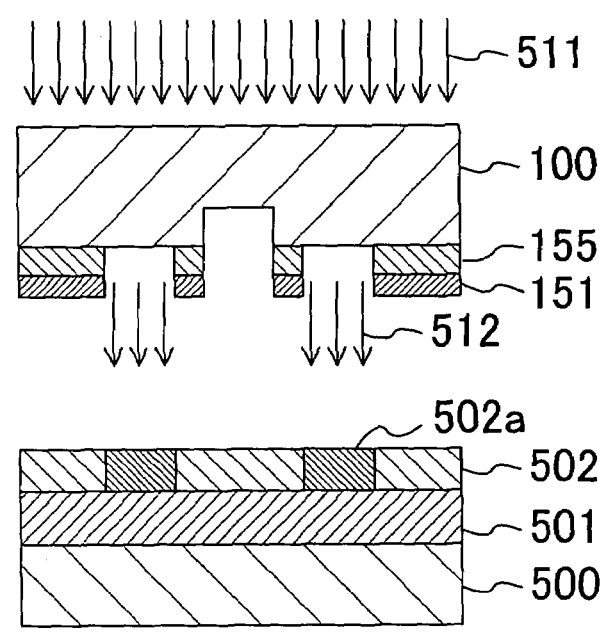
FIG. 17D
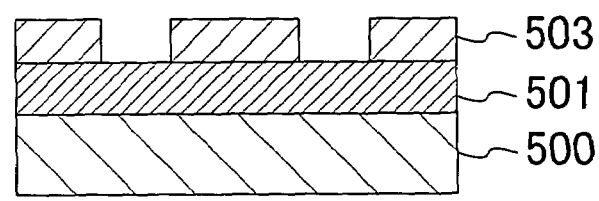

[GENERAL EXPOSURE LIGHT SOURCE]

[ANNULAR EXPOSURE LIGHT SOURCE]

[QUADRUPOLE EXPOSURE LIGHT SOURCE]

[ANNULAR/QUADRUPOLE EXPOSURE LIGHT SOURCE]

PHOTOMASK, PATTERN FORMATION METHOD USING THE SAME AND MASK DATA CREATION METHOD

BACKGROUND OF THE INVENTION

The present invention relates to a photomask for use in forming a fine pattern in fabrication of a semiconductor integrated circuit device or the like, a pattern formation method using the photomask and a mask data creation method for the photomask.

Recently, there are increasing demands for further refinement of circuit patterns for increasing the degree of integration of a large scale integrated circuit device (hereinafter referred to as the LSI) realized by using semiconductor. As a result, it has become very significant to thin an interconnect pattern included in a circuit.

Now, the thinning of an interconnect pattern by a conventional optical exposure system will be described on the assumption that positive resist process is employed. In this case, a line pattern means a portion of a resist film not exposed to exposing light, namely, a resist portion (a resist pattern) remaining after development. Also, a space pattern means a portion of the resist film exposed to the exposing light, namely, an opening portion (a resist removal pattern) formed by removing the resist film through the development. In the case where negative resist process is employed instead of the positive resist process, the definitions of the line pattern and the space pattern are replaced with each other.

When a pattern is formed by using the optical exposure system, a photomask in which a light-shielding pattern of Cr (chromium) or the like is drawn in accordance with a desired pattern on a transparent substrate (a substrate having a transparent property) of quartz or the like is conventionally used. In such a photomask, a region where the Cr pattern exists is a light-shielding portion that does not transmit exposing light of a given wavelength at all (having transmittance of substantially 0%) and a region where no Cr pattern exists (an opening) is a transparent portion that has transmittance equivalent to that of the transparent substrate against the exposing light (having transmittance of substantially 100%). At this point, all mask patterns are drawn on the transparent substrate, and in the pattern exposure, the transparent substrate is irradiated from a side where the mask patterns are not provided, and therefore, the exposing light transmits the mask patterns after transmitting the transparent substrate. Accordingly, in the following description, transmittance of a mask pattern against exposing light is not the absolute transmittance of each portion of the mask pattern but is relative transmittance obtained on the basis of the transmittance of a transparent substrate against the exposing light unless otherwise mentioned.

In the case where a photomask as described above is used for the exposure of a wafer where a resist has been applied, an image of light having passed through the mask is projected onto the wafer. In this case, a light-shielding portion of the photomask corresponds to an unexposed region of the resist and an opening (transparent portion) of the photomask corresponds to an exposed region of the resist, so that a desired resist pattern can be formed on the wafer. Accordingly, such a photomask, namely, a photomask composed of a light-shielding portion and a transparent portion against exposing light of a given wavelength, is designated as a binary mask. It is, however, difficult to accurately form a fine pattern smaller than the exposure wavelength (the wavelength of the exposing light) by using the binary mask even when a mask pattern in substantially the same shape as the desired pattern is provided on the binary mask. This is because the diffraction of light is so remarkable in the formation of a fine pattern that the light rounds also to a portion of the resist corresponding to a light-shielding portion of the photomask, and hence, sufficient contrast cannot be realized in an optical image formed on the resist. As a result, sufficient contrast in the sensitivity cannot be attained between an unexposed region and an exposed region of the resist.

In a method proposed for overcoming this problem, oblique incident illumination (off-axis illumination), that is, a kind of modified illumination, is employed in the exposure optical system, so as to improve the contrast of an optical image in formation of repeated patterns. The oblique incident illumination is effective in improving the contrast of an optical image in the formation of repeated patterns, and in particular, it can keep high contrast even in a defocus state in the formation of repeated patterns. In other words, when the oblique incident illumination is employed, the contrast (exposure margin) and depth of focus (DOF) are improved in the formation of repeated patterns.

However, the oblique incident illumination cannot improve the contrast and the DOF in formation of all patterns. In particular, it cannot exhibit any improvement effect in formation of a fine pattern smaller than the exposure wavelength and corresponding to a transparent portion present isolatedly in a light-shielding portion of a photomask. Therefore, instead of using a mask pattern in substantially the same shape as a desired pattern, a method using a mask on which a principal pattern corresponding to a desired pattern and in substantially the same shape as the desired pattern and an auxiliary pattern that does not affect the resist pattern shape but affects an optical image are both provided has been proposed (see, for example, Patent Document 1).

FIG. 29A is a plan view of a photomask disclosed in Patent Document 1. As shown in FIG. 29A, a principal pattern 900 made of an isolated transparent portion is provided in a light-shielding portion 901 of the photomask. Also, auxiliary patterns 902 made of transparent portions each having a width limited to transmit exposing light to the extent that a resist pattern is not formed are provided on both sides of the principal pattern 900. In this case, in order to improve the contrast of an optical image formed by the exposing light having passed through the principal pattern 900, it is necessary to set a distance between the center of the principal pattern 900 and the center of each auxiliary pattern 902 to a range from $\lambda/NA$ to $1.4 \times \lambda/NA$, wherein $\lambda$ indicates a wavelength of the exposing light and NA indicates a reduction ratio of a reduction projection optical system of a projection aligner. When auxiliary patterns are provided on a photomask as shown in FIG. 29A, an optical image similar to repeated patterns is formed. Therefore, when such a photomask is subjected to exposure using the oblique incident illumination, the contrast and the focus of depth can be improved.

Although the resolution of a simple pattern including an isolated transparent portion is improved by introducing auxiliary patterns as described above, the following problem arises when auxiliary patterns are provided in a pattern of complicated layout including a plurality of principal patterns: In the case where there are a plurality of principal patterns, if an auxiliary pattern is disposed in a position for improving the contrast of an isolated single principal pattern, the contrast may be lowered on the contrary. Also, when an auxiliary pattern is to be provided to each of the plural principal patterns, some auxiliary patterns are close to each other at a distance smaller than the exposure wavelength. When the auxiliary patterns each provided so as not to singly form a resist pattern are thus close to each other, the exposing light transmits the auxiliary patterns to the extent that a corresponding portion of the resist is exposed.

As a countermeasure for this problem, the following method has been proposed (see, for example, Patent Document 2): A plurality of auxiliary patterns are provided in accordance with the layout including a plurality of principal patterns, and auxiliary patterns adjacent to each other out of the plural auxiliary patterns are set to transmit exposing light in opposite phases to each other, so that the lights respectively passing through the adjacent auxiliary patterns can cancel each other. Thus, the contrast of the light passing through the principal patterns is improved, and transfer of the auxiliary patterns is prevented.

FIG. 29B is a plan view of a photomask disclosed in Patent Document 2. As shown in FIG. 29B, a principal pattern 900 made of an isolated transparent portion is provided in a light-shielding portion 901 of the photomask. Also, auxiliary patterns 902 made of a transparent portion are provided on both sides of the principal pattern 900, and auxiliary patterns 903 made of a phase shifter are provided on sides of the auxiliary patterns 902 opposite to the principal pattern 900.

Patent Document 1: Japanese Laid-Open Patent Publication No. 5-165194

Patent Document 2: Japanese Laid-Open Patent Publication No. 2000-206667

Patent Document 3: Japanese Patent Publication No. 3708875

SUMMARY OF THE INVENTION

There still remain problems as follows even in the technique disclosed in Patent Document 2, namely, in the conventional method in which auxiliary patterns are provided to a principal pattern made of an isolated transparent portion disposed in a light-shielding portion of a photomask so as to improve the contrast of a light intensity distribution obtained on an imaging face of exposing light having passed through the principal pattern to be transferred and at the same time, to suppress the transfer of the auxiliary patterns.

In the technique disclosed in Patent Document 2, an auxiliary pattern provided for increasing the contrast of the light intensity distribution obtained on the imaging face of the exposing light having passed through the principal pattern should be disposed in a position away from the principal pattern by a distance of approximately $\lambda/NA$. Accordingly, when adjacent principal patterns are close to each other at a distance smaller than $\lambda/NA$, namely, smaller than the exposure wavelength, the contrast of the light intensity distribution obtained on the imaging face of the exposing light having passed through these principal patterns cannot be improved.

Furthermore, in the technique disclosed in Patent Document 2, when a distance between adjacent principal patterns exceeds $2.8 \times \lambda/NA$, it is necessary to provide two or more auxiliary patterns (of the same phase) between these principal patterns. In this case, the auxiliary patterns are so close to each other that the auxiliary patterns may be transferred. In order to prevent the transfer, another additional auxiliary pattern may be provided so that there can be a relationship of an opposite phase between adjacent auxiliary patterns. In this case, however, the number of auxiliary patterns is so large that the load of mask processing is increased as well as the layout of the auxiliary patterns is too complicated to design an optimal mask pattern.

In consideration of the aforementioned conventional problems and disadvantages, an object of the invention is providing a photomask including an auxiliary pattern capable of increasing contrast of a light intensity distribution obtained on an imaging face of exposing light having passed through principal patterns even in an arbitrary layout where the principal patterns made of a transparent portion provided in a light-shielding portion are close to each other at a distance smaller than an exposure wavelength. Another object is providing a photomask easily capable of suppressing transfer of an auxiliary pattern while improving contrast of a light intensity distribution obtained on an imaging face of exposing light having passed through a principal pattern to be transferred even in an arbitrary layout, a pattern formation method using the photomask and a mask data creation method for the photomask.

The first photomask of this invention includes a principal pattern made of a plurality of isolated transparent portions and formed in a light-shielding portion disposed on a transparent substrate having a transparent property against exposing light, and the principal pattern includes a first principal pattern and a second principal pattern adjacent to each other at a given distance, and a first auxiliary pattern made of a phase shifter portion for transmitting the exposing light in an opposite phase to the exposing light passing through the transparent portion is formed between the first principal pattern and the second principal pattern.

According to the first photomask of this invention, even in an arbitrary layout including principal patterns close to each other at a distance smaller than an exposure wavelength ($\lambda/NA$; which applies in description below), in which contrast cannot be improved by using an auxiliary pattern in the conventional technique, the contrast of a light intensity distribution obtained on an imaging face of exposing light having passed through the principal patterns can be improved.

In the first photomask of the invention, a single phase shifter portion is preferably provided, as the first auxiliary pattern, between the first principal pattern and the second principal pattern with a part of the light-shielding portion sandwiched between each of the first principal pattern and the second principal pattern and the first auxiliary pattern. Thus, the size of the auxiliary pattern can be adjusted independently from the size of the principal pattern, and transfer of auxiliary patterns derived from their closeness can be avoided.

In the first photomask of the invention, a second auxiliary pattern made of a semi-light-shielding portion for partially transmitting the exposing light in the same phase to the exposing light passing through the transparent portion is preferably formed on a side, opposite to the first auxiliary pattern, of at least one of the first principal pattern and the second principal pattern. Thus, even in the case where the first principal pattern or the second principal pattern is close to another principal pattern at a distance larger than the exposure wavelength (including a case where the first principal pattern or the second principal pattern is not close to another principal pattern), the effect to improve the contrast of the light intensity distribution can be attained.

The second photomask of this invention includes a principal pattern made of a plurality of isolated transparent portions and formed in a light-shielding portion disposed on a transparent substrate having a transparent property against exposing light, and the principal pattern includes a first principal pattern, a second principal pattern adjacent to the first principal pattern at a first distance and a third principal pattern adjacent to the first principal pattern at a second distance larger than the first distance, an auxiliary pattern made of a semi-light-shielding portion for partially transmitting the exposing light in the same phase to the exposing light passing through the transparent portion is formed between the first principal pattern and the third principal pattern, and an auxiliary pattern made of the semi-light-shielding portion is not formed between the first principal pattern and the second principal pattern.

According to the second photomask, even in an arbitrary layout including principal patterns close to each other at a distance larger than the exposure wavelength, the contrast of a light intensity distribution obtained on an imaging face of exposing light having passed through the principal patterns can be improved.

The third photomask of this invention includes a principal pattern made of a plurality of isolated transparent portions and formed in a light-shielding portion disposed on a transparent substrate having a transparent property against exposing light, and the principal pattern includes a first principal pattern, a second principal pattern adjacent to the first principal pattern at a first distance and a third principal pattern adjacent to the first principal pattern at a second distance larger than the first distance, a first auxiliary pattern made of a phase shifter portion for transmitting the exposing light in an opposite phase to the exposing light passing through the transparent portion is formed between the first principal pattern and the second principal pattern, and an auxiliary pattern made of the phase shifter portion is not formed between the first principal pattern and the third principal pattern.

According to the third photomask of this invention, even in an arbitrary layout including a first principal pattern and a second principal pattern close to each other at a distance smaller than the exposure wavelength, namely, even in a layout in which the contrast cannot improved by using an auxiliary pattern in the conventional technique, the contrast of a light intensity distribution obtained on an imaging face of exposing light having passed through the principal patterns can be improved.

In the third photomask of the invention, a single phase shifter portion is preferably provided, as the first auxiliary pattern, at a center between the first principal pattern and the second principal pattern with a part of the light-shielding portion sandwiched between each of the first principal pattern and the second principal pattern and the first auxiliary pattern. Thus, the size of the auxiliary pattern can be adjusted independently from the size of the principal pattern, and the transfer of auxiliary patterns derived from their closeness can be avoided.

In the third photomask of the invention, the effects of the invention can be definitely attained when the first distance is not more than $0.8 \times M \times \lambda/NA$ (wherein $\lambda$ indicates a wavelength of the exposing light and M and NA respectively indicate a reduction ratio and numerical aperture of a reduction projection optical system of a projection aligner).

In the third photomask of the invention, the effects of the invention can be definitely attained when the first auxiliary pattern has a width not more than $0.4 \times M \times \lambda/NA$ (wherein $\lambda$ indicates a wavelength of the exposing light and M and NA respectively indicate a reduction ratio and numerical aperture of a reduction projection optical system of a projection aligner).

In the third photomask of the invention, a second auxiliary pattern for transmitting the exposing light in the same phase to the exposing light passing through the transparent portion is preferably formed between the first principal pattern and the third principal pattern. Thus, even when the first principal pattern and the third principal pattern are close to each other at a distance larger than the exposure wavelength, the effect to improve the contrast of the light intensity distribution can be attained.

In this case, the second auxiliary pattern is preferably singly provided between the first principal pattern and the third principal pattern with a part of the light-shielding portion sandwiched between each of the first principal pattern and the third principal pattern and the second auxiliary pattern. Thus, the size of the auxiliary pattern can be adjusted independently from the size of the principal pattern, and the transfer of auxiliary patterns derived from their closeness can be avoided.

Furthermore, in this case, the second distance is preferably not less than $1.0 \times M \times \lambda/NA$ (wherein $\lambda$ indicates a wavelength of the exposing light and M and NA respectively indicate a reduction ratio and numerical aperture of a reduction projection optical system of a projection aligner). Thus, pattern formation characteristics can be definitely improved.

Also in this case, the second auxiliary pattern may transmit the exposing light in a phase difference not less than $(-30+360 \times n)$ degrees and not more than $(30+360 \times n)$ degrees with respect to the transparent portion (wherein n is an integer).

Also in this case, the second auxiliary pattern is preferably made of a semi-light-shielding portion for partially transmitting the exposing light. Thus, even in the case where the first principal pattern and the third principal pattern are close to each other at a distance 1.6 times as large as the exposure wavelength ($1.6 \times \lambda/NA$), the effect to improve the contrast of the light intensity distribution can be attained. At this point, when the semi-light-shielding portion is made of a metal thin film with a thickness of 30 nm or less, microprocessing for the mask processing can be eased. Furthermore, when the second auxiliary pattern has a region that is away from the first principal pattern by a distance not less than $0.3 \times M \times \lambda/NA$ and not more than $0.8 \times M \times \lambda/NA$ (wherein $\lambda$ indicates a wavelength of the exposing light and M and NA respectively indicate a reduction ratio and numerical aperture of a reduction projection optical system of a projection aligner), the pattern formation characteristics such as an exposure margin, a DOF and an MEF can be improved. Moreover, when the semi-light-shielding portion has transmittance of 20% or less against the exposing light, exposure of a resist to the exposing light having passed through the second auxiliary pattern made of a semi-light-shielding portion, namely, the transfer of the second auxiliary pattern, can be prevented. In addition, in the case where the exposing light passing through the semi-light-shielding portion has transmittance of 20% or less, when the second auxiliary pattern has a region that has a width not less than $0.4 \times M \times \lambda/NA$ (wherein $\lambda$ indicates a wavelength of the exposing light and M and NA respectively indicate a reduction ratio and numerical aperture of a reduction projection optical system of a projection aligner), the pattern formation characteristics such as the exposure margin, the DOF and the MEF can be maximally improved.

In this case, the second auxiliary pattern is preferably made of another transparent portion. Thus, in the case where the first principal pattern and the third principal pattern are close to each other at a distance in a range from 1.0 time as large as the exposure wavelength ($\lambda/NA$) to 1.6 times as large as the exposure wavelength ($1.6 \times \lambda/NA$), a good effect to improve the contrast of the light intensity distribution can be attained.

In the third photomask of the invention, the phase shifter portion may transmit the exposing light in a phase difference not less than $(150+360 \times n)$ degrees and not more than $(210+360 \times n)$ degrees with respect to the transparent portion (wherein n is an integer). In this case, the phase shifter portion may be formed by trenching the transparent substrate.

The fourth photomask of this invention includes at least two or more principal patterns made of a plurality of isolated transparent portions and formed in a light-shielding portion disposed on a transparent substrate having a transparent property against exposing light, and the light-shielding portion surrounds the principal patterns, a semi-light-shielding portion for partially transmitting the exposing light in the same phase to the exposing light passing through the transparent portion is provided so as to surround an outline of the light-shielding portion, and at least one auxiliary pattern having a transparent property against the exposing light is provided between the principal patterns so as to be surrounded with the light-shielding portion.

According to the fourth photomask, it is possible to realize a photomask including an auxiliary pattern capable of improving contrast of a light intensity distribution obtained on an imaging face of exposing light having passed through a principal pattern while preventing transfer of the auxiliary pattern itself.

In the fourth photomask of the invention, when a portion of the light-shielding portion sandwiched between each of the principal patterns and the semi-light-shielding portion has a region that has a width not less than $0.3 \times M \times \lambda/NA$ and not more than $0.8 \times M \times \lambda/NA$ (wherein $\lambda$ indicates a wavelength of the exposing light and M and NA respectively indicate a reduction ratio and numerical aperture of a reduction projection optical system of a projection aligner), pattern formation characteristics such as an exposure margin, a DOF and an MEF can be improved.

In the fourth photomask of the invention, the auxiliary pattern is preferably made of a phase shifter portion for transmitting the exposing light in an opposite phase to the exposing light passing through the transparent portion. Thus, even in an arbitrary layout including principal patterns close to each other at a distance smaller than the exposure wavelength, in which contrast cannot be improved by using an auxiliary pattern in the conventional technique, the contrast of a light intensity distribution obtained on an imaging face of the exposing light having passed through the principal pattern can be improved. In this case, when the auxiliary pattern is provided for a distance between the principal patterns not more than $0.8 \times M \times \lambda/NA$ (wherein $\lambda$ indicates a wavelength of the exposing light and M and NA respectively indicate a reduction ratio and numerical aperture of a reduction projection optical system of a projection aligner), the aforementioned effects can be definitely attained. Also in this case, when the auxiliary pattern has a width not more than $0.4 \times M \times \lambda/NA$ (wherein $\lambda$ indicates a wavelength of the exposing light and M and NA respectively indicate a reduction ratio and numerical aperture of a reduction projection optical system of a projection aligner), the aforementioned effects can be definitely attained. Also in this case, the phase shifter portion may transmit the exposing light in a phase difference not less than $(150+360 \times n)$ degrees and not more than $(210+360 \times n)$ degrees with respect to the transparent portion (wherein n is an integer). In this case, the phase shifter portion may be formed by trenching the transparent substrate.

In the fourth photomask of the invention, the auxiliary pattern is preferably made of another transparent portion. Thus, even in an arbitrary layout including principal patterns close to each other at a distance in a range from 1.0 time as large as the exposure wavelength ($\lambda/NA$) to 1.6 times as large as the exposure wavelength ($1.6 \times \lambda/NA$), the contrast of a light intensity distribution obtained on an imaging face of the exposing light having passed through the principal pattern can be improved. In this case, when the auxiliary pattern is provided for a distance between the principal patterns not less than $1.0 \times M \times \lambda/NA$ (wherein $\lambda$ indicates a wavelength of the exposing light and M and NA respectively indicate a reduction ratio and numerical aperture of a reduction projection optical system of a projection aligner), the pattern formation characteristics can be definitely improved.

In the fourth photomask of the invention, the semi-light-shielding portion may transmit the exposing light in a phase difference not less than $(-30+360 \times n)$ degrees and not more than $(30+360 \times n)$ degrees with respect to the transparent portion, wherein n is an integer.

In the fourth photomask of the invention, the semi-light-shielding portion is preferably made of a metal thin film with a thickness of 30 nm or less. Thus, microprocessing for the mask processing can be eased.

The fifth photomask of this invention includes a principal pattern made of a plurality of isolated reflection portions for reflecting exposing light and formed in a non-reflection portion disposed on a substrate, and the principal pattern includes a first principal pattern and a second principal pattern adjacent to each other at a given distance, and a first auxiliary pattern made of a phase shifter portion for reflecting the exposing light in an opposite phase to the exposing light reflected by the reflection portion is formed between the first principal pattern and the second principal pattern.

According to the fifth photomask, even in an arbitrary layout including principal patterns close to each other at a distance smaller than an exposure wavelength, contrast of a light intensity distribution obtained on an imaging face of exposing light having been reflected by the principal pattern can be improved.

In the fifth photomask of the invention, a single phase shifter portion is preferably provided, as the first auxiliary pattern, between the first principal pattern and the second principal pattern with a part of the non-reflection portion sandwiched between each of the first principal pattern and the second principal pattern and the auxiliary pattern. Thus, the size of the auxiliary pattern can be adjusted independently from the size of the principal pattern, and transfer of auxiliary patterns derived from their closeness can be avoided.

In the fifth photomask of the invention, a second auxiliary pattern made of a semi-reflection portion for partially reflecting the exposing light in the same phase to the exposing light reflected by the reflection portion is preferably formed on a side, opposite to the first auxiliary pattern, of at least one of the first principal pattern and the second principal pattern. Thus, even in the case where the first principal pattern or the second principal pattern is close to another principal pattern at a distance larger than the exposure wavelength (including a case where the first principal pattern or the second principal pattern is not close to another principal pattern), the effect to improve the contrast of the light intensity distribution can be attained.

The sixth photomask of this invention includes a principal pattern made of a plurality of isolated reflection portions for reflecting exposing light and formed in a non-reflection portion disposed on a substrate, and the principal pattern includes a first principal pattern, a second principal pattern adjacent to the first principal pattern at a first distance and a third principal pattern adjacent to the first principal pattern at a second distance larger than the first distance, an auxiliary pattern made of a semi-reflection portion for partially reflecting the exposing light in the same phase to the exposing light reflected by the reflection portion is formed between the first principal pattern and the third principal pattern, and an auxiliary pattern made of the semi-reflection portion is not formed between the first principal pattern and the second principal pattern.

According to the sixth photomask of the invention, even in an arbitrary layout including principal patterns close to each other at a distance larger than an exposure wavelength, contrast of a light intensity distribution obtained on an imaging face of exposing light having been reflected by the principal pattern can be improved.

The seventh photomask of the invention includes a principal pattern made of a plurality of isolated reflection portions for reflecting exposing light and formed in a non-reflection portion disposed on a substrate, and the principal pattern includes a first principal pattern, a second principal pattern adjacent to the first principal pattern at a first distance and a third principal pattern adjacent to the first principal pattern at a second distance larger than the first distance, a first auxiliary pattern made of a phase shifter portion for reflecting the exposing light in an opposite phase to the exposing light reflected by the reflection portion is formed between the first principal pattern and the second principal pattern, and an auxiliary pattern made of the phase shifter portion is not formed between the first principal pattern and the third principal pattern.

According to the seventh photomask of the invention, even in an arbitrary layout including a first principal pattern and a second principal pattern close to each other at a distance smaller than an exposure wavelength, contrast of a light intensity distribution obtained on an imaging face of exposing light having been reflected by the principal patterns can be improved.

In the seventh photomask of the invention, a second auxiliary pattern for reflecting the exposing light in the same phase to the exposing light reflected by the reflection portion is preferably formed between the first principal pattern and the third principal pattern. Thus, even in the case where the first principal pattern and the third principal pattern are close to each other at a distance larger than the exposure wavelength, the effect to improve the contrast of the light intensity distribution can be attained.

In this case, the second auxiliary pattern is preferably made of a semi-reflection portion for partially reflecting the exposing light. Thus, even in the case where the first principal pattern and the third principal pattern are close to each other at a distance not less than 1.6 times as large as the exposure wavelength (1.6×λ/NA), the effect to improve the contrast of the light intensity distribution can be attained.

The eighth photomask of this invention includes at least two or more principal patterns made of a plurality of isolated reflection portions for reflecting exposing light and formed in a non-reflection portion disposed on a substrate, and the non-reflection portion surrounds the principal patterns, a semi-reflection portion for partially reflecting the exposing light in the same phase to the exposing light reflected by the reflection portion is provided so as to surround an outline of the non-reflection portion, and at least one auxiliary pattern having a reflecting property against the exposing light is provided between the principal patterns so as to be surrounded with the non-reflection portion.

According to the eighth photomask of the invention, it is possible to realize a photomask including an auxiliary pattern capable of improving contrast of a light intensity distribution obtained on an imaging face of exposing light having been reflected by a principal pattern while preventing transfer of the auxiliary pattern.

In the eighth photomask of the invention, the auxiliary pattern is preferably made of a phase shifter portion for reflecting the exposing light in an opposite phase to the exposing light reflected by the reflection portion. Thus, even in an arbitrary layout including principal patterns close to each other at a distance smaller than the exposure wavelength, the contrast of the light intensity distribution obtained on an imaging face of exposing light having been reflected by the principal pattern can be improved.

In the eighth photomask of the invention, the auxiliary pattern is preferably made of another reflection portion. Thus, even in an arbitrary layout including principal patterns close to each other at a distance in a range from 1.0 time as large as the exposure wavelength (λ/NA) to 1.6 times as large as the exposure wavelength (1.6×λ/NA), the contrast of the light intensity distribution obtained on an imaging face of the exposing light having been reflected by the principal pattern can be improved.

The pattern formation method of this invention using any of the first through eighth photomasks of the invention, includes the steps of (a) forming a resist film on a substrate; (b) irradiating the resist film with the exposing light through the photomask; and (c) forming a resist pattern by developing the resist film having been irradiated with the exposing light.

According to the pattern formation method of the invention, the same effects as those attained by the first through eighth photomasks of the invention can be attained.

In the pattern formation method of the invention, oblique incident illumination is preferably employed in the step (b). Thus, a light intensity distribution with higher contrast can be formed by exposing light having passed through any of the photomasks of this invention, and therefore, a finer pattern can be formed.

The first mask data creation method of this invention for setting, in a photomask for use in exposure, an exposed region for transmitting or reflecting exposing light and an unexposed region for neither transmitting nor reflecting the exposing light, includes the steps of (a) setting, as principal patterns of the exposed region, a plurality of regions corresponding to desired exposed portions of a resist formed by irradiating the resist with the exposing light through the photomask; (b) setting a background of the photomask as the unexposed region; and (c) setting, as an auxiliary pattern having an opposite phase, a region in an opposite phase relationship with the principal patterns in a portion where a distance between the plurality of regions set as the principal patterns is not more than a first distance.

According to the first mask data creation method, an auxiliary pattern made of a phase shifter portion for transmitting or reflecting light in an opposite phase to light passing through a principal pattern or reflected by a principal pattern can be provided between principal patterns. Therefore, even in an arbitrary layout including principal patterns close to each other at a distance smaller then an exposure wavelength, contrast of a light intensity distribution obtained on an imaging face of light having passed through the principal pattern or light having been reflected by the principal pattern can be improved. In other words, when any of the photomasks of this invention including a mask pattern created by the first mask data creation method of this invention is used for exposing a wafer on which a resist has been applied, contrast of light having passed through a principal pattern or having been reflected by a principal pattern is improved. Accordingly, a fine space pattern can be formed in a portion of the resist corresponding to the principal pattern.

The first mask creation method of the invention preferably further includes a step of setting, as an auxiliary pattern having the same phase, a region in the same phase relationship with the principal patterns in a portion where the distance between the plurality of regions set as the principal patterns is not less than a second distance. Thus, even in an arbitrary layout including principal patterns close to each other at a distance larger then an exposure wavelength, the contrast of the light intensity distribution obtained on an imaging face of the light having passed through the principal pattern or light having been reflected by the principal pattern can be improved. In this case, the auxiliary pattern having the same phase preferably has transmittance or reflectance of 3% or more and 20% or less against the exposing light with respect to the principal patterns. Thus, the effect to sufficiently improve a margin in pattern formation can be attained while preventing transfer of the auxiliary pattern in the same phase.

The second mask data creation method of this invention for setting, in a photomask for use in exposure, an exposed region for transmitting or reflecting exposing light and an unexposed region for neither transmitting nor reflecting the exposing light, includes the steps of (a) setting, as principal patterns of the exposed region, a plurality of regions corresponding to desired exposed portions of a resist formed by irradiating the resist with the exposing light through the photomask; (b) setting a background of the photomask as a semi-light-light-shielding pattern or a semi-reflection pattern that has transmittance or reflectance of 3% or more and 20% or less against the exposing light with respect to the principal patterns and corresponds to a part of the exposed region; (c) setting a light-shielding pattern or a non-reflection pattern as the unexposed region for surrounding the principal patterns; and (d) setting, as an auxiliary pattern having an opposite phase, a region in an opposite phase relationship with the principal patterns in a portion where a distance between the plurality of regions set as the principal patterns is not more than a first distance.

According to the second mask data creation method, an auxiliary pattern made of a phase shifter portion for transmitting or reflecting light in an opposite phase to light passing through a principal pattern or reflected by a principal pattern can be provided between principal patterns. Therefore, even in an arbitrary layout including principal patterns close to each other at a distance smaller then an exposure wavelength, contrast of a light intensity distribution obtained on an imaging face of light having passed through the principal pattern or light having been reflected by the principal pattern can be improved. In other words, when any of the photomasks of this invention including a mask pattern created by the second mask data creation method of this invention is used for exposing a wafer on which a resist has been applied, contrast of light having passed through a principal pattern or having been reflected by a principal pattern is improved. Accordingly, a fine space pattern can be formed in a portion of the resist corresponding to the principal pattern.

The second mask data creation method of the invention preferably further includes a step of setting, as an auxiliary pattern having the same phase, a region in the same phase relationship with the principal patterns in a portion where the distance between the plurality of regions set as the principal patterns is not less than a second distance. Thus, even in an arbitrary layout including principal patterns close to each other at a distance larger then an exposure wavelength, the contrast of the light intensity distribution obtained on an imaging face of the light having passed through the principal pattern or light having been reflected by the principal pattern can be improved.

The first or second mask data creation method preferably further includes a step of creating a mask pattern for realizing a desired resist pattern by deforming shapes of the principal patterns after setting the auxiliary pattern. Thus, OPC (optical proximity correction) processing can be easily performed.

As described so far, according to the present invention, it is possible to realize a photomask including an auxiliary pattern capable of increasing contrast of a light intensity distribution obtained on an imaging face of exposing light having passed through a principal pattern while preventing transfer of the auxiliary pattern itself. In particular, in an arbitrary layout including principal patterns close to each other at a distance smaller than an exposure wavelength, in which the contrast cannot be improved by using an auxiliary pattern in the conventional technique, the contrast of the light intensity distribution obtained on an imaging face of the exposing light having passed through the principal pattern can be improved.

Specifically, the present invention relates to a photomask, a pattern formation method using the photomask and a mask data creation method for the photomask, and is very useful in application to fine pattern formation employed in fabrication of a semiconductor integrated circuit device and the like.

BRIEF DESCRIPTION OF THE DRAWINGS

FIGS. 17A, 17B, 17C and 17D are cross-sectional views for showing procedures in a pattern formation method according to Embodiment 3 of the invention;

DETAILED DESCRIPTION OF THE INVENTION

Prerequisites

Figure 1A:
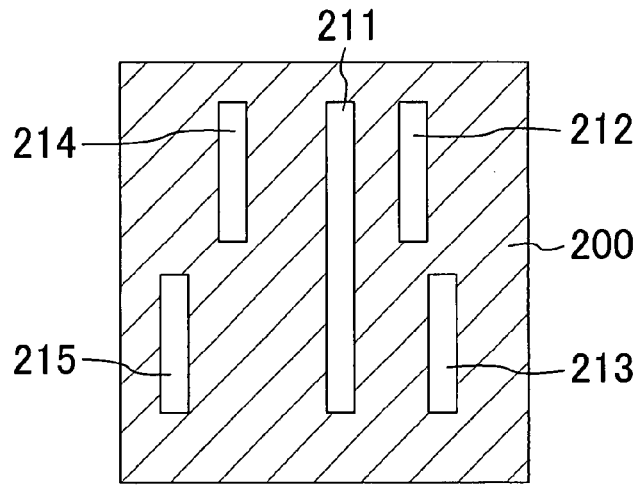
FIG. 1A is a diagram for showing the shape of a desired resist pattern to be formed by using a photomask according to Embodiment 1 of the invention and FIG. 1B is a plan view of the photomask of Embodiment 1.

Prerequisites for describing preferred embodiments of the invention will be first described.

Since a photomask is generally used in a reduction projection type aligner, it is necessary to consider a reduction ratio in arguing a pattern dimension on the mask. However, in order to avoid confusion, in the description of each embodiment below, when a pattern dimension on a mask is mentioned in correspondence to a desired pattern to be formed (such as a resist pattern), a value obtained by converting the pattern dimension by using a reduction ratio is used unless otherwise mentioned. Specifically, also in the case where a resist pattern with a width of 100 nm is formed by using a mask pattern with a width of M×100 nm in a 1/M reduction projection system, the width of the mask pattern and the width of the resist pattern are both described as 100 nm.

Also, in each embodiment of the invention, M and NA respectively indicate a reduction ratio and numerical aperture of a reduction projection optical system of an aligner and $\lambda$ indicates the wavelength of exposing light unless otherwise mentioned.

Moreover, pattern formation is described on the assumption that the positive resist process for forming a resist pattern correspondingly to an unexposed region of a resist is employed. In the case where the negative resist process is employed instead of the positive resist process, since an unexposed region of a resist is removed in the negative resist process, a resist pattern of the positive resist process is replaced with a space pattern.

Moreover, it is assumed that a photomask described in each embodiment is a transmission mask. In the case where the photomask is applied to a reflection mask, since a transparent portion and a light-shielding portion of a transmission mask respectively correspond to a reflection portion and a non-reflection portion, the transmission phenomenon of a transmission mask is replaced with the reflection phenomenon. Specifically, a transparent substrate of a transmission mask is replaced with a substrate having, on its surface, a reflection film for reflecting exposing light, a transparent portion or a transparent region is replaced with a reflection portion or a reflection region and a light-shielding portion is replaced with a non-reflection portion. Furthermore, a portion partially transmitting light in a transmission mask is replaced with a portion partially reflecting light, and transmittance is replaced with reflectance. Also, a semi-light-shielding portion is replaced with a semi-reflection portion. It is noted that a phase shifter of a reflection mask is a portion for reflecting light so as to cause a phase different from light reflected by a reflection portion.

Furthermore, in the case where transmittance of a mask pattern is mentioned in each embodiment, absolute transmittance of each portion of a mask pattern is not used but relative transmittance obtained on the basis of the transmittance (100%) of a transparent substrate against exposing light is used. Accordingly, in the case where the photomask is applied not to a transmission mask but to a reflection mask and the transmittance is replaced with the reflectance, absolute reflectance of each portion of a mask pattern is not used but relative reflectance obtained on the basis of the reflectance (100%), against exposing light, of a substrate having, on its surface, a reflection film is used.

Embodiment 1

A photomask according to Embodiment 1 of the invention will now be described with reference to the accompanying drawings.

Figure 1B:
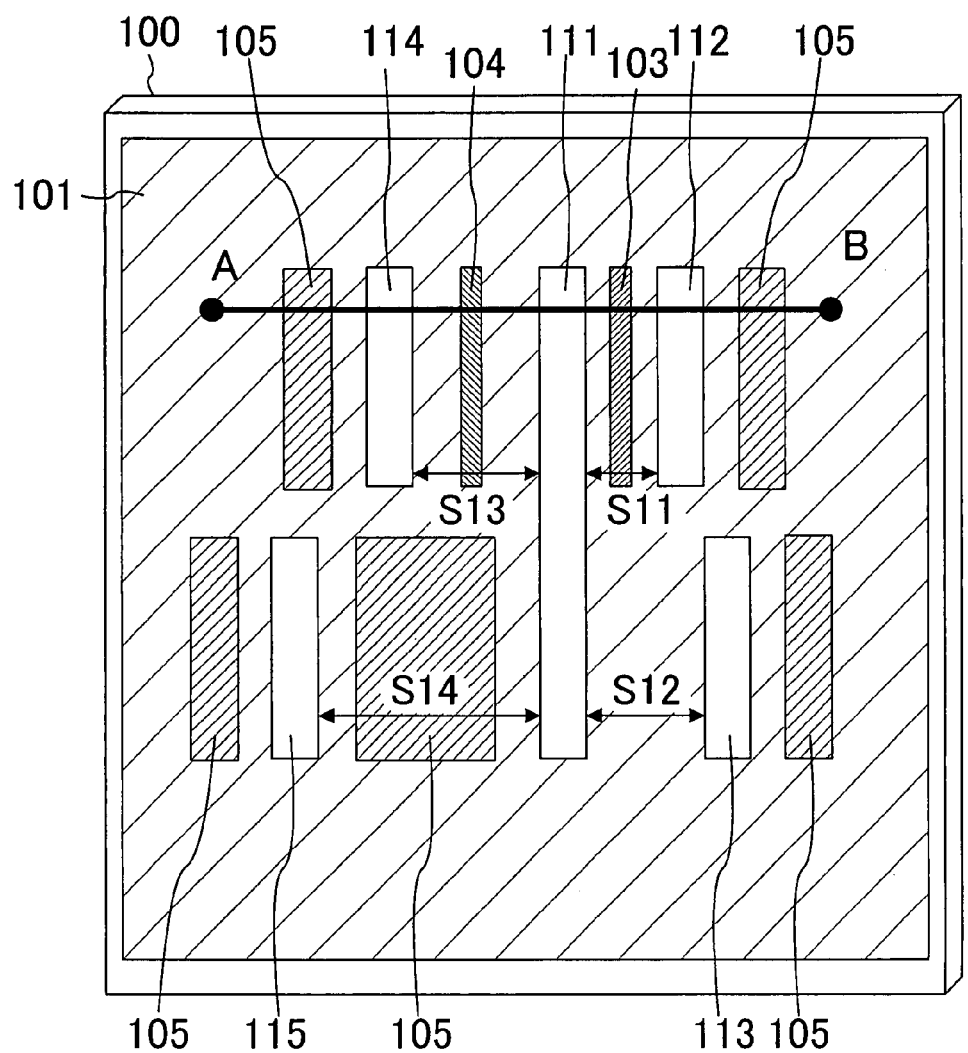

FIG. 1A is a diagram for showing the shape of a desired resist pattern and FIG. 1B is a plan view of the photomask of Embodiment 1. It is noted that a transparent substrate is perspectively shown in FIG. 1B.

As shown in FIG. 1A, the desired pattern is a resist pattern 200 including a resist removal patterns (space patterns) 211 through 215.

As shown in FIG. 1B, a light-shielding portion 101 is formed over a sufficiently large area on a transparent substrate 100. Furthermore, first through fifth principal patterns 111 through 115 made of a plurality of isolated transparent portions are provided in positions on the light-shielding portion 101 corresponding to the desired space patterns 211 through 215 to be formed on a wafer through pattern exposure. Moreover, as described later, auxiliary patterns that have a function to improve contrast of a light intensity distribution obtained on an imaging face of exposing light having passed through the principal patterns 111 through 115 to be transferred but do not themselves expose corresponding portions of a resist are provided in given positions on the light-shielding portion 101.

As a first characteristic of this embodiment, in the case where the first principal pattern 111 is close to the second principal pattern 112 at a first distance S11 and is close to the third principal pattern 113 at a second distance S12 larger than the first distance S11 as shown in FIG. 1B, an auxiliary pattern 103 made of a phase shifter portion is provided between the first principal pattern 111 and the second principal pattern 112. At this point, between light passing through the phase shifter portion used as the auxiliary pattern 103 and light passing through the transparent portion used as the principal patterns 111 through 115, there is an opposite phase relationship (specifically, a relationship with a phase difference not less than (150+360×n) degrees and not more than (210+360×n) degrees (wherein n is an integer)). When the auxiliary pattern 103 is thus provided, even if the first principal pattern 111 and the second principal pattern 112 are close to each other at a distance smaller than an exposure wavelength, the contrast of the light intensity distribution can be improved. Also, since the auxiliary pattern 103 is singly provided merely at the center between the first principal pattern 111 and the second principal pattern 112, transfer of auxiliary patterns derived from their closeness can be avoided.

Next, the improvement of the contrast of the light intensity distribution obtained on an imaging face of the exposing light having passed through a principal pattern to be transferred attained by providing "an auxiliary pattern made of a phase shifter portion" as described above will be described on the basis of simulation results. As exposure conditions for optical calculation performed in the simulation, the exposure wavelength $\lambda$ is set to 193 nm and the numerical aperture NA is set to 0.85 unless otherwise mentioned. Also, as illumination conditions, ⅔ annular illumination having the outer diameter with a degree of interference of 0.8 and the inner diameter with a degree of interference of 0.53 is used. Furthermore, a phase shifter portion and a transparent portion both have the same transmittance of 100% unless otherwise mentioned.

Figure 2A:
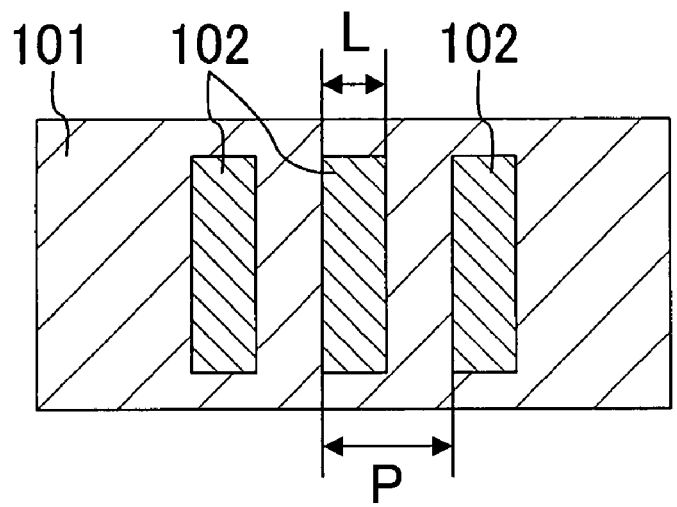
FIGS. 2A and 2B are diagrams of mask patterns used in simulation for an effect of an auxiliary pattern made of a phase shifter portion used in the photomask of Embodiment 1 of the invention.
Figure 2B:
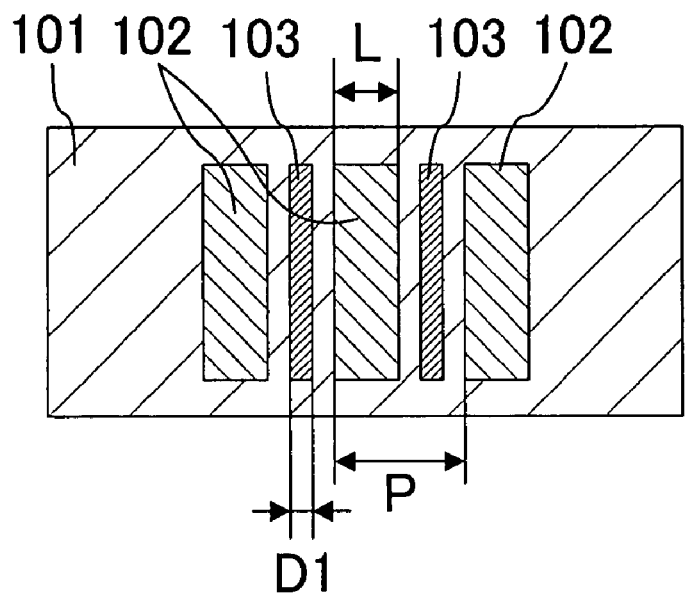

FIGS. 2A, 2B and 3A through 3C are diagrams for showing the results of the simulation for the effect of an auxiliary pattern made of a phase shifter portion. FIGS. 2A and 2B show mask patterns used in the simulation. In the mask pattern shown in FIG. 2A, a plurality of principal patterns 102 each made of a line-shaped transparent portion with a width L are arranged at a pitch P in a light-shielding portion 101. Herein, the mask pattern structure as shown in FIG. 2A in which a plurality of principal patterns each made of a line-shaped transparent portion are simply arranged is designated as a structure A. In the mask pattern shown in FIG. 2B, a plurality of principal patterns 102 each made of a line-shaped transparent portion with a width L are arranged at a pitch P in a light-shielding portion 101 and an auxiliary pattern 103 made of a phase shifter portion with a width D1 is provided at the center between adjacent principal patterns 102. Herein, the mask pattern structure as shown in FIG. 2B in which an auxiliary pattern made of a phase shifter portion is provided between principal patterns is designated as a structure B.

Figure 3A:
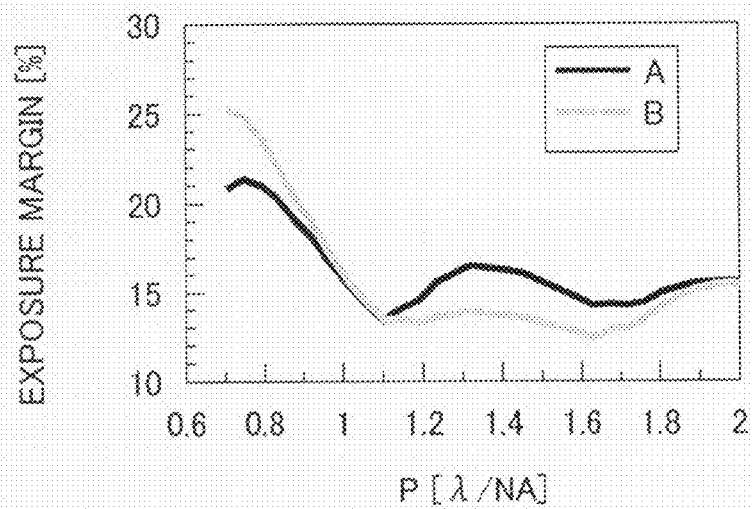
FIGS. 3A, 3B and 3C are diagrams for showing results of the simulation for the effect of the auxiliary pattern made of the phase shifter portion used in the photomask of Embodiment 1 of the invention.
Figure 3B:
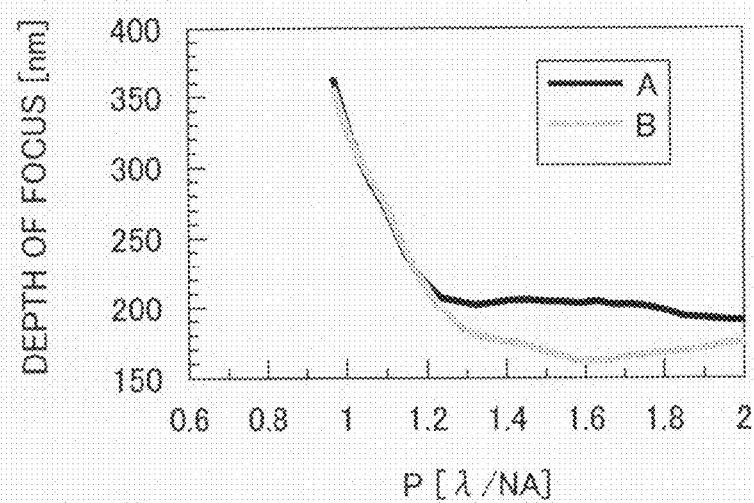
Figure 3C:
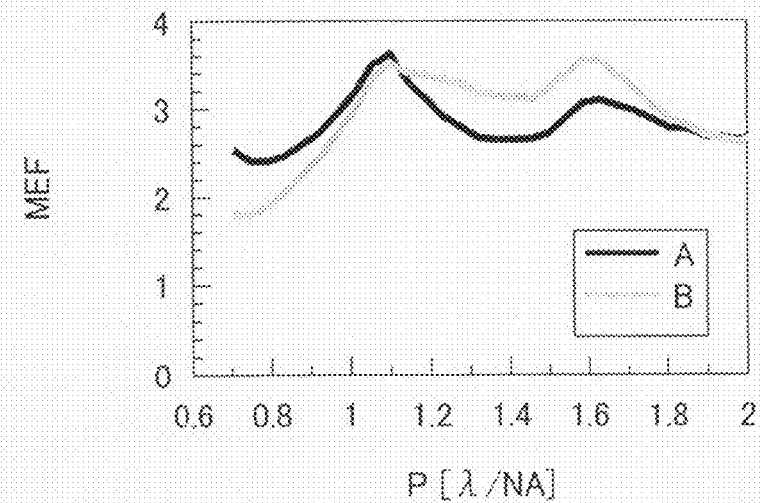

FIGS. 3A through 3C show results of light intensity simulation performed by using a photomask having the structure A and a photomask having the structure B with the pitch P of the principal patterns 102 variously changed. In this case, at each of the various pitches P, the width L of the principal pattern 102 is adjusted so that the width of a resultant space pattern can be 90 nm. The width L of the principal pattern 102 is different depending upon the pitch P and is approximately 60 through 90 nm. Furthermore, the width D1 of the auxiliary pattern 103 made of a phase shifter portion is set to 40 nm.

FIG. 3A shows comparison between an exposure margin obtained by using the photomask including the principal patterns 102 alone (namely, having the structure A) and an exposure margin obtained by using the photomask additionally including the auxiliary pattern 103 made of a phase shifter portion (namely, having the structure B). In FIG. 3A, a curve A corresponds to the result obtained by the structure A and a curve B corresponds to the result obtained by the structure B. Also, each pitch P is indicated as a value normalized by $\lambda$/NA. In the following description, an exposure margin means "a ratio, to exposure for attaining, as a target value (that is, 90 nm in this case), a transfer dimension of a space pattern to be formed (CD value), of exposure for attaining a CD value within ±10% of the target value" unless otherwise mentioned, and as the exposure margin is larger, the pattern formation characteristic is better.

FIG. 3B shows comparison between a depth of focus (DOF) obtained by using the photomask having the structure A and a DOF obtained by using the photomask having the structure B. In FIG. 3B, a curve A corresponds to the result obtained by the structure A and a curve B corresponds to the result obtained by the structure B. Also, each pitch P is indicated as a value normalized by $\lambda$/NA. In the following description, a DOF means "an allowable range of a focus position for attaining a CD value of a space pattern to be formed within ±10% of a target value (that is, 90 nm in this case)" unless otherwise mentioned, and as the DOF is larger, the pattern formation characteristic is better.

FIG. 3C shows comparison between a mask error factor (MEF) obtained by using the photomask having the structure A and an MEF obtained by using the photomask having the structure B. In FIG. 3C, a curve A corresponds to the result obtained by the structure A and a curve B corresponds to the result obtained by the structure B. Also, each pitch P is indicated as a value normalized by $\lambda$/NA. In the following description, an MEF means "a quantity indicating a factor by which an error occurring in a mask dimension affects a resist dimension" unless otherwise mentioned, and as the MEF is smaller, the pattern formation characteristic is better.

At this point, in the case where sufficient contrast is realized in the light intensity distribution, the exposure margin is large and the MEF is small. In other words, conditions for simultaneously attaining a large exposure margin, a large DOF and a small MEF correspond to the most advantageous conditions for the pattern formation.

In the case where the pitch P of the principal patterns 102 is not more than 1.2×$\lambda$/NA, the exposure margin can be improved by providing the auxiliary pattern 103 made of a phase shifter portion as shown in FIG. 3A. The MEF is similarly improved as shown in FIG. 3C. Furthermore, in the case where the pitch P of the principal patterns 102 is not more than 1.2×$\lambda$/NA, the DOF is unchanged no matter whether the auxiliary pattern 103 made of a phase shifter portion is provided or not as shown in FIG. 3B. In other words, in the case where the pitch P of the principal patterns 102 is not more than $1.2 \times \lambda/NA$, a mask pattern with high pattern formation characteristics can be realized by providing the auxiliary pattern 103 made of a phase shifter portion. The simulation results shown in FIGS. 3A through 3C are obtained through the simulation using the oblique incident illumination but the aforementioned effect is attained not merely when the oblique incident illumination is used. Specifically, the effect to improve the contrast attained by using an auxiliary pattern made of a phase shifter portion is increased by using the oblique incident illumination and is similarly attained even by using general illumination.

The aforementioned results will now be more theoretically described. When principal patterns made of a transparent portion of a photomask are close to each other, in an imaging position corresponding to substantially the center between the principal patterns, lights respectively having passed through the principal patterns on both sides interfere with each other owing to the diffraction. At this point, since the lights respectively passing through the adjacent principal patterns are in the same phase, the lights having passed through the principal patterns interfere with each other so as to mutually increase in the imaging position corresponding to a portion in the vicinity of the center between the principal patterns. As a result, although the light intensity is preferably lower primarily, the light intensity is increased to the contrary in the imaging position corresponding to the portion in the vicinity the center between the principal patterns. Accordingly, in order to suppress this phenomenon, light in an opposite phase is made to further interfere with the exposing lights respectively having passed through the principal patterns in the imaging position corresponding to the portion in the vicinity of the center between the principal patterns. For this purpose, an auxiliary pattern made of a phase shifter portion is provided in the vicinity of the center between the principal patterns. At this point, FIG. 3A shows the effect attained by providing an auxiliary pattern made of a phase shifter portion in the vicinity of the center between the principal patterns. It goes without saying that an auxiliary pattern made of a phase shifter portion does not expose a corresponding portion of a resist because it is provided for cancelling the light intensity in the imaging position corresponding to the portion in the vicinity of the center between the principal patterns.

The present inventor has found by experience that the lights respectively having passed through adjacent principal patterns interfere with each other when a distance between the principal patterns, namely, the width of the light-shielding portion disposed between the principal patterns, is not more than $0.8 \times \lambda/NA$ (see, for example, Patent Document 3). In other words, the aforementioned auxiliary pattern made of a phase shifter portion is preferably provided in a region where the lights respectively having passed through principal patterns close to each other interfere with each other so as to mutually increase, namely, when the distance between the principal patterns is not more than $0.8 \times \lambda/NA$.

The size of the auxiliary pattern is most preferably adjusted so as to transmit light in an opposite phase in a quantity for appropriately cancel a light component of the lights respectively having passed through the principal patterns close to each other that rounds to the back side of a portion disposed between the principal patterns by the diffraction. Accordingly, the auxiliary pattern is preferably provided in a position away from the principal patterns with the light-shielding portion sandwiched therebetween so that the size of the auxiliary pattern can be adjusted independently of the sizes of the principal patterns. Moreover, the auxiliary pattern is preferably provided at the center between the principal patterns.

Furthermore, according to the aforementioned theory, in the case where an auxiliary pattern having a width D1 is provided between principal patterns away from each other at a distance S1 (wherein $S1<0.8 \times \lambda/NA$), a width D2 of an auxiliary pattern to be provided between principal patterns away from each other at a distance S2 (S2<S1) is preferably larger than the width D1 (namely, D2>D1). This is because diffracted light passing through the principal patterns and rounding to the back side of a portion disposed between the principal patterns when the distance between the principal patterns (principal pattern space) is the distance S2 is larger in the quantity than diffracted light passing through the principal patterns and rounding to the back side of a portion disposed between the principal patterns when the principal pattern space is the distance S1. Accordingly, the width D2 of the auxiliary pattern (made of a phase shifter portion) to be provided between the principal patterns away from each other at the distance S2 is preferably larger than the width D1 of the auxiliary pattern (made of a phase shifter portion) to be provided between the principal patterns away from each other at the distance S1.

The present inventor has found the following by experience: When $S2 \approx 0.4 \times \lambda/NA$, the width D2 of an auxiliary pattern for appropriately cancelling diffracted lights respectively passing through principal patterns close to each other and rounding to the back side of a portion disposed between the principal patterns is approximately $0.4 \times \lambda/NA$, namely, the principal pattern space (the distance between the principal patterns) substantially accords with the width of the auxiliary pattern (see, for example, Patent Document 3). On the other hand, the maximum width of an auxiliary pattern made of a phase shifter portion having the same transmittance as the transparent portion for effectively functioning is $0.4 \times \lambda/NA$, and hence, the width of the auxiliary pattern made of a phase shifter portion is preferably not more than $0.4 \times \lambda/NA$ (see, for example, Patent Document 3).

Figure 4A:
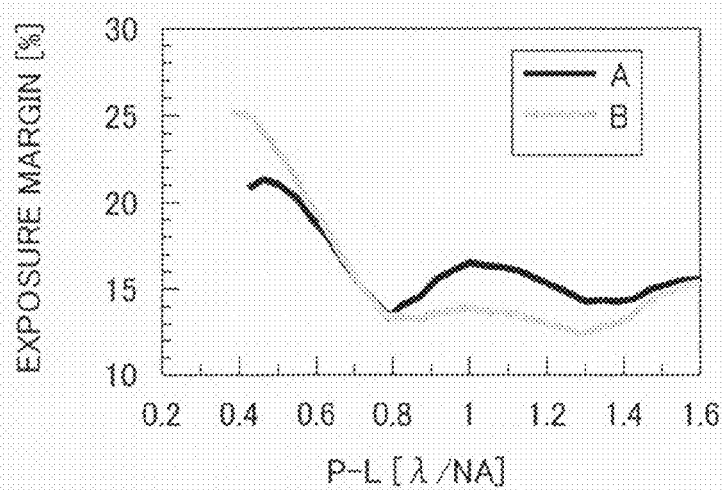
FIGS. 4A, 4B and 4C are diagrams obtained by converting the abscissa of the graphs of the simulation results shown in FIGS. 3A through 3C into a principal pattern space.
Figure 4B:
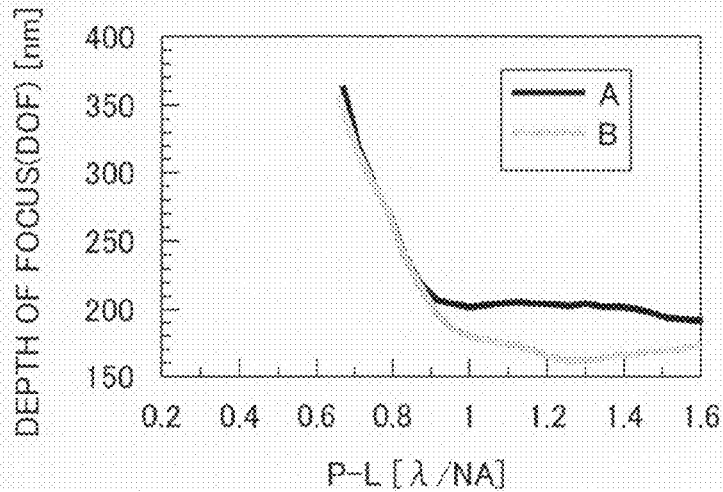
Figure 4C:
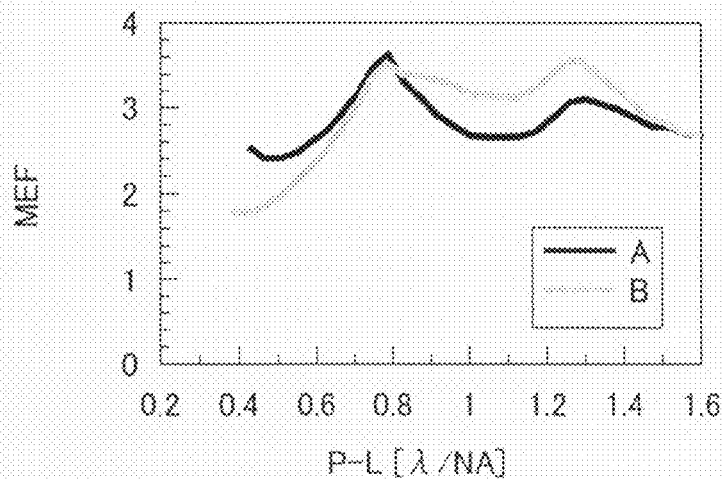

FIGS. 4A through 4C are graphs obtained by converting the abscissa of the graphs of the simulation results shown in FIGS. 3A through 3C into a principal pattern space (P-L). As shown in FIGS. 4A through 4C, in the case where the principal pattern space (P-L) is not more than $0.8 \times \lambda/NA$, the exposure margin and the MEF can be improved by providing an auxiliary pattern made of a phase shifter portion between the principal patterns. On the contrary, in the case where the principal pattern space (P-L) is more than $0.8 \times \lambda/NA$, an auxiliary pattern made of a phase shifter portion is preferably not provided between the principal patterns.

Furthermore, in the case where a principal pattern is in a line shape, diffracted light rounding to the back side of the principal pattern is small in the quantity at the end of the line shape of the principal pattern. Therefore, the length of an auxiliary pattern made of a phase shifter portion is preferably smaller than the length of a principal pattern in a line shape. However, the length of an auxiliary pattern may be larger as far as the pattern formation is not harmfully affected.

Next, as shown in FIG. 1B, as a second characteristic of this embodiment, in the case where the first principal pattern 111 is close to the fourth principal pattern 114 at a third distance S13 larger than the first distance S11, an auxiliary pattern 104 made of a transparent portion is provided between the first principal pattern 111 and the fourth principal pattern 114. Furthermore, in the case where the first principal pattern 111 is close to the fifth principal pattern 115 at a fourth distance S14 larger than the first distance S11, an auxiliary pattern 105 made of a semi-light-shielding portion for partially transmitting the exposing light in the same phase to the exposing light passing through the transparent portion is provided between the first principal pattern 111 and the fifth principal pattern 115. At this point, between the light passing through the two auxiliary patterns 104 and 105 and the light passing through the transparent portion, there is the same phase relationship (specifically, a relationship with a phase difference not less than (−30+360×n) degrees and not more than (30+360×n) degrees (wherein n is an integer)). In other words, as the second characteristic, the auxiliary pattern 104 made of a transparent portion and the auxiliary pattern 105 made of a semi-light-shielding portion both transmit light in the same phase with respect to the transparent portion, namely, the principal patterns 111 through 115.

Owing to the first characteristic, that is, "the auxiliary pattern 103 made of a phase shifter portion for transmitting light in an opposite phase with respect to the principal patterns 111 through 115", as well as the second characteristic, that is, "the auxiliary patterns 104 and 105 for transmitting light in the same phase with respect to the principal patterns", even when the principal patterns are close to each other at a distance larger than the exposure wavelength, the effect to improve the contrast of the light intensity distribution can be attained. Furthermore, since each of the auxiliary patterns 104 and 105 is singly provided merely at the center between the corresponding principal patterns, the transfer of the auxiliary patterns derived from their closeness can be avoided.

Next, the improvement of the contrast of the light intensity distribution on the imaging face of the exposing light having passed through the principal pattern to be transferred attained by providing "an auxiliary pattern for transmitting light in the same phase with respect to a transparent portion" as described above will be described on the basis of simulation results.

Figure 5A:
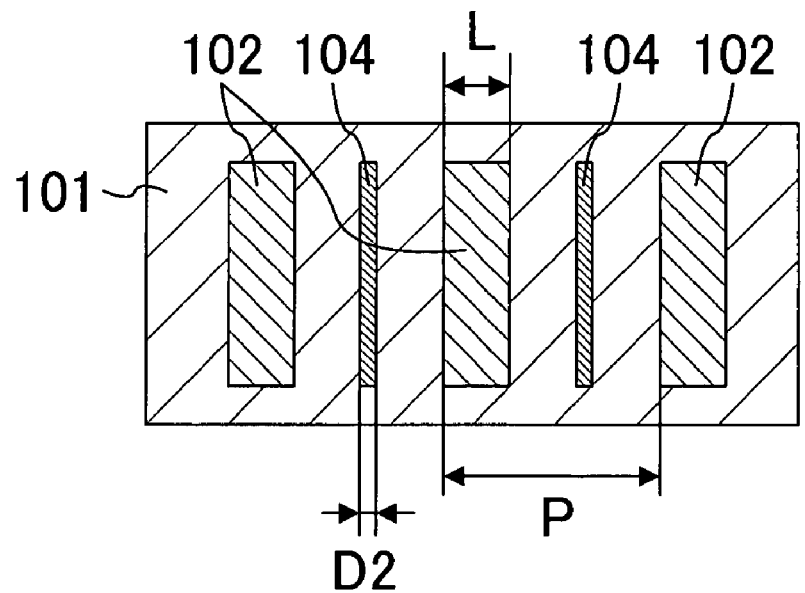
FIGS. 5A and 5B are diagrams for showing mask patterns used in simulation for an effect of an auxiliary pattern for transmitting light in the same phase with respect to a transparent portion in the photomask of Embodiment 1 of the invention.
Figure 5B:
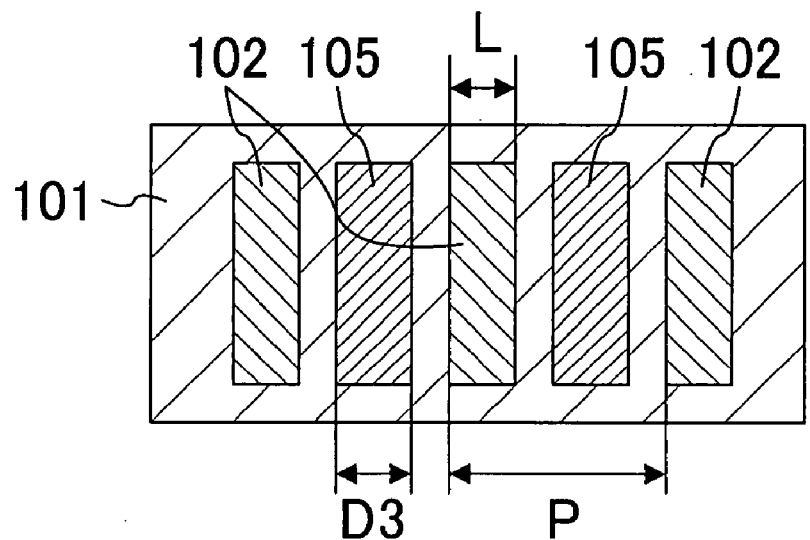

FIGS. 5A, 5B and 6A through 6C are diagrams for showing the results of the simulation for the effect of an auxiliary pattern for transmitting light in the same phase with respect to a transparent portion. FIGS. 5A and 5B show mask patterns used in the simulation.

In the mask pattern shown in FIG. 5A, a plurality of principal patterns 102 each made of a line-shaped transparent portion with a width L are arranged at a pitch P in a light-shielding portion 101, and an auxiliary pattern 104 made of a transparent portion and having a width D2 is provided at the center between adjacent principal patterns 102. Herein, the mask pattern structure as shown in FIG. 5A in which an auxiliary pattern made of a transparent portion is provided between principal patterns is designated as a structure C. The width D2 of the auxiliary pattern 104 is set to 40 nm on the basis of conditions for avoiding the auxiliary pattern 104 made of a transparent portion from exposing a corresponding portion of a resist. Furthermore, the auxiliary pattern 104 is always provided at the center between the principal patterns.

In the mask pattern shown in FIG. 5B, a plurality of principal patterns 102 each made of a line-shaped transparent portion with a width L are arranged at a pitch P in a light-shielding portion 101 and an auxiliary pattern 105 made of a semi-light-shielding portion with a width D3 is provided between adjacent principal patterns 102. Herein, the mask pattern structure as shown in FIG. 5B in which an auxiliary pattern made of a semi-light-shielding portion is provided between principal patterns is designated as a structure D. The width D3 of the auxiliary pattern 105 made of a semi-light-shielding portion is changed in accordance with the pitch P so that the auxiliary pattern 105 can be disposed to be away from each of the adjacent principal patterns 102 by 110 nm (namely, so that the distance between the auxiliary pattern 105 and each of the principal patterns 102 can be 110 nm). In other words, the auxiliary pattern 105 is always disposed at the center between the principal patterns 102 and away from each of the principal patterns 102 by a distance of 110 nm. Furthermore, the transmittance of the semi-light-shielding portion used as the auxiliary pattern 105 is set to 9%. Thus, no matter how the dimension of the auxiliary pattern 105 is enlarged, light sufficient for exposing a corresponding portion of the resist cannot pass through the auxiliary pattern 105.

Figure 6A:
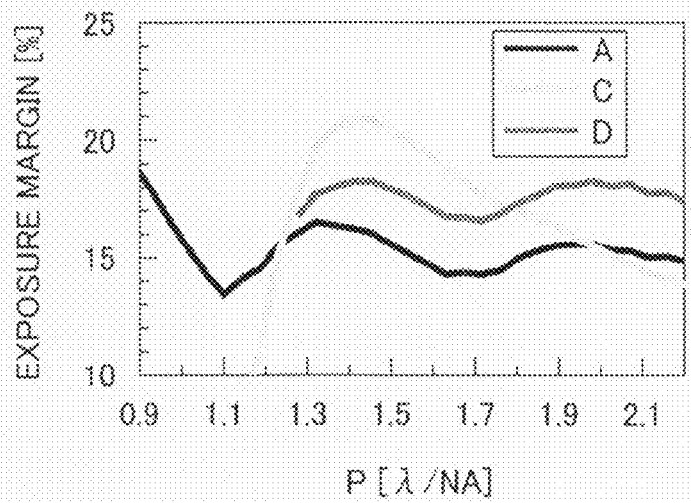
FIGS. 6A, 6B and 6C are diagrams for showing results of the simulation for the effect of the auxiliary pattern for transmitting light in the same phase with respect to the transparent portion in the photomask of Embodiment 1 of the invention.
Figure 6B:
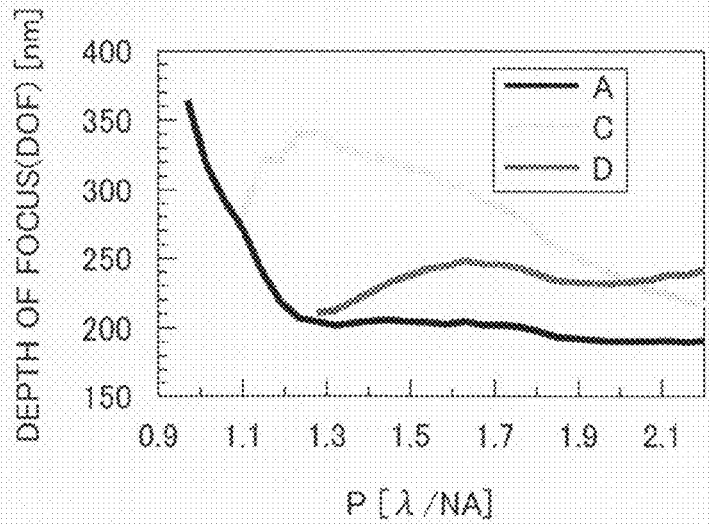
Figure 6C:
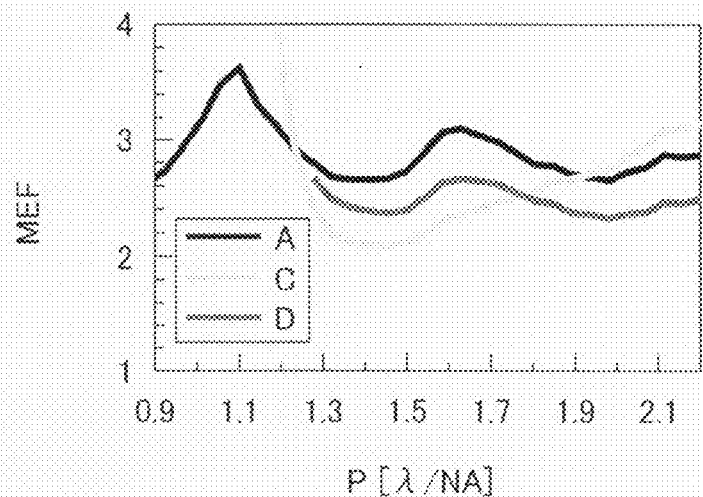

FIGS. 6A through 6C show the results of the light intensity simulation performed by using a photomask having the structure C and a photomask having the structure D with the pitch P of the principal patterns 102 variously changed. In this case, at each of the various pitches P, the width L of the principal pattern 102 is adjusted so that the width of a resultant space pattern can be 90 nm. The width L of the principal pattern 102 is different depending upon the pitch P and is approximately 60 through 90 nm.

FIG. 6A shows comparison between an exposure margin obtained by using the photomask having the structure C and an exposure margin obtained by using the photomask having the structure D. In FIG. 6A, the exposure margin obtained by using the photomask having the structure A shown in FIG. 2A is also shown for reference.

FIG. 6B shows comparison between a DOF obtained by using the photomask having the structure C and a DOF obtained by using the photomask having the structure D. In FIG. 6B, the DOF obtained by using the photomask having the structure A shown in FIG. 2A is also shown for reference.

FIG. 6C shows comparison between an MEF obtained by using the photomask having the structure C and an MEF obtained by using the photomask having the structure D. In FIG. 6C, the MEF obtained by using the photomask having the structure A shown in FIG. 2A is also shown for reference.

In each of FIGS. 6A through 6C, a curve A shows the result obtained by using the photomask having the structure A, a curve C shows the result obtained by using the photomask having the structure C and a curve D shows the result obtained by using the photomask having the structure D. Also, each pitch P is indicated as a value normalized by $\lambda/NA$.

In the case where the pitch P of the principal patterns 102 is more than $1.2 \times \lambda/NA$, the exposure margin can be improved, as compared with the case where the photomask including the principal patterns alone is used, by providing the auxiliary pattern 104 or 105 as shown in FIG. 6A. The MEF and the DOF are similarly improved as shown in FIGS. 6B and 6C. However, in the case where the auxiliary pattern 104 made of a transparent portion is provided, when the pitch P of the principal patterns 102 is more than $2.0 \times \lambda/NA$, both the exposure margin and the MEF are degraded as compared with the case where the photomask including the principal patterns alone is used. On the other hand, in the case where the auxiliary pattern 105 made of a semi-light-shielding portion is provided, even when the pitch P of the principal patterns 102 is more than $2.0 \times \lambda/NA$, both the exposure margin and the MEF are improved as compared with the case where the photomask including the principal patterns alone is used. The DOF is similarly improved in this case.

Accordingly, in the case where the pitch P of the principal patterns is more than $1.2 \times \lambda/NA$ and not more than $2.0 \times \lambda/NA$, the pattern formation characteristics can be improved by providing, at a center between the principal patterns, an auxiliary pattern for transmitting light in the same phase with respect to a transparent portion (namely, an auxiliary pattern made of a transparent portion or a semi-light-shielding portion). Also, in the case where the pitch P of the principal patterns is more than $2.0 \times \lambda/NA$, the pattern formation characteristics can be improved by providing, at a center between the principal patterns, an auxiliary pattern made of a semi-light-shielding portion for partially transmitting light in the same phase with respect to a transparent portion.

The aforementioned results will now be more theoretically described. It is a conventionally known fact that good pattern formation characteristics cannot be attained by a principal pattern made of an isolated transparent portion. Therefore, even if good pattern formation characteristics are attained when principal patterns are close to each other, the pattern formation characteristics are degraded if the same principal patterns are isolatedly provided. It is noted that an optically isolated pattern herein means a pattern away from another pattern by a distance not less than λ/NA. Specifically, when a principal pattern space is not less than λ/NA, the pattern formation characteristics are improved by providing, between the principal patterns, an auxiliary pattern alternate with a principal pattern. In other words, an auxiliary pattern for transmitting light in the same phase with respect to a principal pattern (a transparent portion) is preferably provided between principal patterns away from each other by a distance not less than λ/NA.

However, an auxiliary pattern should transmit light in the quantity not to expose a corresponding portion of a resist, and hence, the present inventor has found by experience that the width of an auxiliary pattern made of a transparent portion should be smaller than 0.4×λ/NA. This is for the following reason: A resist is exposed to exposing light in a region of a light intensity distribution having light intensity exceeding a threshold value of approximately 0.2 on the assumption that the intensity of the exposing light is 1.0, and the light intensity of light passing through a transparent portion with a width of 0.4×λ/NA is 0.2. On the other hand, even when the width of an auxiliary pattern made of a semi-light-shielding portion exceeds 0.4×λ/NA, a resist is not exposed to the exposing light as far as the transmittance of the semi-light-shielding portion is not more than 20%. In other words, when an auxiliary pattern made of a semi-light-shielding portion with transmittance of 20% or less is provided, the width may exceed 0.4×λ/NA. Accordingly, the transmittance of an auxiliary pattern made of a semi-light-shielding portion is preferably 20% or less.

In this manner, in the case where an auxiliary pattern made of a transparent portion is provided at a center between principal patterns, the width of the auxiliary pattern should be smaller than 0.4×λ/NA, and therefore, when a principal pattern space is large, the auxiliary pattern is too away from the principal patterns to improve the pattern formation characteristics. On the other hand, in the case where an auxiliary pattern made of a semi-light-shielding portion is provided, the width of the auxiliary pattern can exceed 0.4×λ/NA, and hence, the auxiliary pattern can be disposed at an appropriate distance from the principal patterns for realizing the effect to improve the pattern formation characteristics.

Figure 7A:
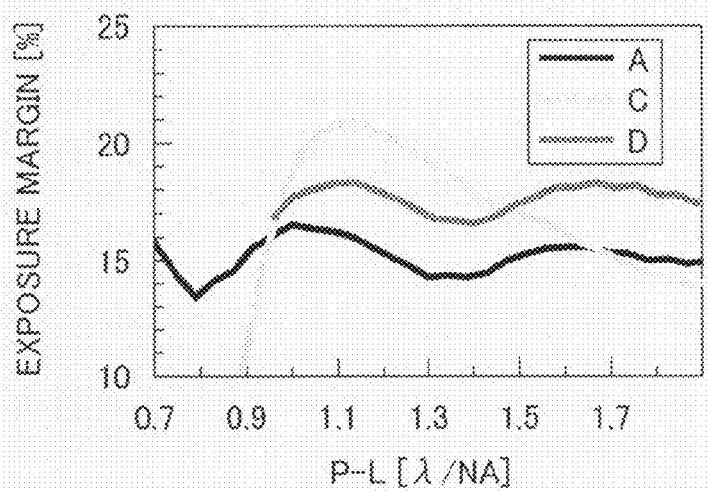
FIGS. 7A, 7B and 7C are diagrams obtained by converting the abscissa of the graphs of the simulation results shown in FIGS. 6A through 6C into a principal pattern space.
Figure 7B:
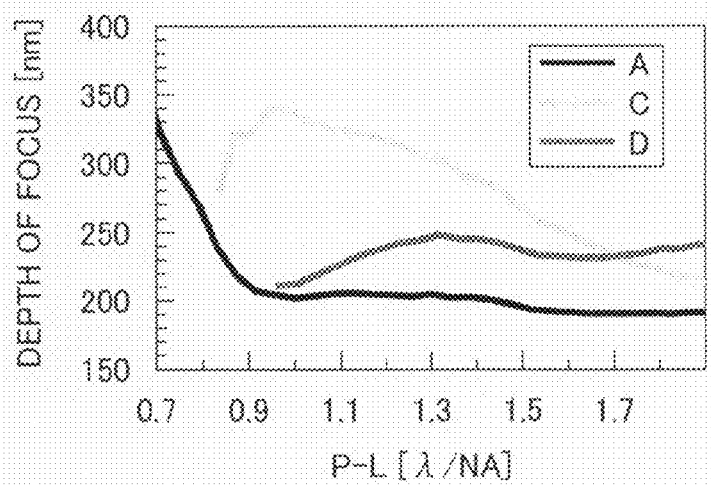
Figure 7C:
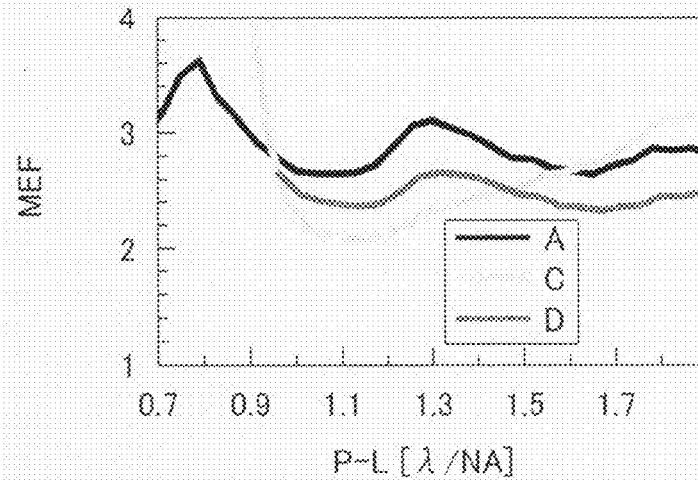

FIGS. 7A through 7C are graphs obtained by converting the abscissa of the graph of the simulation results shown in FIGS. 6A through 6C into a principal pattern space (P-L). As shown in FIGS. 7A through 7C, when the principal pattern space (P-L) exceeds approximately λ/NA, all of the exposure margin, the DOF and the MEF are improved in the structures C and D each including the auxiliary pattern disposed at the center between the principal patterns as compared with those attained in the structure A including the principal patterns alone. However, in the structure C including the auxiliary pattern made of a transparent portion, when the principal pattern space (P-L) exceeds approximately 1.6×λ/NA, the pattern formation characteristics are degraded as compared with those obtained in the structure A. In the structure D including the auxiliary pattern made of a semi-light-shielding portion, however, even when the principal pattern space (P-L) exceeds approximately 1.6×λ/NA, the pattern formation characteristics are improved as compared with those obtained in the structure A.

Furthermore, as shown in FIGS. 7A through 7C, when the principal pattern space (P-L) is within a range from λ/NA to 1.6×λ/NA, the pattern formation characteristics are more improved by providing an auxiliary pattern made of a transparent portion at the center between principal patterns than by providing an auxiliary pattern made of a semi-light-shielding portion. This is for the following reason: When the principal pattern space (P-L) is within the range from λ/NA to 1.6×λ/NA, both of the auxiliary patterns respectively made of a transparent portion and a semi-light-shielding portion are provided in appropriate positions, and hence, a transparent portion for transmitting a larger quantity of light is more preferably used than a semi-light-shielding portion.

Accordingly, when the first principal pattern 111 is close to the fourth principal pattern 114 at the third distance S13 larger than the first distance S11 and is close to the fifth principal pattern 115 at the fourth distance S14 larger than the third distance S13, it is preferred that the auxiliary pattern 104 made of a transparent portion is provided between the first principal pattern 111 and the fourth principal pattern 114 and that the auxiliary pattern 105 made of a semi-light-shielding portion for partially transmitting the exposing light in the same phase to the exposing light passing through the transparent portion is provided between the first principal pattern 111 and the fifth principal pattern 115. It goes without saying that the auxiliary pattern 105 made of a semi-light-shielding portion may be provided between the first principal pattern 111 and the fourth principal pattern 114 instead of the auxiliary pattern 104 made of a transparent portion although the effect to improve the contrast is slightly lowered.

Figure 8A:
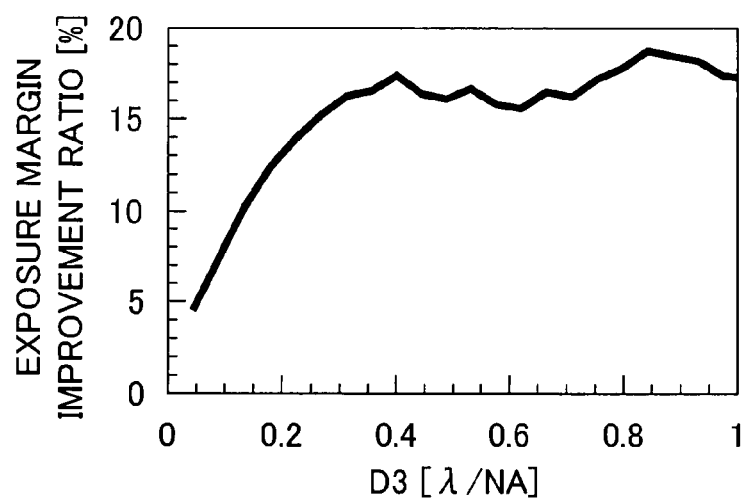
FIGS. 8A, 8B and 8C are diagrams for showing results of simulation for an effect of an auxiliary pattern made of a semi-light-shielding portion used in the photomask of Embodiment 1 of the invention.
Figure 8B:
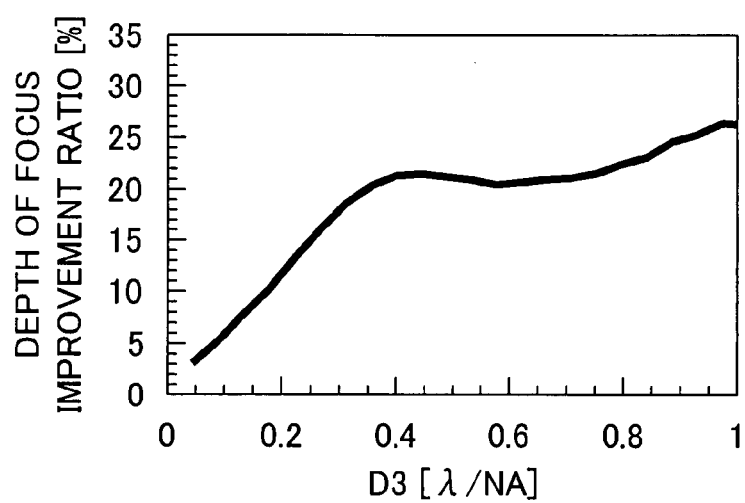
Figure 8C:
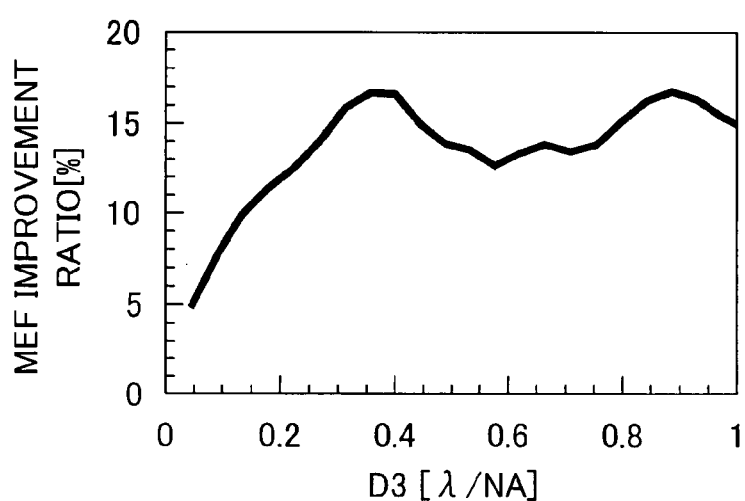

FIGS. 8A through 8C respectively show improvement ratios of the exposure margin, the DOF and the MEF attained by employing the structure D as compared with those attained by employing the structure A. Herein, the improvement ratio of the exposure margin is defined as ((the exposure margin attained in the structure D)−(the exposure margin attained in the structure A))/(the exposure margin attained in the structure D). The improvement ratios of the DOF and the MEF are similarly defined. In each of FIGS. 8A through 8C, the abscissa indicates the width D3 of the auxiliary pattern used in the structure D. As shown in FIGS. 8A through 8C, when the width D3 of the auxiliary pattern made of a semi-light-shielding portion used in the structure D exceeds 0.4×λ/NA, the improvement ratios of the exposure margin, the DOF and the MEF are substantially the upper limits. Accordingly, the width D3 of the auxiliary pattern made of a semi-light-shielding portion is preferably 0.4×λ/NA or more.

Figure 9:
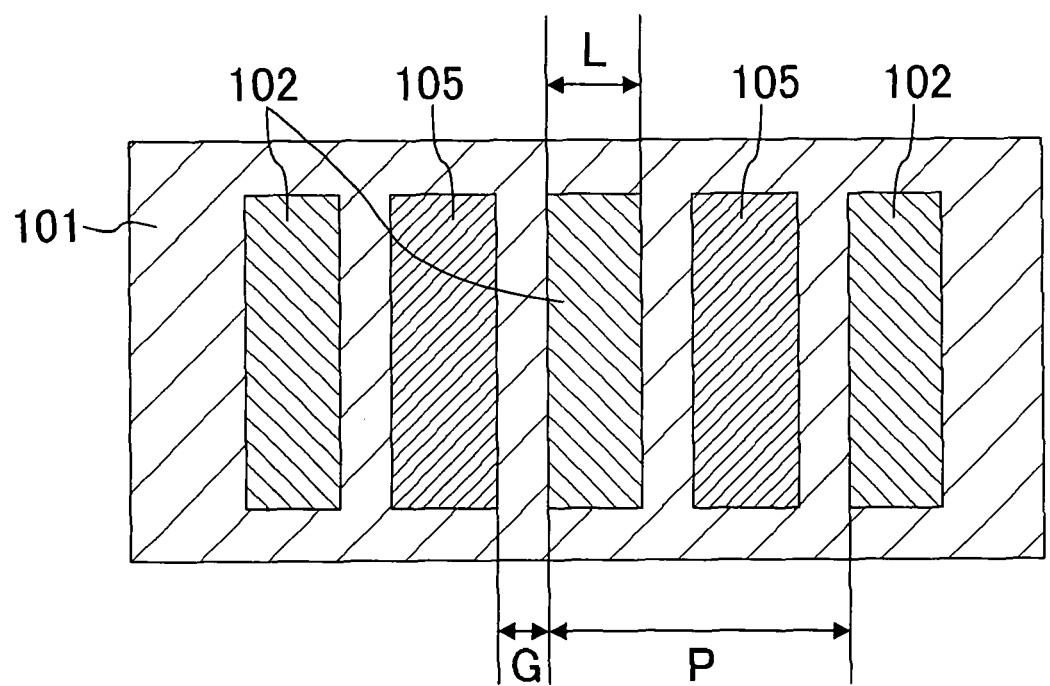
FIG. 9 is a diagram of a mask pattern used in simulation for the effect of the auxiliary pattern made of a semi-light-shielding portion used in the photomask of Embodiment 1 of the invention.
Figure 10A:
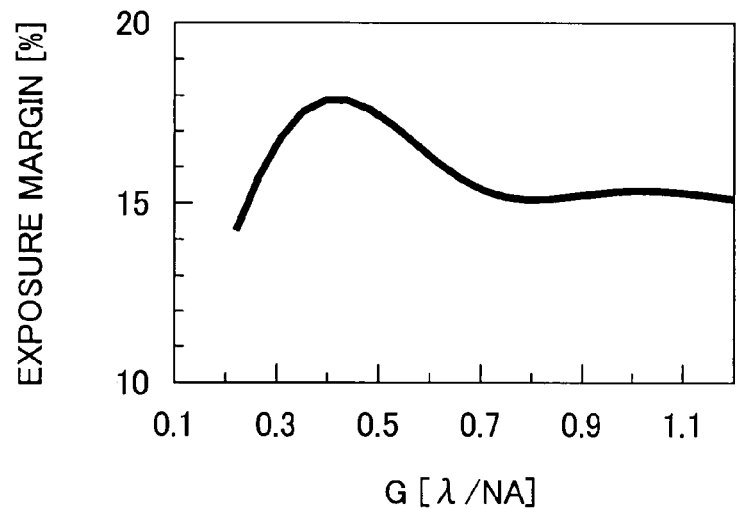
FIGS. 10A, 10B and 10C are diagrams for showing results of the simulation for the effect of the auxiliary pattern made of a semi-light-shielding portion used in the photomask of Embodiment 1 of the invention.
Figure 10B:
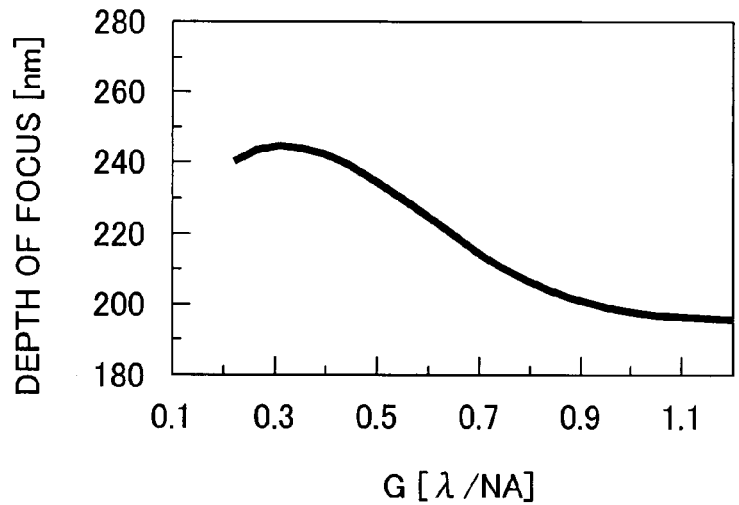
Figure 10C:
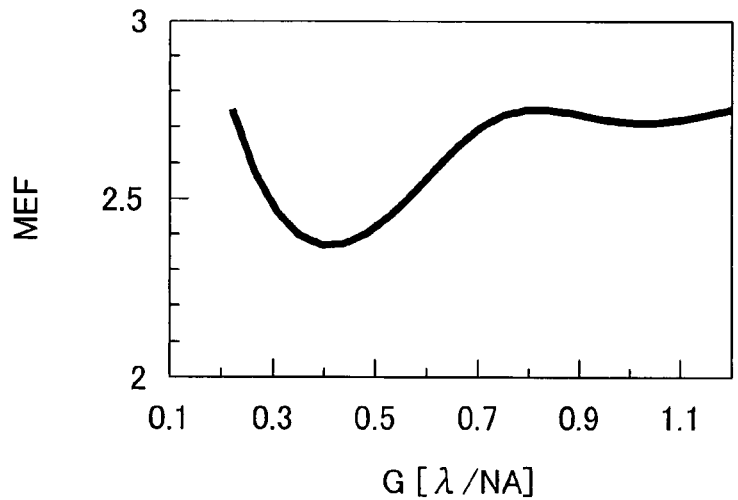

Next, simulation is carried out for examining how an auxiliary pattern made of a semi-light-shielding portion is preferably close to a principal pattern, and the simulation result will be described. FIG. 9 shows a mask pattern including an auxiliary pattern 105 made of a semi-light-shielding portion disposed between principal patterns 102 in the same manner as in the structure D shown in FIG. 5B. FIGS. 10A through 10C respectively show the exposure margin, the DOF and the MEF attained by variously changing a distance G between the principal pattern 102 and the auxiliary pattern 105 with the pitch P of the principal patterns 102 fixed to 2 μm in the mask pattern of FIG. 9. In this case, the width L of the principal pattern 102 is adjusted with respect to each distance G so that the width of a resultant space pattern (a CD value) can be 90 nm.

As shown in FIG. 10A, the exposure margin is improved in the case where the distance G between the principal pattern 102 and the auxiliary pattern 105 is not more than 0.8×λ/NA as compared with the case where the principal pattern 102 is sufficiently away from the auxiliary pattern 105. As shown in FIGS. 10B and 10C, the DOF and the MEF are similarly improved, and hence, the pattern formation characteristics are improved when the distance G between the principal pattern 102 and the auxiliary pattern 105 is not more than 0.8×λ/NA. Accordingly, the auxiliary pattern 105 made of a semi-light-shielding portion is preferably provided to be away from the principal pattern 102 by the distance G of 0.8×λ/NA or less with the light-shielding portion 101 sandwiched therebetween.

Furthermore, as shown in FIGS. 10A through 10C, when the distance G between the principal pattern 102 and the auxiliary pattern 105 is less than 0.3×λ/NA, the exposure margin and the MEF start to degrade. Accordingly, the auxiliary pattern 105 made of a semi-light-shielding portion is preferably provided to be away from the principal pattern 102 by the distance G of 0.3×λ/NA or more with the light-shielding portion 101 sandwiched therebetween.

Moreover, as is understood from the results shown in FIGS. 8A through 8C, the pattern formation characteristics are sufficiently improved when the width of the auxiliary pattern 105 made of a semi-light-shielding portion is 0.4×λ/NA or more. Therefore, it is most preferable that the auxiliary pattern 105 made of a semi-light-shielding portion with a width of 0.4×λ/NA or more is provided to be away from the principal pattern 102 by the distance G not less than 0.3×λ/NA and not more than 0.8×λ/NA. In other words, with respect to an isolated principal pattern, an auxiliary pattern made of a semi-light-shielding portion with a width of 0.4×λ/NA or more is preferably provided to be away from the principal pattern by a distance G not less than 0.3×λ/NA and not more than 0.8×λ/NA. Accordingly, for example, in the plane structure of the photomask of this embodiment shown in FIG. 1B, the auxiliary pattern 105 made of a semi-light-shielding portion is provided on a side of the principal pattern 112 opposite to the principal pattern 111 (namely, on an isolated side).

The simulation results shown in FIGS. 10A through 10C are obtained through the simulation using the oblique incident illumination but the aforementioned effect is attained not merely when the oblique incident illumination is used. Specifically, the effect to improve the contrast attained by using an auxiliary pattern made of a semi-light-light-shielding portion is increased by employing the oblique incident illumination and is similarly attained even by employing the general illumination.

Furthermore, since an effect to attain a periodical characteristic is improved in accordance with the arrangement of an auxiliary pattern for transmitting light in the same phase with respect to a transparent portion, the length of the auxiliary pattern is preferably larger than that of the principal pattern. However, the auxiliary pattern may be shorter to an extent that the pattern formation is not harmfully affected.

Moreover, an auxiliary pattern for transmitting light in the same phase with respect to a transparent portion is provided when a principal pattern space is comparatively large. Therefore, in the case where pattern formation is difficult because the width of a principal pattern is smaller than a principal pattern space, a large merit can be attained by applying an auxiliary pattern for transmitting light in the same phase with respect to a transparent portion. In other words, an auxiliary pattern for transmitting light in the same phase with respect to a transparent portion is particularly effective when resolution of a principal pattern is difficult, namely, when the width of a principal pattern is not more than 1.0×λ/NA.

Now, the range of appropriate transmittance of a semi-light-shielding portion used as the auxiliary pattern 105 will be described on the basis of results of simulation for a margin obtained in pattern formation performed by using a photomask of FIG. 11A. The optical conditions employed for this simulation are the same as those employed in the other aforementioned simulation.

Figure 11A:
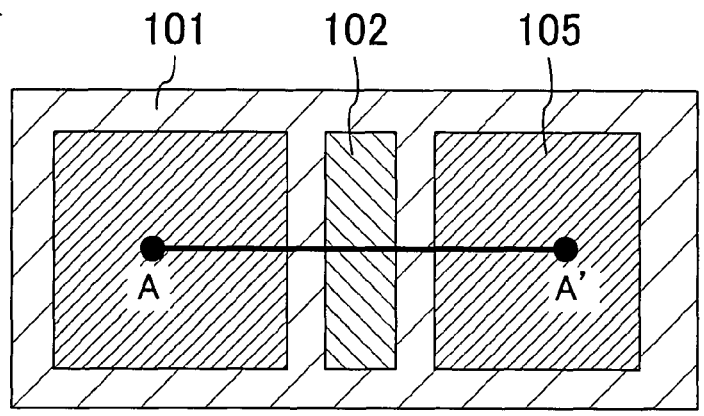
FIGS. 11A, 11B and 11C are diagrams for explaining the range of appropriate transmittance of a semi-light-shielding portion used as an auxiliary pattern in the photomask of Embodiment 1 of the invention.
Figure 11B:
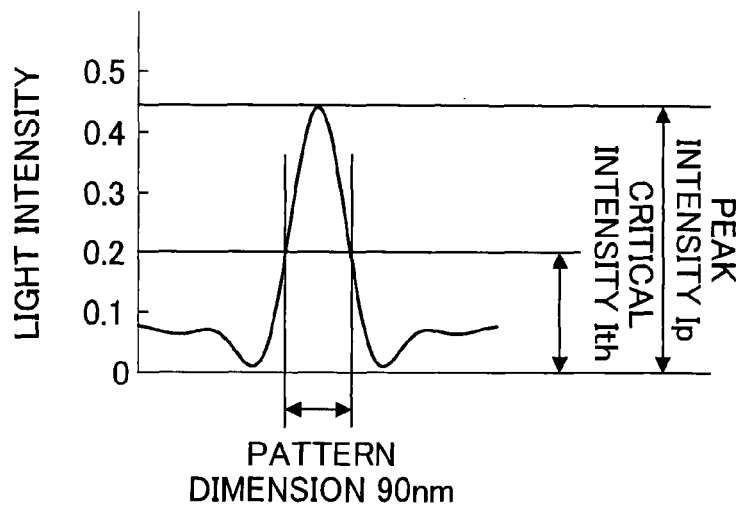

In the photomask shown in FIG. 11A, a principal pattern 102 made of a transparent portion is provided in a light-shielding portion 101 of the photomask, and auxiliary patterns 105 made of a semi-light-shielding portion are provided on both sides of the principal pattern 102. Also, FIG. 11B shows a light intensity distribution obtained in an imaging position corresponding to line AA' of light having passed through the photomask of FIG. 11A. The mask dimension of the principal pattern 102 of the photomask of FIG. 11A is adjusted so that the width of a resultant pattern formed on a wafer can be 90 nm.

Furthermore, as shown in FIG. 11B, the peak of the light intensity is indicated by Ip and the threshold value corresponding to critical intensity for the pattern formation is indicated by Ith. The threshold value Ith is herein 0.2, and the present inventor has found by experience that the threshold value Ith is preferably 0.2 or less for performing good pattern formation. Also, the margin obtained in the pattern formation is increased as the peak intensity Ip is larger than the threshold value Ith. In order to quantitatively express this, values (Ip−Ith)/Ith calculated with respect to various transmittances of the semi-light-shielding portion are shown in FIG. 11C.

Figure 11C:
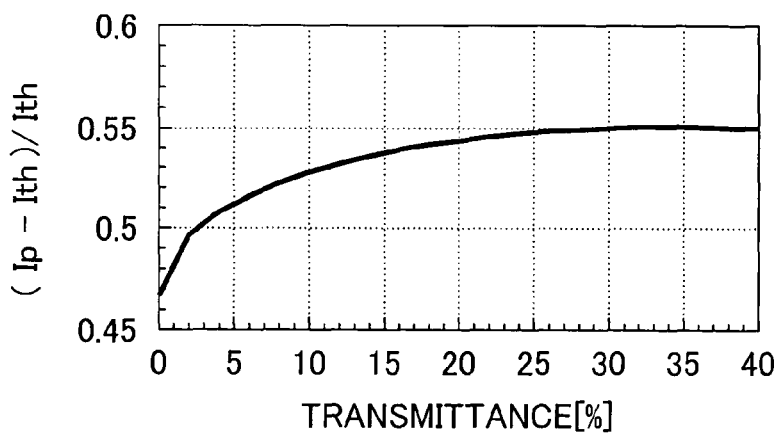

As is understood from FIG. 11C, the value (Ip−Ith)/Ith is increased from approximately 0.45 to approximately 0.55 by increasing the transmittance of the semi-light-shielding portion from 0% (in which case the semi-light-shielding portion is a light-shielding portion; which applies to the following) to 20%. On the other hand, when the transmittance of the semi-light-shielding portion exceeds 20%, the value (Ip−Ith)/Ith is minimally increased. In this case, when the transmittance of the semi-light-shielding portion exceeds 20%, the intensity of light passing through the semi-light-shielding portion exceeds the critical intensity, and hence, the transmittance of the semi-light-shielding portion used as the auxiliary pattern 105 is preferably 20% or less. Furthermore, the value (Ip−Ith)/Ith is largely increased when the transmittance of the semi-light-shielding portion is increased from 0% to 3%, and specifically, the value is increased in this region substantially to a half of the whole increase obtained by increasing the transmittance of the semi-light-shielding portion from 0% to 20%. In other words, when the transmittance of the semi-light-shielding portion is 3% or more, the margin of the pattern formation can be sufficiently improved.

Accordingly, the transmittance of the semi-light-shielding portion used as the auxiliary pattern 105 is preferably 20% or less and is preferably 3% or more for attaining a sufficient effect to improve the margin of the pattern formation.

Next, a cross-sectional structure for realizing the plane structure of the photomask of this embodiment shown in FIG. 1B will be described. FIGS. 12A through 12D are cross-sectional views for showing various cross-sectional structures of a portion corresponding to line AB of the photomask of this embodiment shown in FIG. 1B.

Figure 12A:
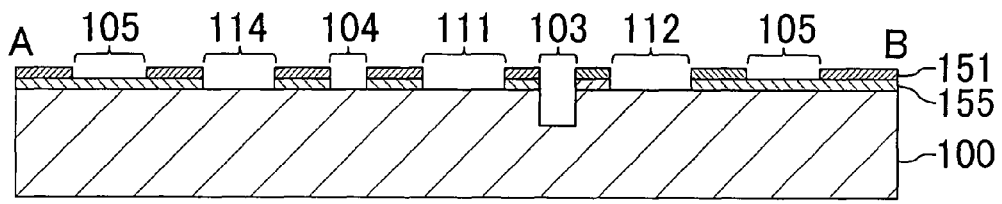
FIGS. 12A, 12B, 12C and 12D are diagrams for showing various cross-sectional structures of a portion corresponding to line AB of the photomask of Embodiment 1 of the invention shown in FIG. 1B

First, in a photomask having the cross-sectional structure shown in FIG. 12A, a translucent semi-light-shielding film 155 for causing the same phase difference in exposing light with respect to a transparent portion (namely, causing a phase difference not less than (−30+360×n) degrees and not more than (30+360×n) degrees (wherein n is an integer)) is formed on a transparent substrate 100 made of, for example, quartz. It is noted that to cause the same phase difference means to cause a phase difference not less than (−30+360×n) degrees and not more than (30+360×n) degrees (wherein n is an integer) in the description below. An example of the semi-light-shielding film 155 is a metal thin film having a thickness for setting the integer n to zero. Also, a transparent portion used as principal patterns 111, 112 and 114 and an auxiliary pattern 104 is made of a bare region (excluding a trenched portion) of the transparent substrate 100, and a semi-light-shielding portion used as an auxiliary pattern 105 is made of a bare region of the semi-light-shielding film 155 formed on the transparent substrate 100. Furthermore, a phase shifter portion used as an auxiliary pattern 103 is formed by trenching a bare region of the transparent substrate 100 by a thickness for causing an opposite phase difference in the exposing light with respect to the transparent portion (namely, a phase difference not less than (150+360×n) degrees and not more than (210+360×n) degrees (wherein n is an integer)). It is noted that to cause an opposite phase difference means to cause a phase difference not less than (150+360×n) degrees and not more than (210+360×n) degrees (wherein n is an integer) in the description below. Specifically, in the photomask shown in FIG. 12A, a trenched portion of the transparent substrate 100 corresponds to a phase shifter portion. Moreover, a light-shielding film 151 for substantially not transmitting the exposing light is further stacked on the semi-light-shielding film 155 formed on the transparent substrate 100, so as to form a light-shielding portion (corresponding to the light-shielding portion 101 of FIG. 1B; which applies to the description below).

In the photomask of FIG. 12A, a metal thin film of, for example, Mo may be used as the semi-light-shielding film 155. As the material for the metal thin film, Ta or the like may be used instead of Mo. Specifically, a metal film with a thickness of, for example, 10 through 30 nm can realize transmittance of approximately 5 through 50% against light of a wavelength of 193 nm. Moreover, the light-shielding portion can be realized by further stacking the light-shielding film 151 of, for example, Cr on the semi-light-shielding film 155 made of, for example, a Mo thin film. The transmittance of a Cr film is approximately 1% against light of a wavelength of 193 nm when the Cr film is singly deposited in a thickness of approximately 50 nm on the transparent substrate 100 of, for example, a quartz substrate, and is less than 0.1% when the Cr film is singly deposited in a thickness of approximately 100 nm on the transparent substrate 100. Accordingly, when the Cr film used as the light-shielding film 151 is stacked on the Mo metal thin film used as the semi-light-shielding film 155 in the aforementioned manner, the light-shielding portion that does not substantially transmit the light can be realized.

In employing the above-described structure of the photomask of FIG. 12A, a transparent substrate 100 on which a semi-light-shielding film 155 and a light-shielding film 151 are successively stacked is prepared, and the semi-light-shielding film 155 and the light-shielding film 151 are respectively appropriately patterned and the transparent substrate 100 is trenched in predetermined portions. Thus, it is possible to fabricate a photomask with an arbitrary layout including a transparent portion, a light-shielding portion, a semi-light-shielding portion and a phase shifter portion. In particular, in the case where a metal thin film is used as the semi-light-shielding film 155, the thickness of the multilayered structure including the semi-light-shielding film 155 and the light-shielding film 151 can be set equivalent to the thickness of a general light-shielding film, and therefore, the accuracy in patterning the multilayered structure can be improved.

Figure 12B:
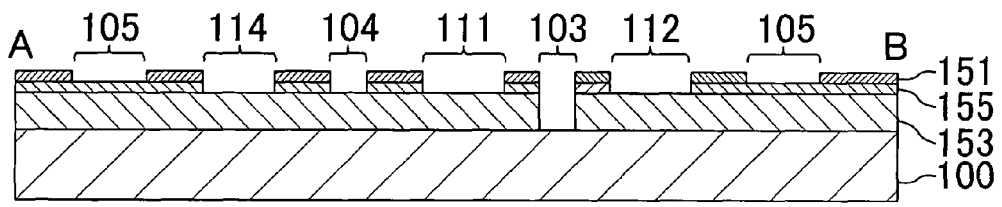

Next, in a photomask having the structure shown in FIG. 12B, a transparent phase shifter film 153 for causing an opposite phase difference in exposing light with respect to a bare region of a transparent substrate 100 is formed on the transparent substrate 100 made of, for example, quartz. A transparent portion used as principal patterns 111, 112 and 114 and an auxiliary pattern 104 is made of a bare region of the phase shifter film 153 formed on the transparent substrate 100. A phase shifter portion used as an auxiliary pattern 103 is made of a bare region of the transparent substrate 100 from which the phase shifter film 153 is selectively removed. Also, in the photomask of FIG. 12B, a translucent semi-light-shielding film 155 for causing the same phase difference in the exposing light with respect to the transparent portion is further stacked on the phase shifter film 153. In this case, a semi-light-shielding portion used as an auxiliary pattern 105 is made of a bare region of the semi-light-shielding film 155 formed on the phase shifter film 153. Furthermore, a light-shielding film 151 for substantially not transmitting the exposing light is further stacked on the semi-light-shielding film 155 formed on the phase shifter film 153, so as to form a light-shielding portion.

In the photomask of FIG. 12B, specific examples of the materials for the semi-light-shielding film 155 and the light-shielding film 151 are the same as those described with respect to the photomask of FIG. 12A. Also, the material for the phase shifter film 153 is, for example, a silicon oxide film such as a SOG (spin on glass) film.

In employing the structure of the photomask shown in FIG. 12B, since the phase shifter film 153 is used, the phase of the phase shifter portion can be controlled in accordance with the thickness of the phase shifter film 153. Therefore, as compared with the structure of the photomask of FIG. 12A in which the phase shifter portion is formed by trenching the transparent substrate 100, the phase of the phase shifter portion can be highly accurately controlled.

Figure 12C:
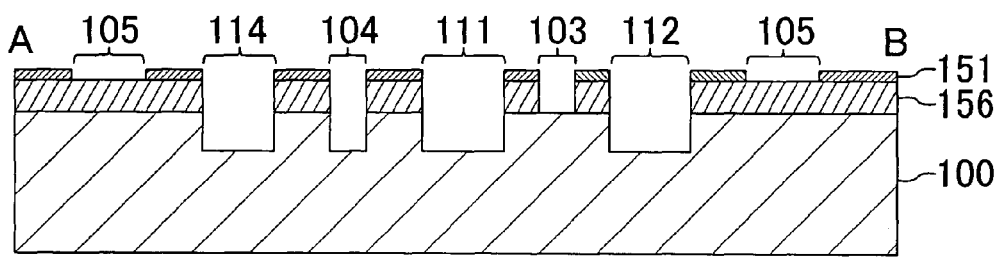

Next, in a structure of the photomask shown in FIG. 12C, a translucent phase shifter film 156 for causing in exposing light an opposite phase difference with respect to a bare region (excluding a trenched portion) of a transparent substrate 100 is formed on the transparent substrate 100 made of, for example, quartz. A transparent portion used as principal patterns 111, 112 and 114 and an auxiliary pattern 104 is provided by trenching the transparent substrate 100 from which the phase shifter film 156 is removed by a thickness for causing in the exposing light an opposite phase difference with respect to the bare region. Furthermore, a phase shifter portion used as an auxiliary pattern 103 is made of a bare region of the transparent substrate 100 from which the phase shifter film 156 is removed, and a semi-light-shielding portion used as an auxiliary pattern 105 is made of a bare region of the phase shifter film 156 formed on the transparent substrate 100. Moreover, a light-shielding film 151 for substantially not transmitting the exposing light is further stacked on the phase shifter film 156 formed on the transparent substrate 100, so as to form a light-shielding portion.

In the photomask of FIG. 12C, specific examples of the material and the like of the light-shielding film 151 are the same as those described with respect to the photomask of FIG. 12A. Also, the material for the phase shifter film 156 is, for example, a molybdenum silicon oxide film.

In the plane structure of the photomask of this embodiment, there is no need to form a pattern finer than a phase shifter portion with respect to a transparent portion owing to the aforementioned principle of this invention. Also, a trenched portion of a transparent substrate is generally formed by etching, and when a pattern to be processed by the etching is finer, there occurs a micro loading effect that a trenched depth is shifted from a desired value in accordance with the pattern dimension. However, in the structure of the photomask shown in FIG. 12C, there is no need to form a pattern finer than a phase shifter portion with respect to a transparent portion, and a trenched portion of the transparent substrate 100 is used not as a phase shifter portion but as a transparent portion. Therefore, the variation in the trenched depth in accordance with the pattern dimension can be avoided, and hence, the mask processing can be eased.

Figure 12D:
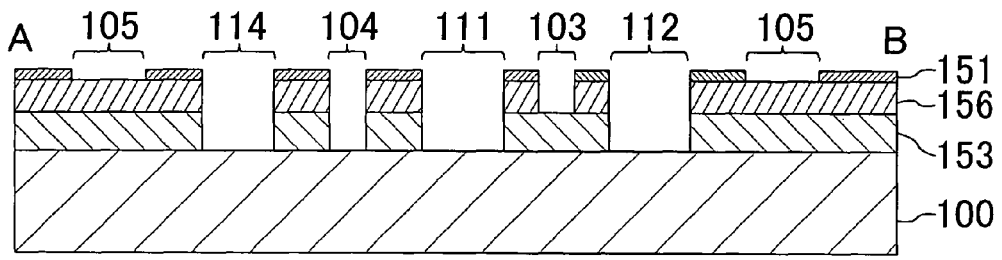

Next, in a structure of the photomask shown in FIG. 12D, a transparent first phase shifter film 153 for causing in exposing light an opposite phase difference with respect to a bare region of a transparent substrate 100 is formed on the transparent substrate 100 made of, for example, quartz. In this case, a transparent portion used as principal patterns 111, 112 and 114 and an auxiliary pattern 104 is made of a bare region of the transparent substrate 100. A phase shifter portion used as an auxiliary pattern 103 is made of a bare region of the first phase shifter film 153 formed on the transparent substrate 100. In the photomask of FIG. 12D, a translucent second phase shifter film 156 for causing in the exposing light an opposite phase difference with respect to the bare region of the transparent substrate 100 is further stacked on the first phase shifter film 153. In this case, a semi-light-shielding portion used as an auxiliary pattern 105 is made of a bare region of the second phase shifter film 156 formed on the first phase shifter film 153. Moreover, a light-shielding film 151 for substantially not transmitting the exposing light is further stacked on the second phase shifter film 156 formed on the first phase shifter film 153, so as to form a light-shielding portion.

In the photomask of FIG. 12D, specific examples of the material and the like of the light-shielding film 151 are the same as those described with respect to the photomask of FIG. 12A, specific examples of the material and the like of the first phase shifter film 153 are the same as those described with respect to the photomask of FIG. 12B, and specific examples of the material and the like of the second phase shifter film 156 are the same as those described with respect to the photomask of FIG. 12C.

In employing the structure of the photomask shown in FIG. 12D, since the phase shifter films 153 and 156 are used, the phase of a phase shifter portion can be controlled in accordance with the thicknesses of the phase shifter films 153 and 156. Therefore, as compared with the structure of the photomask of FIG. 12A in which a phase shifter portion is formed by trenching the transparent substrate 100, the phase of a phase shifter portion can be highly accurately controlled.

In each of the structures of the photomask shown in FIGS. 12B through 12D, each of the thicknesses of the phase shifter films 153 and 156 for causing an opposite phase difference and the semi-light-shielding film 155 for causing the same phase difference should be approximately several hundred nm for the phase control. On the contrary, in the structure of the photomask shown in FIG. 12A, since the thin film (the semi-light-shielding film 155) with a thickness of approximately several tens nm at most is used, fine processing can be easily performed in the patterning for the mask processing. Examples of the metal material usable for the thin film (the semi-light-shielding film 155) are a metal such as Cr (chromium), Ta (tantalum), Zr (zirconium), Mo (molybdenum) or Ti (titanium) and an alloy thereof. Examples of the alloy are Ta—Cr alloy, Zr—Si alloy, Mo—Si alloy and Ti—Si alloy. Since the film to be processed is the thin film (the semi-light-shielding film 155) in the photomask having the structure of FIG. 12A, even when the thin film is stacked on the light-shielding film (of, for example, a Cr film) with a thickness less than approximately 100 nm, the fine processing can be easily performed in the mask processing, and hence the resultant photomask attains particularly good characteristics.

Although the semi-light-shielding film, the phase shifter film or the like is shown as a single-layered film in each of the structures shown in FIGS. 12A through 12D, it goes without saying that such a film can be formed as a multilayered film.

Now, a modification of the photomask of this embodiment obtained by applying the invention to a reflection mask will be described. As described in the item of "Prerequisites", in the case where the invention is applied to a reflection mask instead of a transmission mask, in the description of the plane structure of the photomask of this embodiment of FIG. 1B or the like made with respect to a transmission mask, a transparent portion or a transparent region is replaced with a reflection portion or a reflection region, a light-shielding portion is replaced with a non-reflection portion, a semi-light-shielding portion is replaced with a semi-reflection portion, and transmittance is replaced with reflectance, whereas a phase shifter portion remains as a phase shifter portion.

Figure 12E:
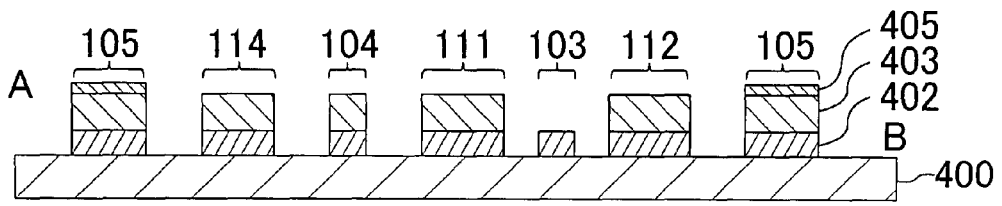
FIG. 12E is a diagram for showing an exemplified cross-sectional structure of a portion corresponding to line AB of a reflection mask according to a modification of Embodiment 1 of the invention shown in FIG. 1B.

Next, in assuming that the photomask of this embodiment having the plane structure as shown in FIG. 1B is a "reflection mask", a cross-sectional structure for realizing the plane structure will be described. FIG. 12E is an exemplified cross-sectional structure of a portion corresponding to line AB of the photomask (reflection mask) of this modification having the plane structure of FIG. 1B.

In the photomask having the cross-sectional structure of FIG. 12E, a first reflection layer 402 for reflecting exposing light is formed on a substrate 400, and a second reflection layer 403 for reflecting light in an opposite phase to light reflected by the first reflection layer 402 is formed on the first reflection layer 402. A bare region of the substrate 400 corresponds to a non-reflection portion. Also, the material for the substrate 400 is, for example, a silicon oxide-based compound or the like. Furthermore, the heights of the reflecting faces of the first reflection layer 402 and the second reflection layer 403 are different from each other in the phase by (180 degrees±30 degrees+360 degrees×n (wherein n is an integer)). In this case, a reflection portion used as principal patterns 111, 112 and 114 and an auxiliary pattern 104 is made of a bare region of the second reflection layer 403 formed on the first reflection layer 402. Also, a phase shifter portion used as an auxiliary pattern 103 is made of a bare region of the first reflection layer 402 from which the second reflection layer 403 is selectively removed. Moreover, an absorption layer 405 for absorbing light is further stacked selectively on the second reflection layer 403, so as to form a semi-reflection portion used as an auxiliary pattern 105. It is noted that a non-reflection portion (corresponding to the light-shielding portion 101 of FIG. 1B) is made of a region of the substrate 400 where none of the reflection layers 402 and 403 is present, namely, a bare region of the substrate 400, in the photomask of FIG. 12E.

In this manner, also in the case where the invention is applied to a reflection mask, it is possible to realize a photomask including an auxiliary pattern capable of improving the contrast of a light intensity distribution obtained on an imaging face of exposing light having been reflected by a principal pattern while preventing transfer of the auxiliary pattern itself. In particular, also in an arbitrary layout where principal patterns are close to each other at a distance smaller than an exposure wavelength, the contrast of the light intensity distribution obtained on an imaging face of the exposing light having been reflected by the principal patterns can be increased.

Figure 13A:
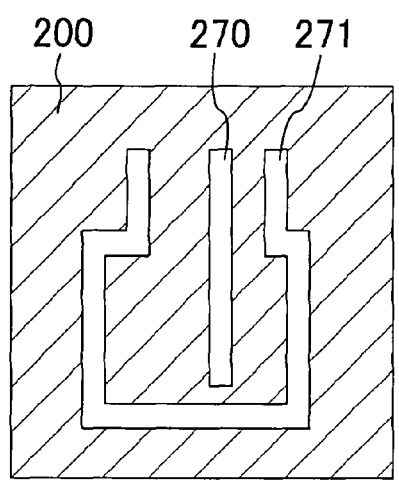
FIG. 13A is a diagram for showing the shape of a desired resist pattern to be formed by using a photomask according to a modification of Embodiment 1 of the invention and FIG. 13B is a plan view of the photomask according to the modification of Embodiment 1 of the invention.
Figure 13B:
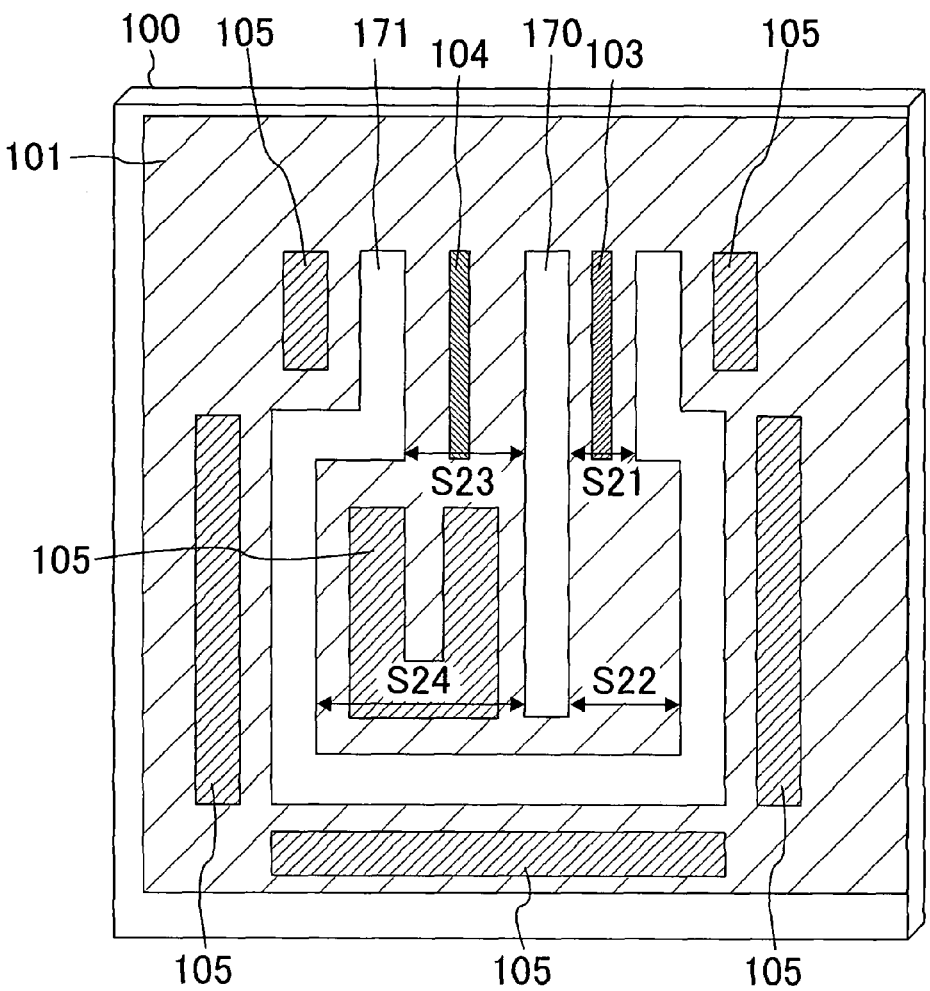

In this embodiment, with respect to the first principal pattern 111, other four principal patterns (the second through fifth principal patterns) 112 through 115 different from the principal patterns 111 are disposed, and one auxiliary pattern is provided between the first principal pattern 111 and each of the other four principal patterns 112 through 115. In the case where two principal patterns are away from each other at two or more different distances, two or more auxiliary patterns may be provided between the two principal patterns. Specifically, as exemplified in FIG. 13B of a plan view of a photomask (a mask pattern) to be used for forming a desired pattern shown in FIG. 13A (namely, a resist pattern 200 including resist removal portions (space patterns) 270 and 271), between a first principal pattern 170 and a second principal pattern 171 adjacent to each other at first through forth distances S21 through S24, different auxiliary patterns 103, 104 and 105 may be simultaneously provided correspondingly to the respective distances. Specifically, the auxiliary pattern 103 made of a phase shifter portion is provided for a principal pattern space of the first distance S21, the auxiliary pattern 104 made of a transparent portion is provided for a principal pattern space of the third distance S23 larger than the first distance S21, and the auxiliary pattern 105 made of a semi-light-shielding portion is provided for a principal pattern space of the fourth distance S24 larger than the third distance S23. In this case, although the effect to improve the contrast is slightly lowered, it goes without saying that the auxiliary pattern 105 made of a semi-light-shielding portion may be provided instead of the auxiliary pattern 104 made of a transparent portion for the principal pattern space of the third distance S23 larger than the first distance S21. In FIG. 13B, like reference numerals are used to refer to like elements used in the photomask of FIG. 1B so as to omit the description.

In the photomask shown in FIG. 13B, when the auxiliary pattern 105 made of a semi-light-shielding portion provided for the fourth distance S24 has transmittance of 20% or less, it is never transferred no matter how it is close to another auxiliary pattern. Furthermore, even when the auxiliary pattern 105 is not provided at the center between the principal patterns, the effect to improve the contrast by the auxiliary pattern 105 can be attained as far as the auxiliary pattern 105 has a width not less than 0.4×λ/NA and is provided at a distance, from each principal pattern, not less than 0.3×λ/NA and not more than 0.8×λ/NA. Moreover, when these conditions are met, the auxiliary pattern 105 made of a semi-light-shielding portion provided for the fourth distance S24 may be divided, for example, into two. Alternatively, the auxiliary pattern 105 may be in a polygonal shape (with five or more apexes) like the auxiliary pattern 105 provided for the fourth distance S24 in the photomask of FIG. 13B. As described above, no matter what positional relationship auxiliary patterns made of a semi-light-shielding portion and having transmittance of 20% or less are arranged in, or no matter what shape such auxiliary patterns are in, a corresponding portion of a resist is never exposed to the exposing light. Furthermore, not only the shape of the auxiliary pattern 105 made of a semi-light-shielding portion but also the shapes of the auxiliary pattern 103 made of a phase shifter portion and the auxiliary pattern 104 made of a transparent portion are not limited to a rectangle but may be in an arbitrary polygonal shape. Moreover, even when an auxiliary pattern for transmitting light in an opposite phase with respect to a principal pattern (namely, the auxiliary pattern 103) and an auxiliary pattern for transmitting light in the same phase with respect to the principal pattern (namely, the auxiliary pattern 104 or 105) are close to each other, lights respectively passing through these auxiliary patterns interfere and cancel with each other, and therefore, even when these two kinds of auxiliary patterns are mixedly used in a photomask, the transfer of the auxiliary patterns is avoided.

Figure 14A:
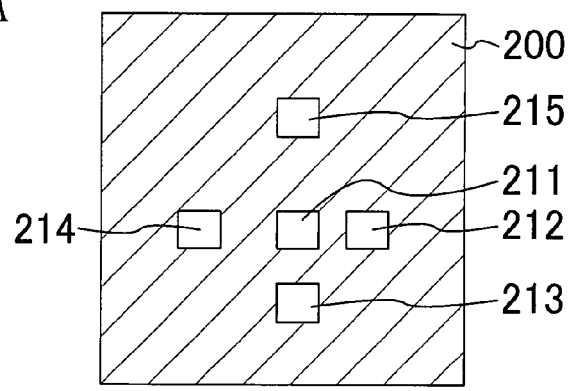
FIG. 14A is a diagram for showing the shape of a desired resist pattern to be formed by using a photomask according to a modification of Embodiment 1 of the invention and FIG. 14B is a plan view of the photomask according to the modification of Embodiment 1 of the invention.
Figure 14B:
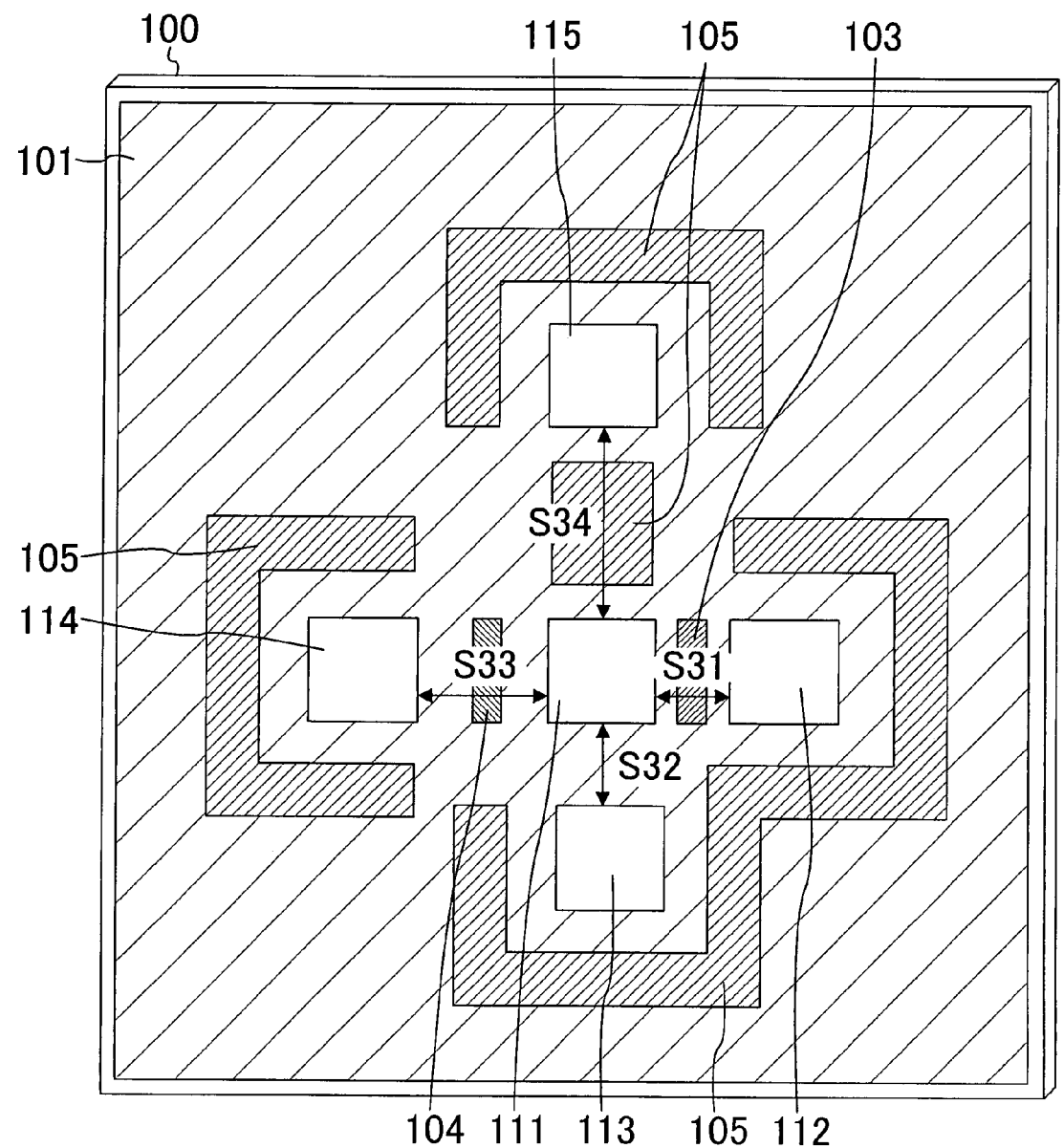

Although the principal patterns are mainly line patterns in this embodiment, the effects similar to those of this embodiment can be attained even when the principal patterns are, for example, hole patterns instead. Specifically, as exemplified in FIG. 14B of a plan view of a photomask (a mask pattern) used for forming a desired pattern shown in FIG. 14A (namely, a resist pattern 200 including resist removal portions (space patterns) 211 through 215), first through fifth principal patterns 111 through 115 corresponding to the space patterns 211 through 215 may be hole patterns. In this case, the first principal pattern 111 and the second principal pattern 112 are adjacent to each other at a first distance S31, the first principal pattern 111 and the third principal pattern 113 are adjacent to each other at a second distance S32, the first principal pattern 111 and the fourth principal pattern 114 are adjacent to each other at a third distance S33, the first principal pattern 111 and the fifth principal pattern 115 are adjacent to each other at a fourth distance S34, and auxiliary patterns 103, 104 and 105 are provided in accordance with the distances S31 through S34. Specifically, the auxiliary pattern 103 made of a phase shifter portion is provided between the first principal pattern 111 and the second principal pattern 112 adjacent to each other at the first distance S31, the auxiliary pattern 104 made of a transparent portion is provided between the first principal pattern 111 and the fourth principal pattern 114 adjacent to each other at the third distance S33 larger than the first distance S31, and the auxiliary pattern 105 made of a semi-light-shielding portion is provided between the first principal pattern 111 and the fifth principal pattern 115 adjacent to each other at the fourth distance S34 larger than the third distance S33. In this case, although the effect to improve the contrast is slightly lowered, it goes without saying that the auxiliary pattern 105 made of a semi-light-shielding portion may be provided instead of the auxiliary pattern 104 made of a transparent portion between the first principal pattern 111 and the fourth principal pattern 114 adjacent to each other at the third distance S33 larger than the first distance S31. In FIG. 14B, like reference numerals are used to refer to like elements used in the photomask shown in FIG. 1B so as to omit the description.

In the photomask shown in FIG. 14B, the auxiliary pattern 105 made of a semi-light-shielding portion and provided for the fourth distance S34 is never transferred no matter how it is close to another auxiliary pattern as far as its transmittance is 20% or less in the same manner as in the photomask shown in FIG. 13B. Furthermore, even when the auxiliary pattern 105 is not provided at the center between the principal patterns, the effect to improve the contrast by the auxiliary pattern 105 can be attained in the same manner as in the case where the principal patterns are line patterns as far as the auxiliary pattern 105 has a width not less than 0.4×λ/NA and is provided at a distance, from each principal pattern, not less than 0.3×λ/NA and not more than 0.8×λ/NA. Moreover, when these conditions are met, the auxiliary pattern 105 made of a semi-light-shielding portion provided for the fourth distance S34 may be divided, for example, into two, or the auxiliary pattern 105 may be in a polygonal shape (with five or more apexes). As described above, no matter what positional relationship auxiliary patterns made of a semi-light-shielding portion and having transmittance of 20% or less are arranged in, or no matter what shape such auxiliary patterns are in, a corresponding portion of a resist is never exposed to the exposing light. Furthermore, not only the shape of the auxiliary pattern 105 made of a semi-light-shielding portion but also the shapes of the auxiliary pattern 103 made of a phase shifter portion and the auxiliary pattern 104 made of a transparent portion are not limited to a rectangle but may be in an arbitrary polygonal shape in the same manner as in the case where the principal patterns are line patterns. Moreover, even when an auxiliary pattern for transmitting light in an opposite phase with respect to a principal pattern (namely, the auxiliary pattern 103) and an auxiliary pattern for transmitting light in the same phase with respect to the principal pattern (namely, the auxiliary pattern 104 or 105) are close to each other, lights respectively passing through these auxiliary patterns interfere and cancel with each other, and therefore, even when these two kinds of auxiliary patterns are mixedly used in a photomask, the transfer of the auxiliary patterns is avoided.

Embodiment 2

A photomask according to Embodiment 2 of the invention will now be described with reference to the accompanying drawings.

Figure 15A:
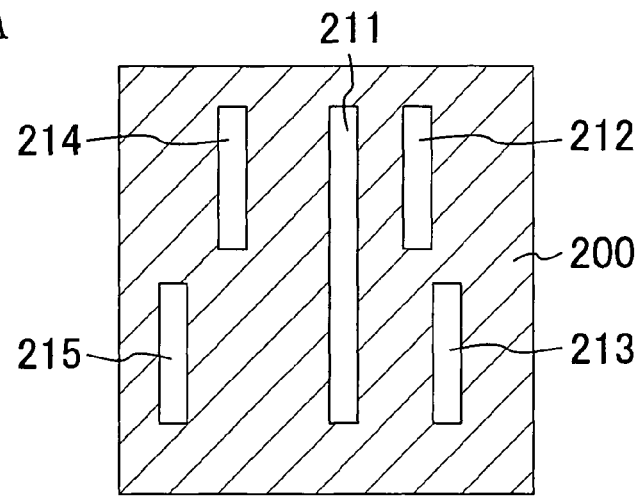
FIG. 15A is a diagram for showing the shape of a desired resist pattern to be formed by using a photomask according to Embodiment 2 of the invention and FIG. 15B is a plan view of the photomask according to Embodiment 2 of the invention.
Figure 15B:
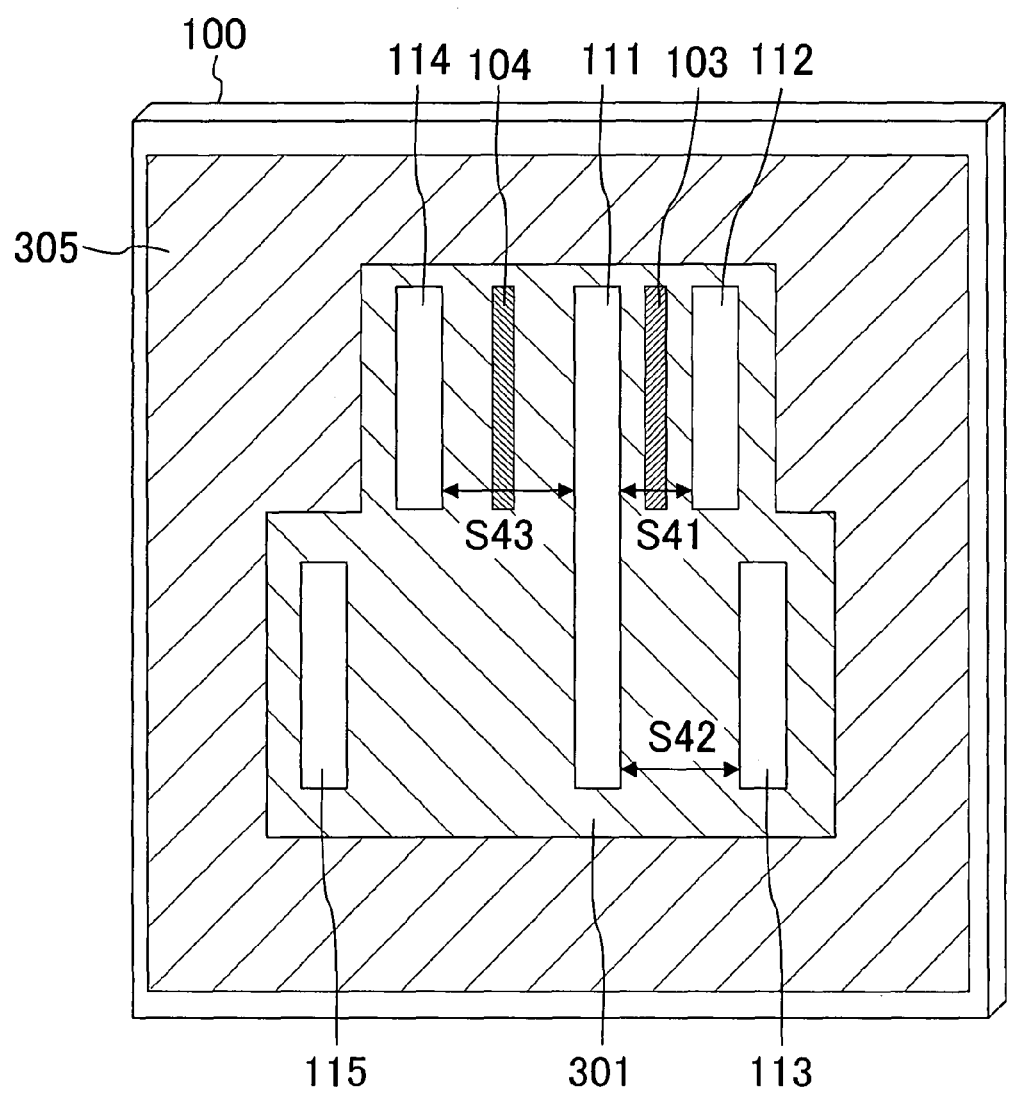

FIG. 15A is a diagram for showing the shape of a desired resist pattern, and FIG. 15B is a plan view of the photomask according to Embodiment 2. It is noted that a transparent substrate is perspectively shown in FIG. 15B.

As shown in FIG. 15A, the desired pattern is a resist pattern 200 including resist removal portions (space patterns) 211 through 215.

As shown in FIG. 15B, a semi-light-shielding portion 305 is formed over a sufficiently large area on the transparent substrate 100, and a light-shielding portion 301 surrounding first through fifth principal patterns 111 through 115 made of a plurality of isolated transparent portions is provided in the semi-light-shielding portion 305. The first through fifth principal patterns 111 through 115 are provided in positions in the light-shielding portion 301 respectively corresponding to the desired space patterns 211 through 215 to be formed on a wafer through pattern exposure.

In this embodiment, in order to improve contrast of a light intensity distribution obtained on an imaging face of exposing light having passed through the principal patterns 111 through 115 to be transferred, the semi-light-shielding portion 305 is formed so as to surround the outline of the light-shielding portion 301 surrounding the principal patterns 111 through 115, and an auxiliary pattern 103 made of a phase shifter portion is provided between the first principal pattern 111 and the second principal pattern 112 close to each other at a first distance S41. At this point, between light passing through the phase shifter portion used as the auxiliary pattern 103 and light passing through the transparent portion used as the principal patterns 111 through 115, there is an opposite phase (inverted phase) relationship (specifically, a relationship with a phase difference not less than (150+360×n) degrees and not more than (210+360×n) degrees (wherein n is an integer)). Also, between light passing through the semi-light-shielding portion 305 and light passing through the transparent portion used as the principal patterns 111 through 115, there is the same phase relationship (specifically, a relationship with a phase difference not less than (−30+360×n) degrees and not more than (30+360×n) degrees (wherein n is an integer)). Moreover, the transmittance of the semi-light-shielding portion 305 is preferably 20% or less so as not to expose a corresponding portion of a resist to the exposing light, and is preferably 3% or more so as to attain an effect to sufficiently improve a margin in the pattern formation (see Embodiment 1).

Since the auxiliary pattern 103 made of a phase shifter portion is provided between the first principal pattern 111 and the second principal pattern 112 in the aforementioned manner, even when the first principal pattern 111 and the second principal pattern 112 are close to each other at a distance smaller than the exposure wavelength, the contrast of the light intensity distribution obtained on the imaging face of the exposing light having passed through the principal patterns 111 and 112 is improved.

In the same manner as in the case where an auxiliary pattern made of a phase shifter portion is provided between principal patterns for improving the pattern formation characteristics in Embodiment 1, the auxiliary pattern 103 made of a phase shifter portion is preferably provided for the first distance S41 not more than $0.8 \times \lambda/NA$, and the width of the auxiliary pattern 103 made of a phase shifter portion is preferably not more than $0.4 \times \lambda/NA$.

On the other hand, it is preferred, in this embodiment, that an auxiliary pattern made of a phase shifter portion is not provided for a principal pattern space larger than $0.8 \times \lambda/NA$. For example, as shown in FIG. 15B, an auxiliary pattern made of a phase shifter portion is not provided between the first principal pattern 111 and the third principal pattern 113 close to each other at a second distance S42 larger than the first distance S41.

Furthermore, in the same manner as in Embodiment 1, in the case where a principal pattern is in a line shape, diffracted light rounding to the back side of the principal pattern is small in the quantity at the end of the line shape of the principal pattern. Therefore, the length of the auxiliary pattern 103 made of a phase shifter portion is preferably smaller than the length of the principal pattern in a line shape. However, the length of the auxiliary pattern 103 may be larger as far as the pattern formation is not harmfully affected.

Moreover, in Embodiment 1, it is most preferable that an auxiliary pattern made of a semi-light-shielding portion is provided at a distance, from a principal pattern made of a transparent portion, not less than $0.3 \times \lambda/NA$ and not more than $0.8 \times \lambda/NA$. Similarly in this embodiment, the semi-light-shielding portion 305 surrounding the outline of the light-shielding portion 301 is preferably provided at a distance, from each of the principal patterns 111 through 115, not less than $0.3 \times \lambda/NA$ and not more than $0.8 \times \lambda/NA$. Accordingly, in the light-shielding portion 301 surrounding the principal patterns 111 through 115 made of a transparent portion, a region sandwiched between each of the principal patterns 111 through 115 and the semi-light-shielding portion 305 has a width preferably not less than $0.3 \times \lambda/NA$ and not more than $0.8 \times \lambda/NA$ in this embodiment.

Figure 16:
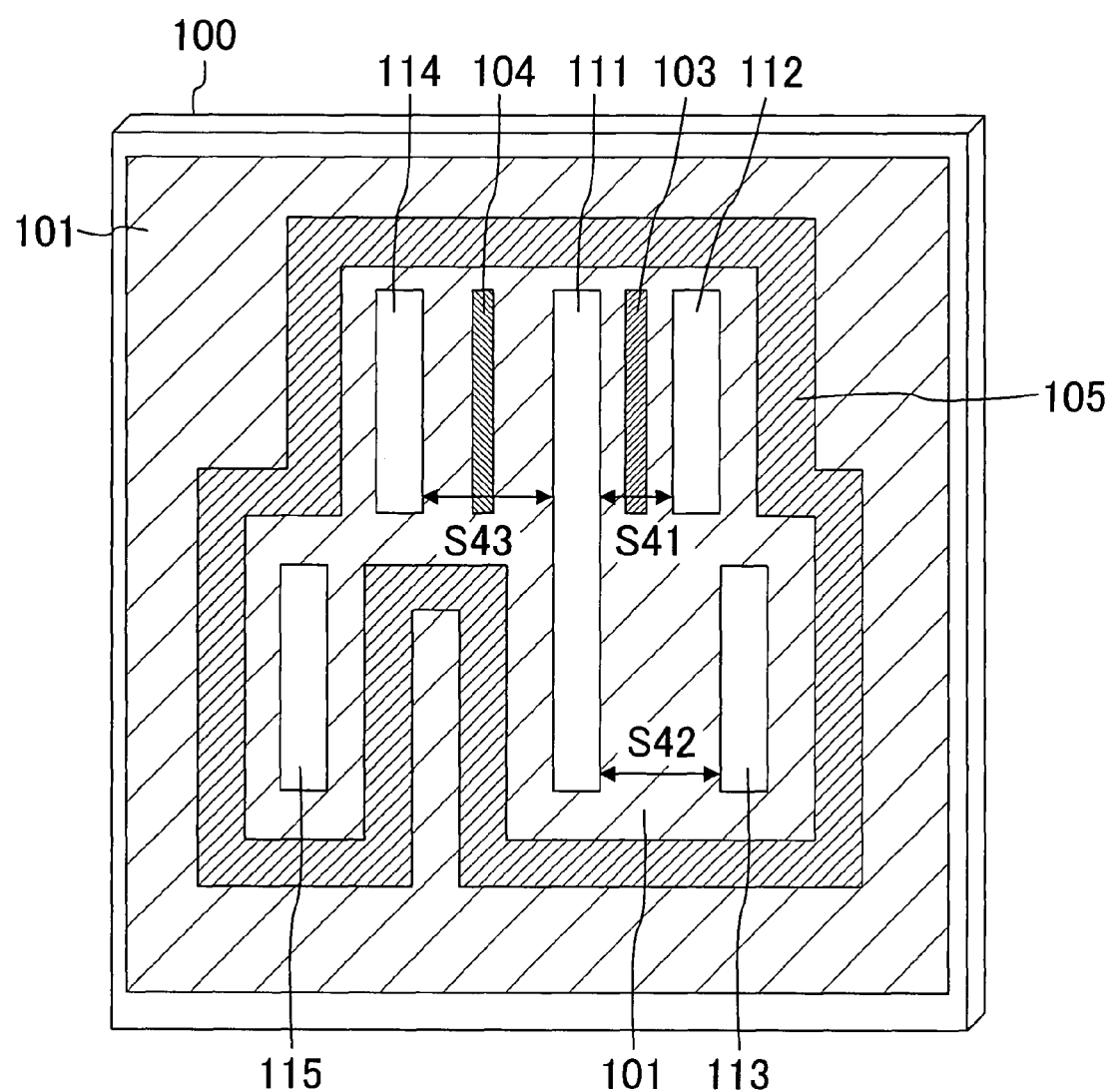
FIG. 16 is a plan view of a photomask according to a modification of Embodiment 2 of the invention.

Furthermore, in the same manner as in Embodiment 1, the width of the semi-light-shielding portion 305 is preferably not less than $0.4 \times \lambda/NA$ in this embodiment. In other words, when the width of the semi-light-shielding portion 305 is not less than $0.4 \times \lambda/NA$, the above-described effects can be attained. Accordingly, as in a photomask shown in, for example, FIG. 16 that is a plan view of a modification of the photomask of FIG. 15B, the light-shielding portion 101 may be further provided outside a semi-light-shielding portion 105 surrounding the outline of the light-shielding portion 101 surrounding the principal patterns 111 through 115. In this case, the width of the semi-light-shielding portion 105 is preferably not less than $0.4 \times \lambda/NA$.

Moreover, in this embodiment, in order to improve the contrast of the light intensity distribution obtained on the imaging face of the exposing light having passed through the mask pattern of FIG. 15B, an auxiliary pattern for transmitting light in the same phase with respect to the transparent portion is provided in the light-shielding portion 301 surrounding the transparent portion used as the principal patterns 111 through 115. Specifically, an auxiliary pattern 104 made of a transparent portion is provided between the first principal pattern 111 and the fourth principal pattern 114 closed to each other at a third distance S43 larger than the first distance S41. At this point, the auxiliary pattern 104 for transmitting the light in the same phase with respect to the principal patterns 111 through 115 may be replaced with an auxiliary pattern made of a semi-light-shielding portion. However, as described in Embodiment 1, an auxiliary pattern made of a transparent portion or a semi-light-shielding portion is preferably provided for a principal pattern space not less than λ/NA, and when the principal pattern space is not less than λ/NA and not more than 1.6×λ/NA, the pattern formation characteristics can be more improved by providing, at the center between principal patterns, an auxiliary pattern made of a transparent portion than by providing an auxiliary pattern made of a semi-light-shielding portion.

In the same manner as described in Embodiment 1, the effect to attain the periodic characteristic is improved in accordance with the arrangement of an auxiliary pattern for transmitting light in the same phase with respect to a transparent portion. Therefore, the length of the auxiliary pattern is preferably larger than the length of the principal pattern. However, the length of the auxiliary pattern may be smaller as far as the pattern formation is not harmfully affected.

As described so far, the principle of the effect to improve the contrast attained in this embodiment is the same as that of Embodiment 1. When a light-shielding portion surrounding a transparent portion used as a principal pattern is dealt with as an isolated pattern and a semi-light-shielding portion having the same effect as an auxiliary pattern is provided as the background of a photomask as in this embodiment, complication of the arrangement of auxiliary patterns otherwise caused when principal patterns are complicatedly arranged can be avoided. This is because there is no need to provide an auxiliary pattern made of a semi-light-shielding portion. Furthermore, as compared with Embodiment 1, the number of auxiliary patterns included in a photomask used for forming the same desired pattern can be reduced, and hence, the number of patterns to be drawn in the fabrication of the photomask can be reduced, resulting in reducing load of the photomask fabrication.

In this embodiment, the whole background of the photomask is assumed to be a semi-light-shielding portion. However, the effect to improve the contrast can be attained when the width of the semi-light-shielding portion surrounding the outline of the light-shielding portion is not less than 0.4×λ/NA. Therefore, it goes without saying that the photomask shown in FIG. 16 (in which the semi-light-shielding portion 105 (with a width not less than 0.4×λ/NA) surrounding the outline of the light-shielding portion 101 surrounding the principal patterns 111 through 115 is further surrounded with the light-shielding portion 101) may be used instead of the photomask of FIG. 15B as described above.

In this manner, according to this embodiment, since the auxiliary patterns 103 and 104 having a transmitting property against the exposing light are provided in the light-shielding portion 301 surrounding the principal patterns 111 through 115, the contrast of the light intensity distribution obtained on the imaging face of the exposing light having passed through the principal patterns 111 through 115 is improved, so as to improve the pattern formation characteristics. Furthermore, since the semi-light-shielding portion 305 is provided so as to surround the outline of the light-shielding portion 301, the same effect as that attained by the auxiliary pattern made of a semi-light-shielding portion used in Embodiment 1 can be attained. Accordingly, the effect to sufficiently improve the contrast can be attained merely by providing the auxiliary patterns 103 and 104 respectively between corresponding principal patterns in addition to the semi-light-shielding portion 305 used as the background, and hence, the transfer of the auxiliary patterns derived from their closeness can be avoided.

Moreover, although it is most preferable that the auxiliary pattern for transmitting light in an opposite phase with respect to the transparent portion used as the principal patterns 111 through 115 and the auxiliary pattern for transmitting the light in the same phase with respect to the transparent portion are both provided in the light-shielding portion 301 surrounding the principal patterns 111 through 115 as in this embodiment, one of the auxiliary patterns may be omitted.

As the cross-sectional structure of the photomask of this embodiment, for example, any of the cross-sectional structures of FIGS. 12A through 12D described in Embodiment 1 can be employed. Also in the same manner as described in Embodiment 1, the photomask of this embodiment can be also modified to be applied to a reflection mask. The cross-sectional structure of such a modified photomask may be the cross-sectional structure of the modification of Embodiment 1 shown in FIG. 12E.

Furthermore, the semi-light-shielding portion 305 of this embodiment is made of, for example, a metal thin film (a semi-light-shielding film) with a thickness of 30 nm or less formed on the transparent substrate 100.

Moreover, although the principal patterns are line-shaped patterns in this embodiment, the same effects as those attained by this embodiment can be attained even when the principal patterns are, for example, in the shape of contact holes (in rectangular shapes). Also, the shape of each of the auxiliary patterns and the principal patterns is not limited to a rectangle but may be in any polygonal shape.

Embodiment 3

A pattern formation method according to Embodiment 3 of the invention, and more specifically, a pattern formation method using the photomask according to any of Embodiments 1, 2 and their modifications (hereinafter referred to as the photomask of the invention) will now be described with reference to the accompanying drawings.

FIGS. 17A through 17D are cross-sectional views for showing procedures in the pattern formation method of Embodiment 3.

First, as shown in FIG. 17A, a target film 501 of, for example, a metal film or an insulating film is formed on a substrate 500, and thereafter, a positive resist film 502 is formed on the target film 501 as shown in FIG. 17B.

Next, as shown in FIG. 17C, the resist film 502 is irradiated with exposing light 511 through the photomask of this invention such as the photomask of Embodiment 1 having the cross-sectional structure shown in FIG. 12A, so as to expose the resist film 502 to exposing light 512 having passed through the photomask. At this point, a phase shifter made of a trenched portion of the transparent substrate 100 is formed so as to be surrounded with a light-shielding portion made of a light-shielding film 151 formed on the semi-light-shielding film 155.

In the exposure procedure shown in FIG. 17C, the resist film 502 is subjected to the exposure by using, for example, an oblique incident exposure light source. In this case, as shown in FIG. 17C, merely a latent image portion 502a of the resist film 502 corresponding to a principal pattern of the photomask is irradiated at exposure energy sufficiently high for allowing the resist to dissolve in development.

Next, the resist film 502 is developed so as to remove the latent image portion 502a, thereby forming resist patterns 503 corresponding to the mask patterns of the photomask as shown in FIG. 17D.

In this embodiment, since the photomask of this invention (specifically, the photomask of any of Embodiments 1, 2 and their modifications) is used in the pattern formation method, the same effects as those attained in Embodiments 1, 2 and their modifications can be attained.

Figure 18A:
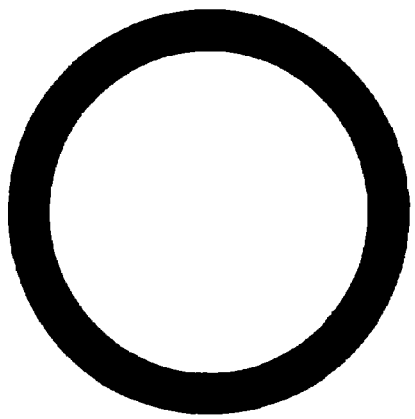
FIG. 18A is a diagram for schematically showing a general exposure light source and FIGS. 18B, 18C and 18D are diagrams for schematically showing light sources for oblique incident illumination.
Figure 18B:
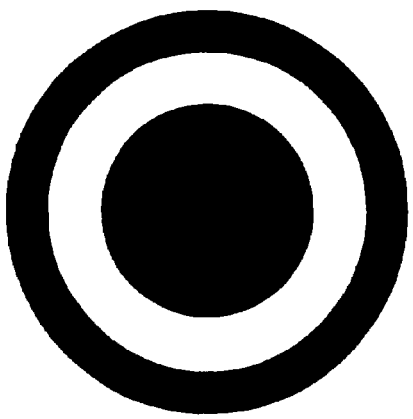
Figure 18C:
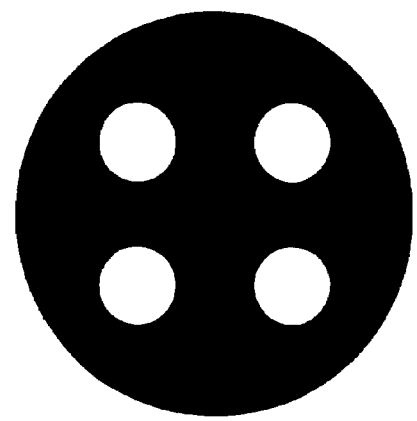
Figure 18D:
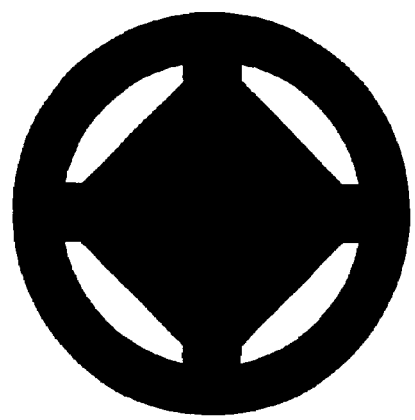

Furthermore, when an oblique incident exposure light source is used in performing the exposure, performed through the photomask of this invention, of a substrate (wafer) on which a resist has been applied, a light intensity distribution with high contrast is formed owing to the photomask of any of Embodiments 1, 2 and their modifications (namely, a photomask including auxiliary patterns), and therefore, a finer pattern can be formed. Herein, an oblique incident exposure light source means a light source as shown in any of FIGS. 18B through 18D obtained by removing a vertical incident component (a component of the exposing light vertically entering the photomask from the light source) from a general exposure light source of FIG. 18A. Typical examples of the oblique incident exposure light source are an annular exposure light source of FIG. 18B and quadrupole exposure light sources of FIGS. 18C and 18D. Although slightly depending upon a target pattern, the quadrupole exposure light source is generally more effectively used than the annular exposure light source for improving the contrast and increasing the DOF.

Embodiment 4

A mask data creation method according to Embodiment 4 of the invention will now be described with reference to the accompanying drawings. In this embodiment, mask data for the photomask of Embodiment 1 or its modifications (hereinafter referred to as the photomask of this invention) is created. Herein, creation of mask data means creation of a pattern of an exposed region for transmitting exposing light (corresponding to an exposed region for reflecting exposing light in a reflection mask) and a pattern of an unexposed region for not transmitting the exposing light (corresponding to an unexposed region for not reflecting the exposing light in a reflection mask) in the background set for a mask. For example, in the case where the background of the mask is set as a light-shielding region for not transmitting the exposing light, a pattern of an exposed region for transmitting the exposing light is created. On the other hand, in the case where the background of the mask is set as a region for transmitting the exposing light (corresponding to a region for reflecting the exposing light in a reflection mask), a pattern of an exposed region for transmitting the exposing light in a different phase with respect to the background (corresponding to an exposed region for reflecting the exposing light in a different phase with respect to the background in a reflection mask) and a pattern of an unexposed region such as a light-shielding region (corresponding to a non-reflection region in a reflection mask) are created. In a transmission mask, an exposed region for transmitting exposing light specifically corresponds to a transparent portion, a semi-light-shielding portion or a phase shifter portion, and in a reflection mask, an exposed region for reflecting exposing light specifically corresponds to a reflection portion, a semi-reflection portion or a phase shifter portion.

Figure 19:
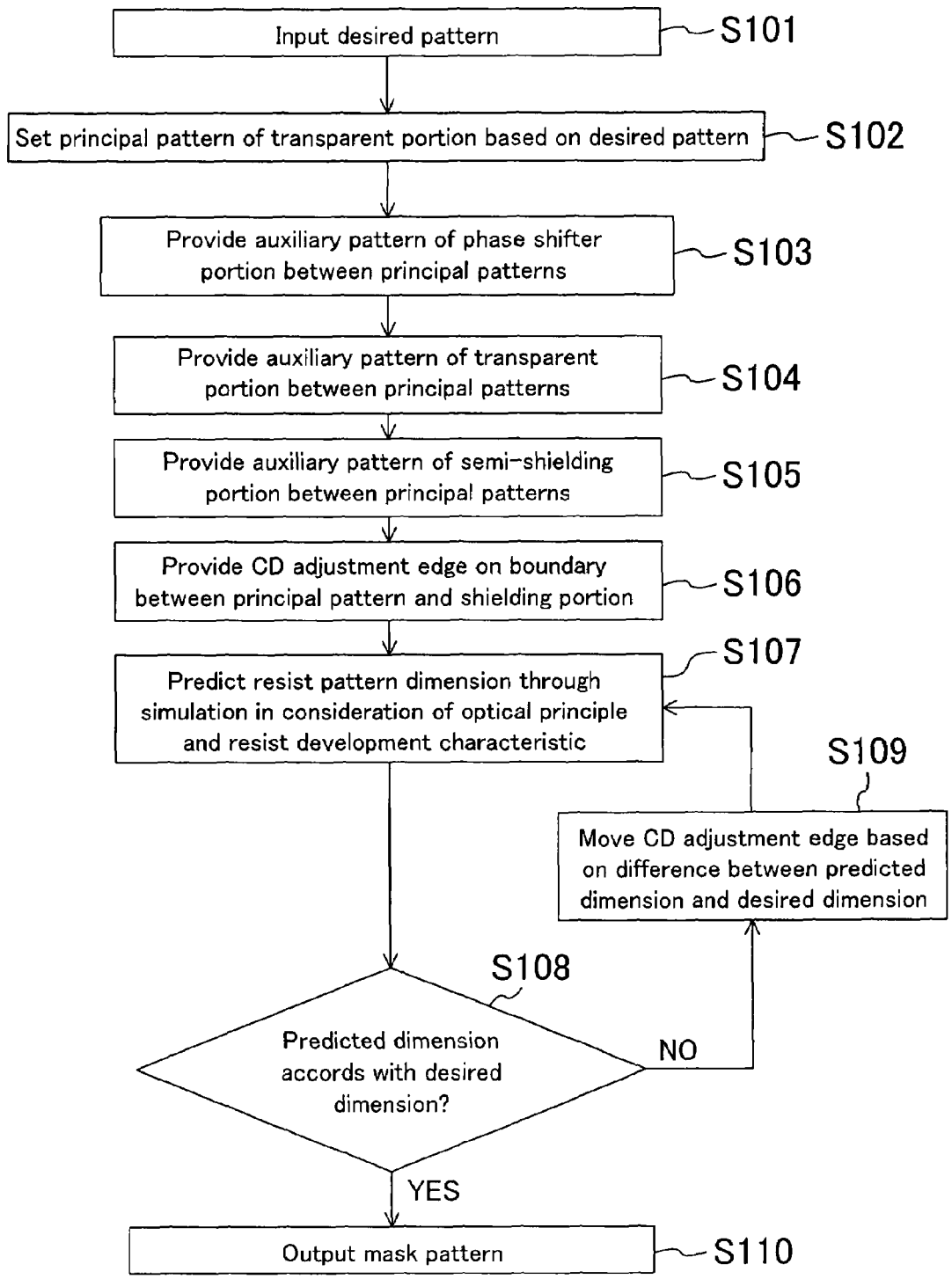
FIG. 19 is a flowchart of a basic flow of a mask data creation method according to Embodiment 4 of the invention.
Figure 20A:
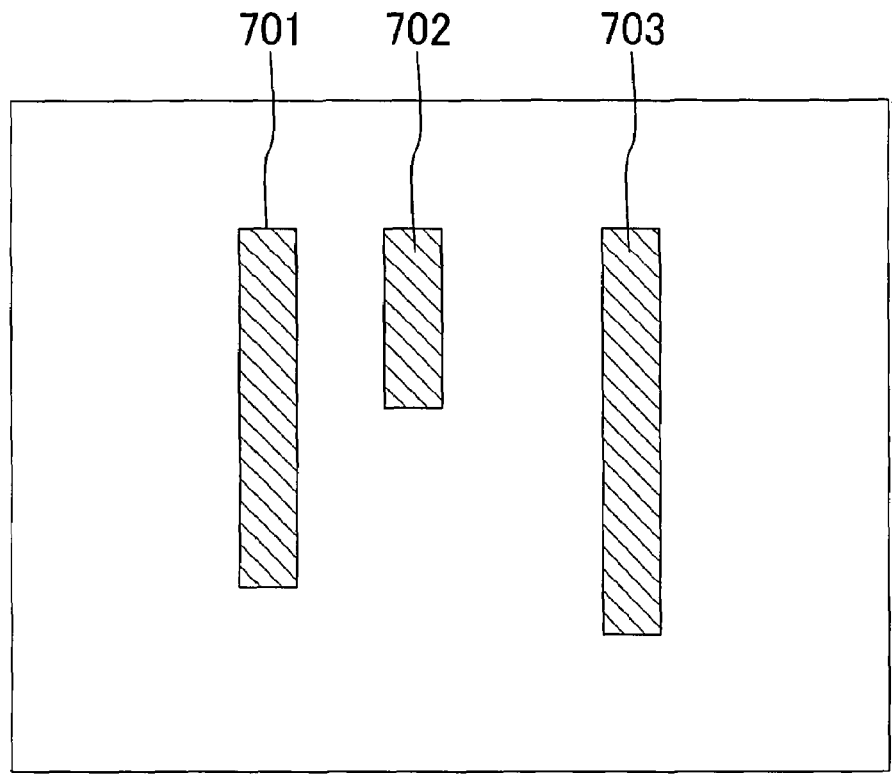
FIG. 20A is a diagram of an exemplified desired pattern to be formed by using a photomask of Embodiment 4 of the invention and FIG. 20B is a diagram of an exemplified specific mask pattern created in one procedure in the mask data creation method of Embodiment 4 of the invention.

Now, the flow of the mask data creation method of this embodiment will be described in detail. FIG. 19 is a flowchart for showing the basic flow of the mask data creation method of this embodiment. FIG. 20A shows an example of a desired pattern to be formed by using the photomask of this invention, and specifically, an example of a design pattern corresponding to a principal pattern made of a transparent portion included in the photomask of this invention. Specifically, patterns 701 through 703 shown in FIG. 20A are patterns corresponding to portions of a resist to be exposed to exposing light in the pattern exposure performed by using the photomask of this invention and become space patterns after resist pattern formation. Also, FIGS. 20B, 21A, 21B, 22A, 22B and 23 respectively show exemplified mask patterns to be specifically created in respective procedures in the mask data creation method of this embodiment.

In the description of the pattern formation in this embodiment, the positive resist process is employed unless otherwise mentioned. In other words, it is premised in the description below that a resist exposed portion is removed through development and a resist unexposed portion remains as a resist pattern. Accordingly, when the negative resist process is employed instead of the positive resist process, the mask data creation method is performed in the same manner as in this embodiment except that a resist exposed portion remains as a resist pattern with a resist unexposed portion removed.

First, in step S101, desired patterns such as the patterns 701 through 703 shown in FIG. 20A are input to a computer used for the mask data creation. At this point, the transmittances of a phase shifter portion and a semi-light-shielding portion included in a mask pattern are set. Also, the desired patterns may be previously deformed, namely, enlarged or reduced in each portion thereof if necessary.

Figure 20B:
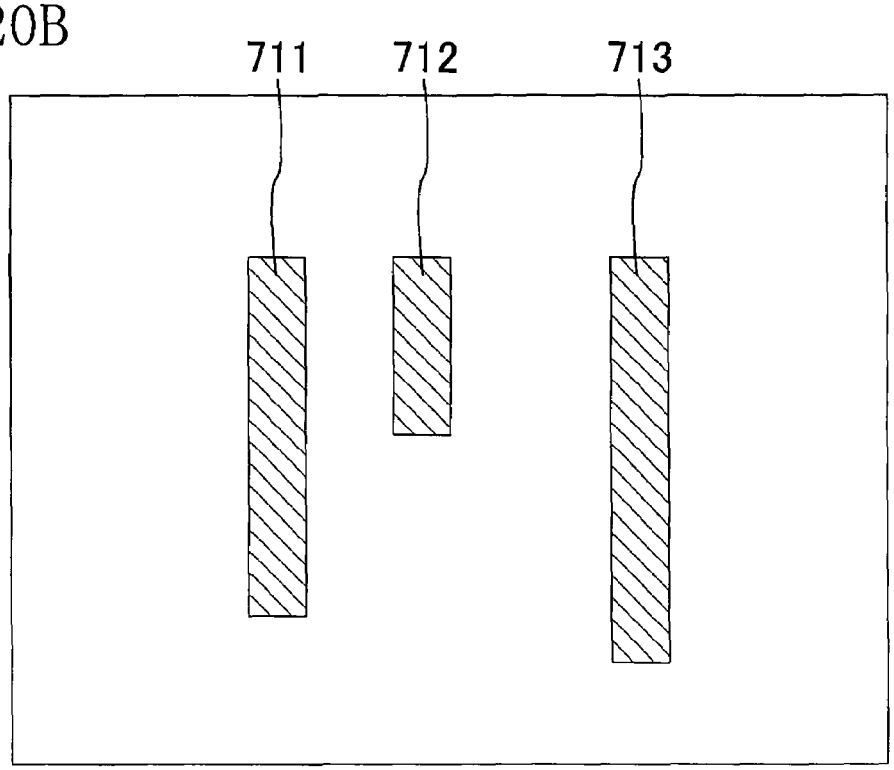

Next, in step S102, a principal pattern made of a transparent portion is set on the basis of the desired patterns. At this point, "a principal pattern is set" because the principal pattern is deformed by OPC processing in a subsequent step and hence, at this point, the principal pattern is merely a virtual principal pattern used for creating an auxiliary pattern as described below. FIG. 20B shows principal patterns 711 through 713 set in step S102 correspondingly to the desired patterns 701 through 703. It is noted that the background of the mask is set as a light-shielding portion (an unexposed region) in step S1102 in this embodiment.

Figure 21A:
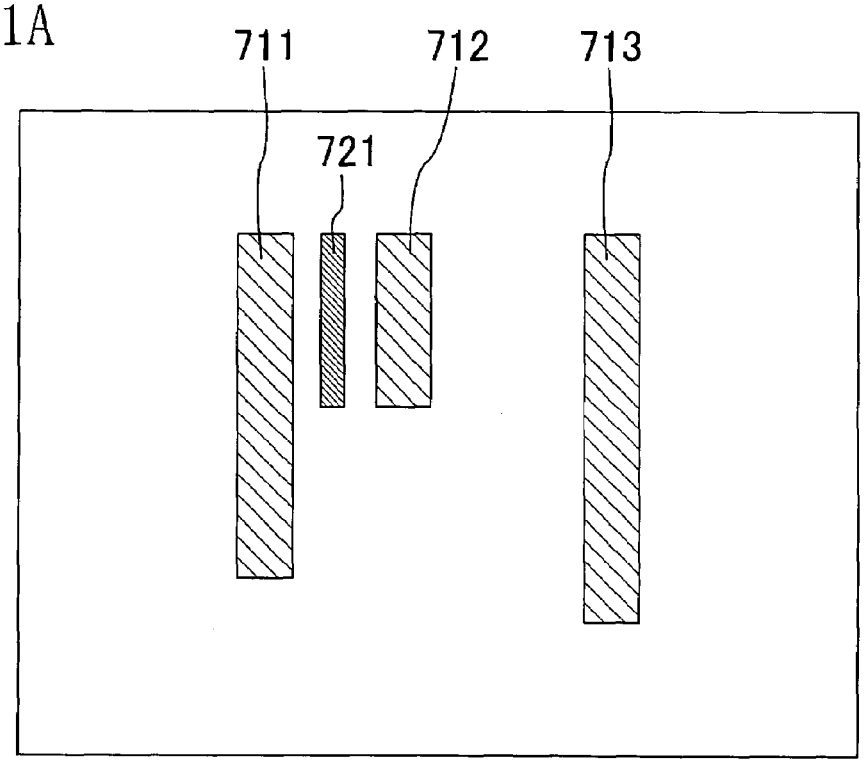
FIGS. 21A and 21B are diagrams of exemplified mask patterns created in procedures in the mask data creation method of Embodiment 4 of the invention.

Then, in step S103, an auxiliary pattern 721 made of a phase shifter portion is provided between the principal patterns 711 and 712 as shown in FIG. 21A on the basis of exposure conditions and mask parameters such as the transmittance of the phase shifter portion. At this point, as described in Embodiment 1, in order to improve the pattern formation characteristics, the auxiliary pattern 721 made of a phase shifter portion is preferably provided for a given principal pattern space not more than a given dimension G1 set to be not more than 0.8×λ/NA. Also, for the same reason, the width of the auxiliary pattern 721 is preferably not more than 0.4×λ/NA. Furthermore, for the same reason, the width D1 of a phase shifter portion (an auxiliary pattern) provided for a principal pattern space of a distance S1 (whereas S1<G1) is preferably larger than the width D2 of a phase shifter portion (an auxiliary pattern) provided for a principal pattern space of a distance S2 (whereas S1<S2<G1).

Figure 21B:
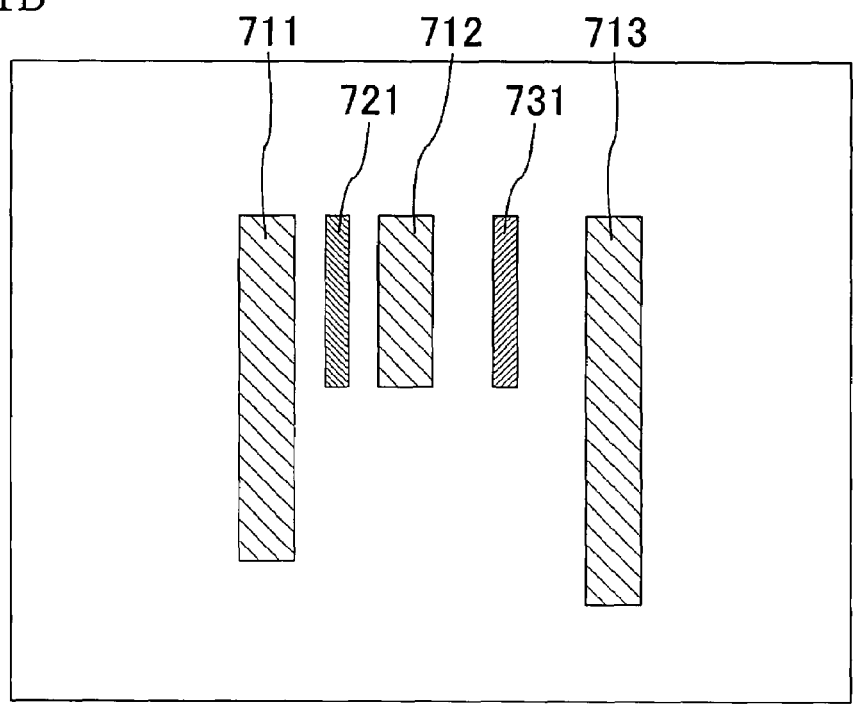

Next, in step S104, an auxiliary pattern 731 made of a transparent portion is provided between the principal patterns 712 and 713 as shown in FIG. 21B on the basis of the exposure conditions (such as the exposure wavelength λ and the numerical aperture NA) and the mask parameters such as the transmittance of a semi-light-shielding portion. At this point, as described in Embodiment 1, in order to improve the pattern formation characteristics, the auxiliary pattern 731 made of a transparent portion is preferably provided for a given principal pattern space not less than a given distance G2 set to be not less than 1.0×λ/NA and not more than a given distance G3 set to be not more than 1.6×λ/NA. At this point, an auxiliary pattern made of a semi-light-light-shielding portion may be set instead of the auxiliary pattern 731 made of a transparent portion.

The procedure of step S104 is performed for further improving the contrast of a light intensity distribution obtained by exposing light having passed through the mask pattern and may be omitted in this embodiment.

Figure 22A:
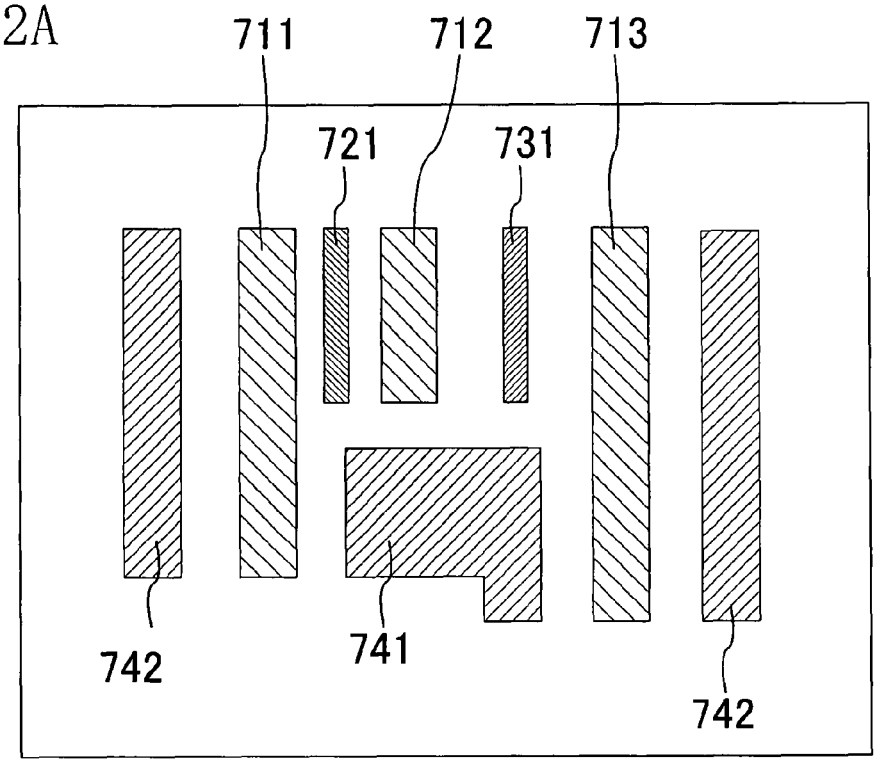
FIGS. 22A and 22B are diagrams of exemplified mask patterns created in other procedures in the mask data creation method of Embodiment 4 of the invention.

Next, in step S105, an auxiliary pattern 741 made of a semi-light-shielding portion is provided between the principal patterns 711 and 713 as shown in FIG. 22A on the basis of the exposure conditions and the mask parameters such as the transmittance of a semi-light-shielding portion. At this point, as described in Embodiment 1, in order to improve the pattern formation characteristics, the auxiliary pattern 741 made of a semi-light-shielding portion is preferably provided for a principal pattern space not less than a given distance G4 set to be not less than 1.0×λ/NA. In the case where the procedure of step S104 is not omitted, the distance G4 is preferably set so that G4>G3 and G4>1.0×λ/NA. Furthermore, as shown in FIG. 22A, an auxiliary pattern 742 made of a semi-light-shielding portion is preferably provided not only between principal patterns but also in a region where a principal pattern is optically isolatedly present (such as a region on a side of the principal pattern 711 or 713 not adjacent to another principal pattern). At this point, as described in Embodiment 1, both of the auxiliary pattern 741 provided between the principal patterns and the auxiliary pattern 742 provided in the region where the principal pattern is optically isolatedly present are preferably away from each of the principal patterns 711 through 713 by a distance not more than 0.8×λ/NA. Moreover, each of the auxiliary patterns 741 and 742 made of a semi-light-shielding portion is preferably away from each of the principal patterns 711 through 713 by a distance not less than 0.3×λ/NA. Furthermore, the width of each of the auxiliary patterns 741 and 742 made of a semi-light-shielding portion is preferably not less than 0.4×λ/NA.

The procedure of step S105 is performed for further improving the contrast of the light intensity distribution obtained by the exposing light having passed through the mask pattern and may be omitted in this embodiment.

Figure 22B:
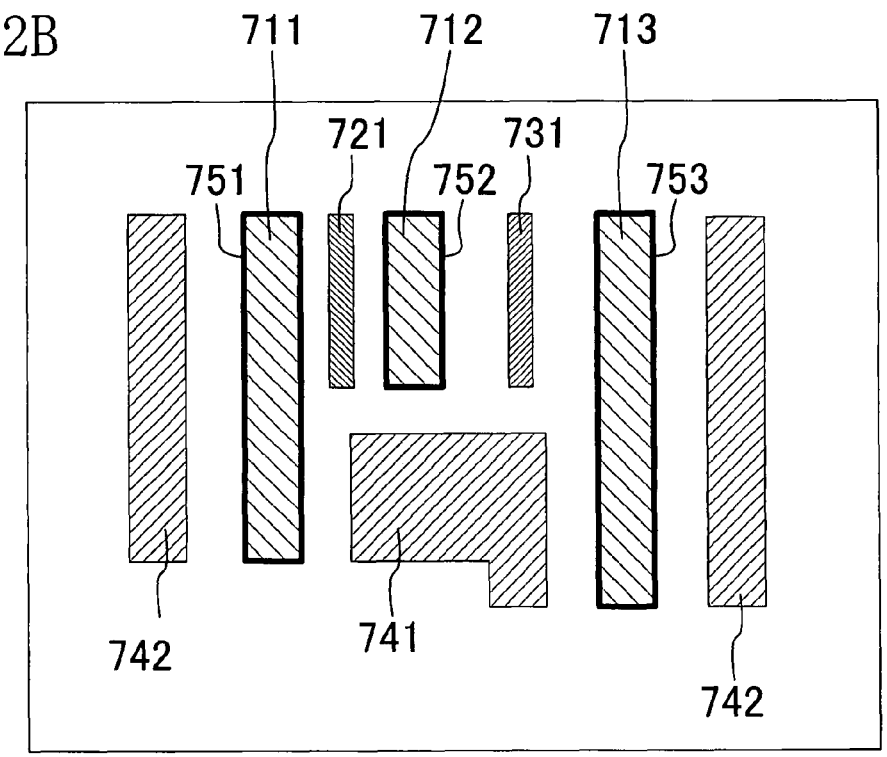

Next, in step S106, preparations are made for a process to adjust the dimension of the mask pattern (namely, OPC processing) carried out for forming a pattern with a desired dimension correspondingly to an opening pattern (a transparent portion) of the photomask through the exposure performed by using the photomask of this invention. Since the auxiliary patterns have been already created in the procedures up to step S105 in this embodiment, merely the dimensions of transparent portions used as the principal patterns are adjusted in the OPC processing, so as to create photomask data for realizing desired CD values. For this purpose, for example, CD adjustment edges 751 through 753 are set on the boundaries corresponding to the outlines of the principal patterns 711 through 713 made of a transparent portion as shown in FIG. 22B. In other words, the CD adjustment edges 751 through 753 are set on the boundaries between the principal patterns 711 through 713 and the light-shielding portion (the background). In this embodiment, the outline shapes of the principal patterns 711 through 713 are modified, in the OPC processing, by dividing or moving the CD adjustment edges 751 through 753. It is noted that a CD adjustment edge may be divided correspondingly to respective sides of a principal pattern so as to move each of the divided edges. In this embodiment, patterns having different characteristics, such as an auxiliary pattern made of a transparent portion, an auxiliary pattern made of a phase shifter portion and an auxiliary pattern made of a semi-light-shielding portion, are simultaneously present as auxiliary patterns. The dimensions of these auxiliary patterns may be modified for adjusting the CD values at this point, but the OPC processing can be simplified through CD adjustment performed by deforming merely the principal patterns having the same characteristics with the dimensions of the auxiliary patterns having different characteristics fixed as in this embodiment.

Next, in step S107, step S108 and step S109, the OPC processing (such as model base OPC processing) is performed. Specifically, in step S107, the dimension of a resist pattern (more accurately, the dimension of a resist exposed region) to be formed by using the photomask of this invention is predicted through simulation performed in consideration of the optical principle, a resist development characteristic and, if necessary, an etching characteristic and the like. Subsequently, in step S108, it is examined whether or not the predicted pattern dimension accords with the dimension of a desired target pattern. When they do not accord with each other, the CD adjustment edges are moved on the basis of a difference between the predicted pattern dimension and the desired dimension in step S109, so as to deform the outline shape of the principal pattern, namely, the outline shape of the transparent portion. In this manner, the mask pattern can be deformed.

Figure 23:
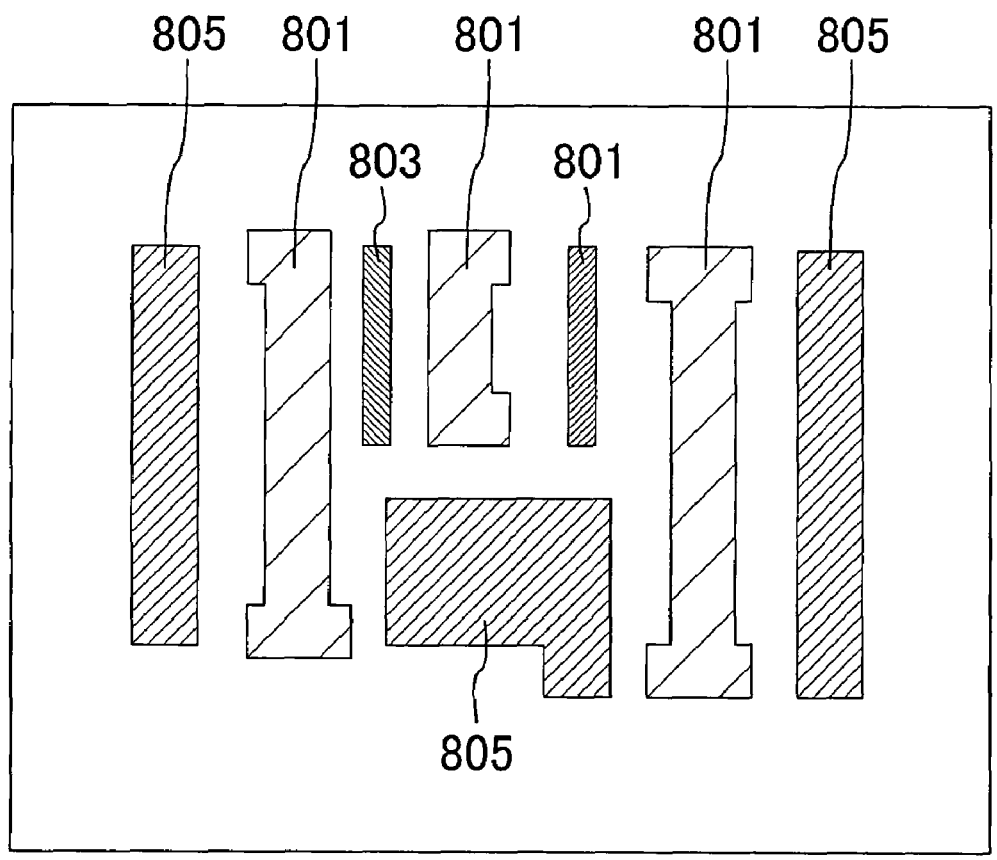
FIG. 23 is a diagram of an exemplified specific mask pattern obtained by the mask data creation method according to Embodiment 4 of the invention.

As a characteristic of this embodiment, auxiliary patterns used for improving the contrast are created in steps S103 through S105 and the outline shape of a principal pattern is changed in steps S107 through S109, so as to realize a mask pattern capable of forming a pattern with a desired dimension. Specifically, the procedures of steps S107 through S109 are repeatedly carried out until the predicted pattern dimension accords with the desired dimension, so that a mask pattern capable of forming a pattern with a desired dimension can be ultimately output in step S110. FIG. 23 shows an example of the mask pattern output in step S110. As shown in FIG. 23, as pattern data of a mask whose background is set as an unexposed region made of a light-shielding portion, pattern data of a transparent portion 801, a phase shifter portion 803 and a semi-light-shielding portion 805 is created.

When the photomask having the mask pattern created by the aforementioned mask data creation method of this embodiment, namely, the photomask of this invention, is used for exposing a wafer on which a resist has been applied, the contrast of light having passed through an opening pattern (namely, a principal pattern made of a transparent portion) is improved. Therefore, a fine space pattern can be formed in a portion of the resist corresponding to the opening pattern.

In this embodiment, a semi-light-shielding portion set as an auxiliary pattern in step S105 has transmittance, against the exposing light, preferably of 3% or more and 20% or less. Thus, an effect to sufficiently improve a margin in the pattern formation can be attained while suppressing transfer of the auxiliary pattern made of a semi-light-shielding portion.

Although the description is given with respect to a transmission photomask in this embodiment, this does not limit the invention. It goes without saying that mask data creation for a reflection mask can be performed in a similar manner to this embodiment by replacing all the transmission phenomenon of the exposing light with the reflection phenomenon by, for example, replacing the transmittance with the reflectance.

Embodiment 5

A mask data creation method according to Embodiment 5 of the invention will now be described with reference to the accompanying drawings. In this embodiment, mask data for the photomask of Embodiment 2 or its modifications (hereinafter referred to as the photomask of this invention) is created. Herein, creation of mask data means creation of a pattern of an exposed region for transmitting exposing light (corresponding to an exposed region for reflecting exposing light in a reflection mask) and a pattern of an unexposed region for not transmitting the exposing light (corresponding to an unexposed region for not reflecting the exposing light in a reflection mask) in the background set for a mask. For example, in the case where the background of the mask is set as a light-shielding region for not transmitting the exposing light, a pattern of an exposed region for transmitting the exposing light is created. On the other hand, in the case where the background of the mask is set as a region for transmitting the exposing light (corresponding to a region for reflecting the exposing light in a reflection mask), a pattern of an exposed region for transmitting the exposing light in a different phase with respect to the background (corresponding to an exposed region for reflecting the exposing light in a different phase with respect to the background in a reflection mask) and a pattern of an unexposed region such as a light-shielding region (corresponding to a non-reflection region in a reflection mask) are created. In a transmission mask, an exposed region for transmitting exposing light specifically corresponds to a transparent portion, a semi-light-shielding portion or a phase shifter portion, and in a reflection mask, an exposed region for reflecting exposing light specifically corresponds to a reflection portion, a semi-reflection portion or a phase shifter portion.

Figure 24:
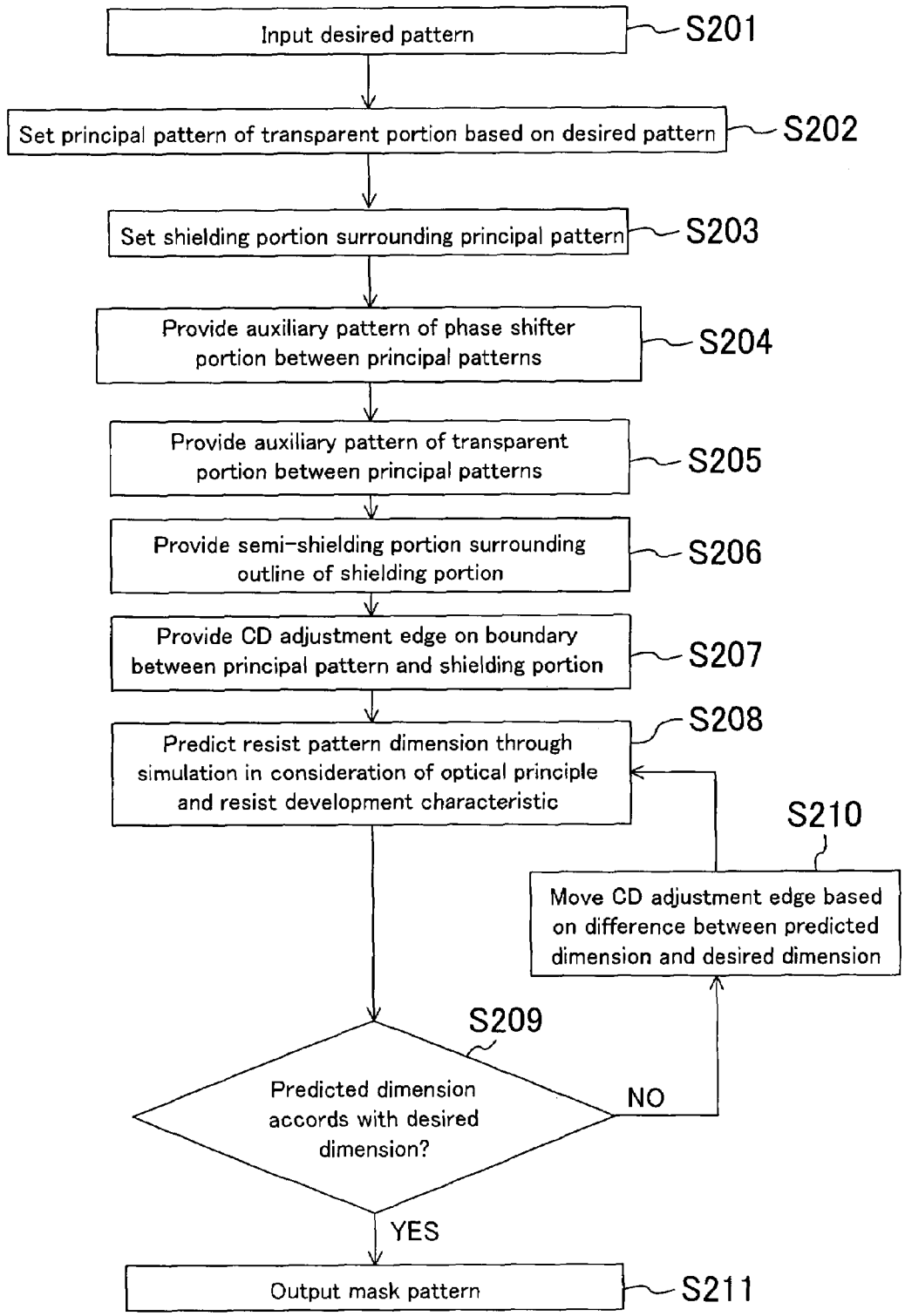
FIG. 24 is a flowchart of a basic flow of a mask data creation method according to Embodiment 5 of the invention.

Now, the flow of the mask data creation method of this embodiment will be described in detail. FIG. 24 is a flowchart for showing the basic flow of the mask data creation method of this embodiment. FIGS. 25A, 25B, 26A, 26B, 27A, 27B and 28 respectively show exemplified mask patterns to be specifically created in respective procedures in the mask data creation method of this embodiment.

Also in this embodiment, the patterns shown in FIG. 20A are desired patterns to be formed by using the photomask of this invention. Specifically, patterns 701 through 703 shown in FIG. 20A are patterns corresponding to portions of a resist to be exposed to exposing light in the pattern exposure performed by using the photomask of this invention and become space patterns after resist pattern formation.

In the description of the pattern formation of this embodiment, the positive resist process is employed unless otherwise mentioned. In other words, it is premised in the following description that a resist exposed portion is removed through development and a resist unexposed portion remains as a resist pattern. Accordingly, when the negative resist process is employed instead of the positive resist process, the mask data creation method is performed in the same manner as in this embodiment except that a resist exposed portion remains as a resist pattern with a resist unexposed portion removed.

First, in step S201, desired patterns such as the patterns 701 through 703 shown in FIG. 20A are input to a computer used for the mask data creation. At this point, the transmittances of a phase shifter portion and a semi-light-shielding portion included in a mask pattern are set. Also, the desired patterns may be previously deformed, namely, enlarged or reduced in each portion thereof if necessary.

Figure 25A:
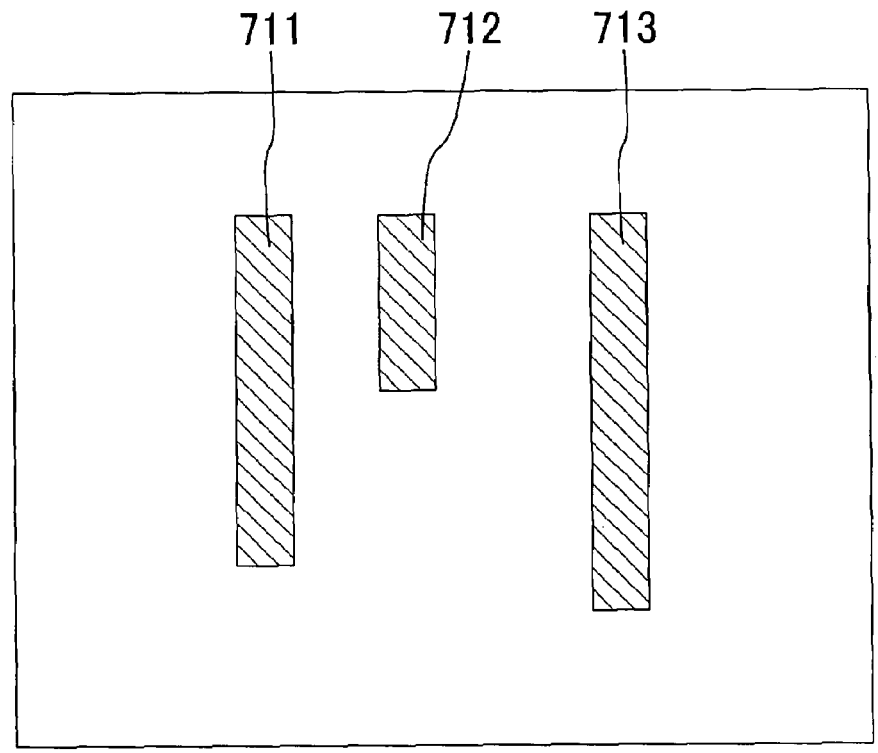
FIGS. 25A and 25B are diagrams of exemplified specific mask patterns created in procedures in the mask data creation method of Embodiment 5 of the invention.

Next, in step S202, a principal pattern made of a transparent portion is set on the basis of the desired patterns. At this point, "a principal pattern is set" because the principal pattern is deformed by the OPC processing in a subsequent step and hence, at this point, the principal pattern is merely a virtual principal pattern used for creating an auxiliary pattern as described below. FIG. 25A shows principal patterns 711 through 713 set in step S202 correspondingly to the desired patterns 701 through 703. It is noted that the background of the mask is set as a semi-light-shielding portion (an exposed region) in step S202 in this embodiment. As described in Embodiment 2, the transmittance of a semi-light-shielding portion is preferably 3% or more and 20% or less.

Figure 25B:
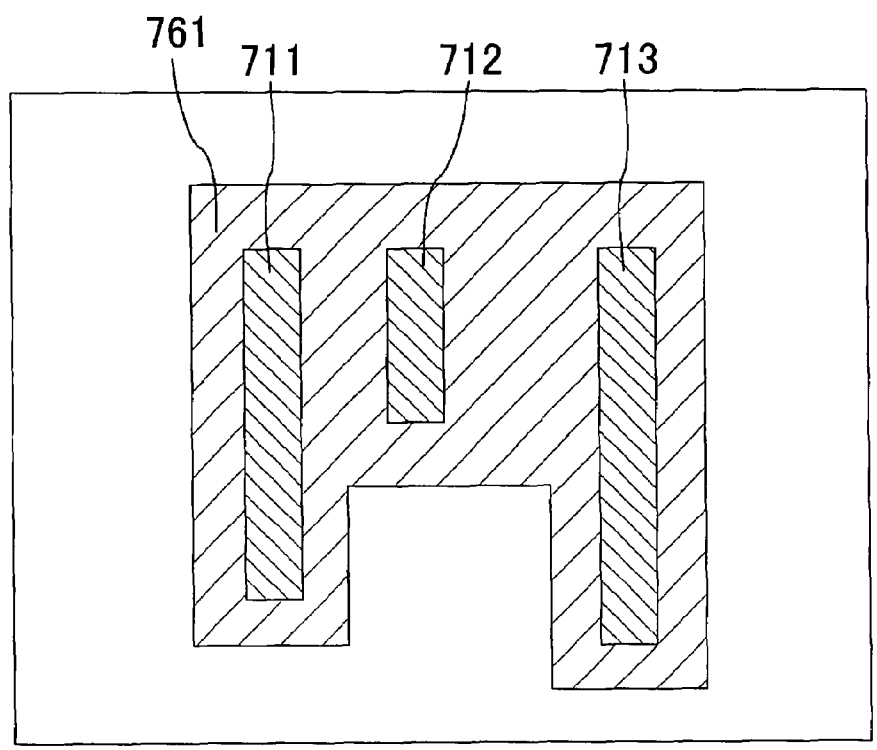

Then, in step S203, a light-shielding portion 761 for surrounding the principal patterns 711 through 713 is set as shown in FIG. 25B on the basis of exposure conditions. At this point, as described in Embodiment 2, a region of the light-shielding portion 761 sandwiched between each of the principal patterns 711 through 713 and the semi-light-shielding portion corresponding to the background has a width preferably not less than $0.3 \times \lambda/NA$ and not more than $0.8 \times \lambda/NA$. However, a region of the light-shielding portion 761 sandwiched between the principal patterns may be $1.6 \times \lambda/NA$ or less.

Figure 26A:
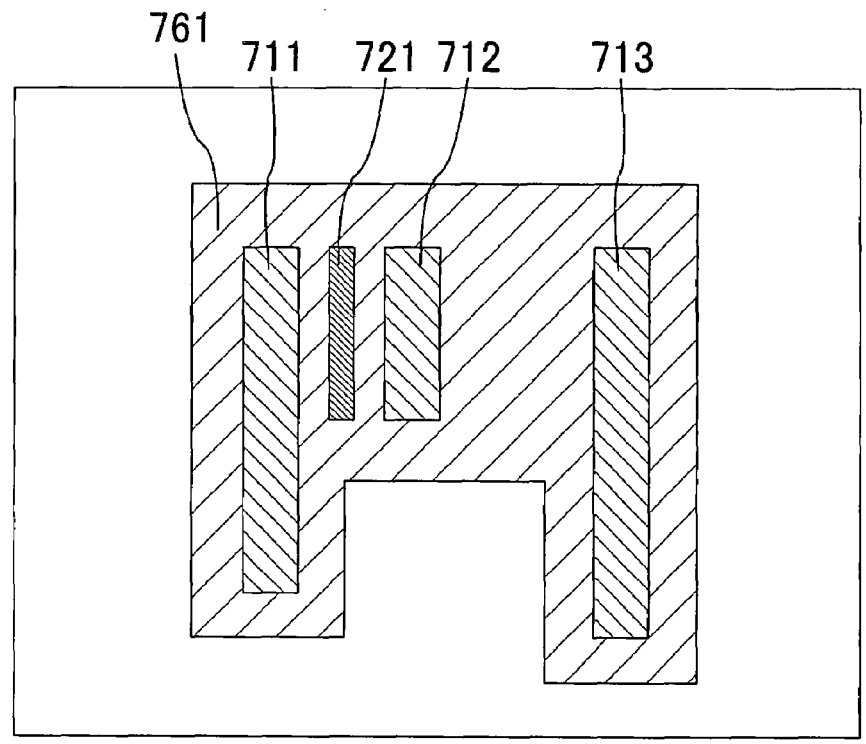
FIGS. 26A and 26B are diagrams of exemplified specific mask patterns created in other procedures in the mask data creation method of Embodiment 5 of the invention.

Next, in step S204, an auxiliary pattern 721 made of a phase shifter portion is provided between the principal patterns 711 and 712 as shown in FIG. 26A on the basis of the exposure conditions and mask parameters such as the transmittance of a phase shifter portion. At this point, as described in Embodiment 2, in order to improve the pattern formation characteristics, the auxiliary pattern 721 made of a phase shifter portion is preferably provided for a principal pattern space not more than a given distance G1 set to be not more than $0.8 \times \lambda/NA$. Also, for the same reason, the width of the auxiliary pattern 721 is preferably not more than $0.4 \times \lambda/NA$. Furthermore, for the same reason, the width D1 of a phase shifter portion (an auxiliary pattern) provided for a principal pattern space of a distance S1 (whereas S1<G1) is preferably larger than the width D2 of a phase shifter portion (an auxiliary pattern) provided for a principal pattern space of a distance S2 (whereas S1<S2<G1).

Figure 26B:
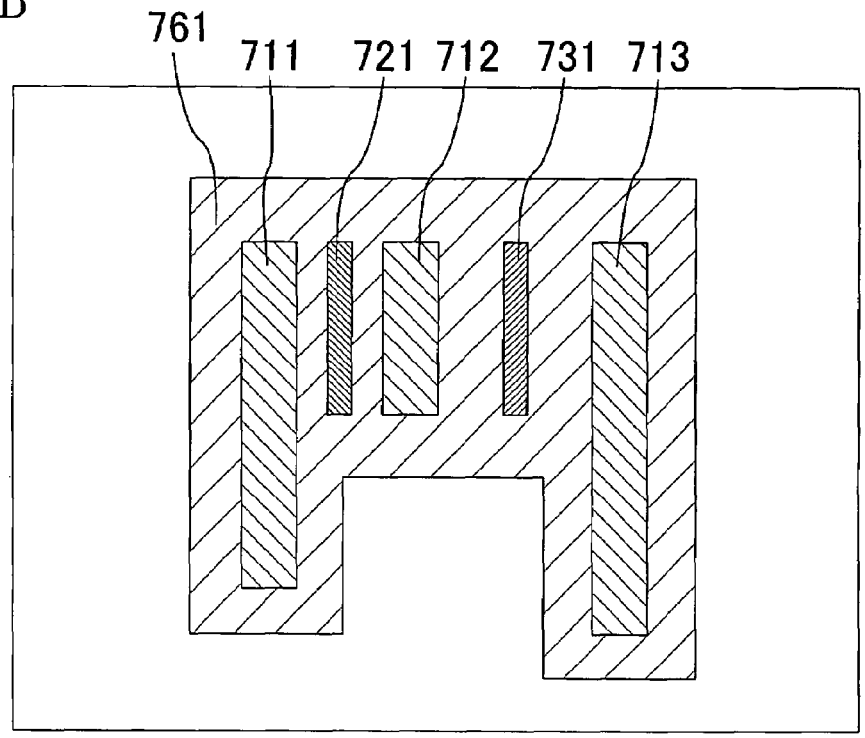

Next, in step S205, an auxiliary pattern 731 made of a transparent portion is provided between the principal patterns 712 and 713 as shown in FIG. 26B on the basis of the exposure conditions (such as the exposure wavelength % and the numerical aperture NA) and the mask parameters such as the transmittance of a semi-light-shielding portion. At this point, as described in Embodiment 2, in order to improve the pattern formation characteristics, the auxiliary pattern 731 made of a transparent portion is preferably provided for a principal pattern space not less than a given distance G2 set to be not less than $1.0 \times \lambda/NA$ and not more than a given distance G3 set to be not more than $1.6 \times \lambda/NA$. At this point, an auxiliary pattern made of a semi-light-shielding portion may be set instead of the auxiliary pattern 731 made of a transparent portion.

Figure 27A:
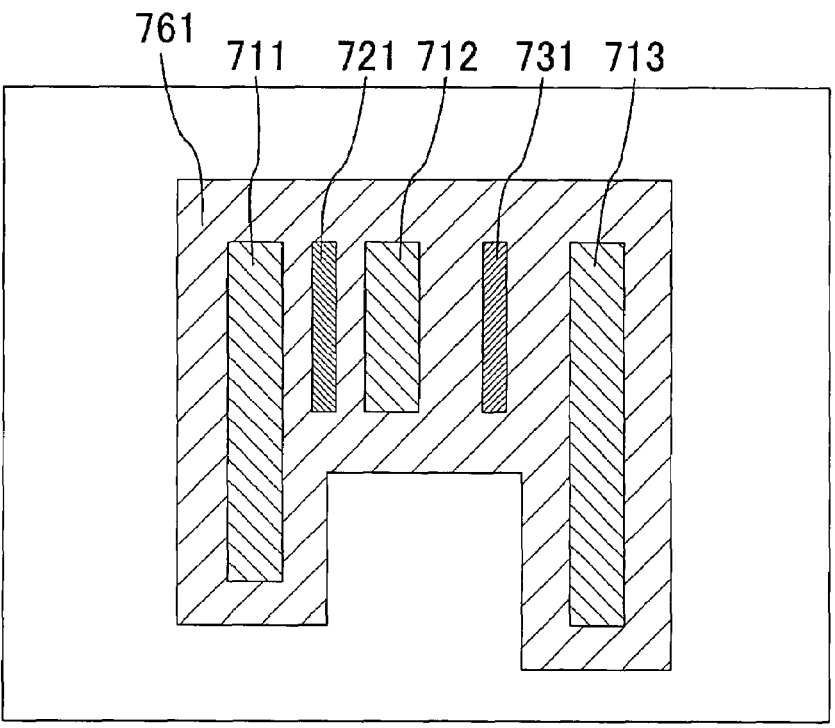
FIGS. 27A and 27B are diagrams of exemplified specific mask patterns created in other procedures in the mask data creation method of Embodiment 5 of the invention.

Then, in step S206, a semi-light-shielding portion surrounding the outline of the light-shielding portion 761 is provided as shown in FIG. 27A. At this point, as described in Embodiment 2, the width of the semi-light-shielding portion is preferably not less than $0.4 \times \lambda/NA$. Since the whole background is already set as the semi-light-shielding portion in step S202 in this embodiment, the procedure of step S206 may be omitted.

Figure 27B:
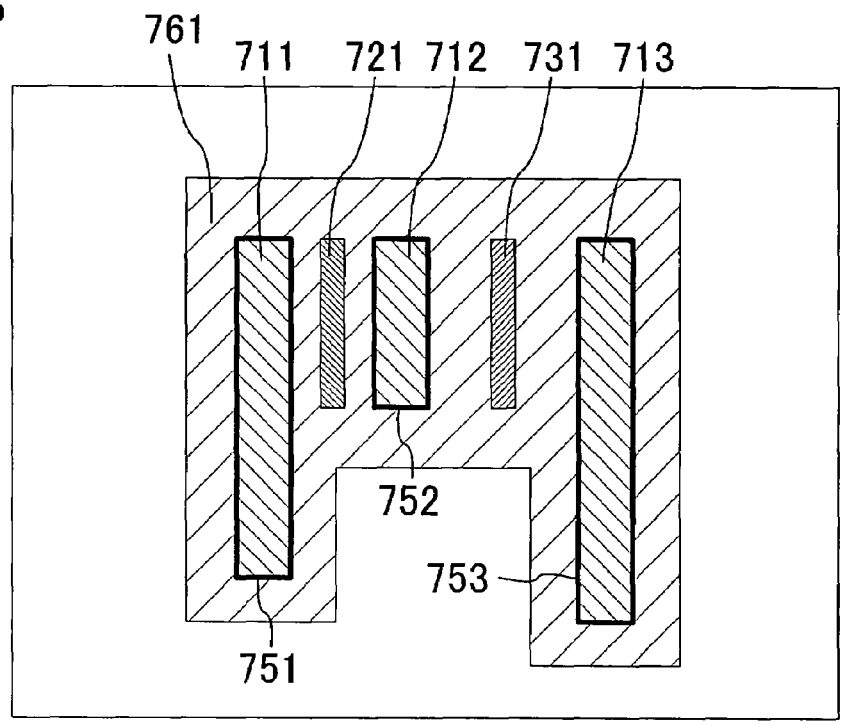

Next, in step S207, preparations are made for a process to adjust the dimension of the mask pattern (namely, the OPC processing) carried out for forming a pattern with a desired dimension correspondingly to an opening pattern (a transparent portion) of the photomask through the exposure performed by using the photomask of this invention. Since the auxiliary patterns have been already created in the procedures up to step S206 in this embodiment, merely the dimensions of the transparent portions used as the principal patterns are adjusted in the OPC processing, so as to create photomask data for realizing desired CD values. For this purpose, for example, CD adjustment edges 751 through 753 are set on the boundaries correspondingly to the outlines of the principal patterns 711 through 713 made of a transparent portion as shown in FIG. 27B. In other words, the CD adjustment edges 751 through 753 are set on the boundaries between the principal patterns 711 through 713 and the light-shielding portion 761. In this embodiment, the outline shapes of the principal patterns 711 through 713 are modified, in the OPC processing, by dividing or moving the CD adjustment edges 751 through 753. It is noted that a CD adjustment edge may be divided correspondingly to respective sides of a principal pattern so as to move each of the divided edges. In this embodiment, patterns having different characteristics, such as an auxiliary pattern made of a transparent portion, an auxiliary pattern made of a phase shifter portion and an auxiliary pattern made of a semi-light-shielding portion, are simultaneously present as auxiliary patterns. The dimensions of these auxiliary patterns may be modified for adjusting the CD values at this point, but the OPC processing can be simplified through the CD adjustment performed by deforming merely the principal patterns having the same characteristics with the dimensions of the auxiliary patterns having different characteristics fixed as in this embodiment.

Next, in step S208, step S209 and step S210, the OPC processing (such as the model base OPC processing) is performed. Specifically, in step S208, the dimension of a resist pattern (more accurately, the dimension of a resist exposed region) to be formed by using the photomask of this invention is predicted through simulation performed in consideration of the optical principle, a resist development characteristic and, if necessary, an etching characteristic and the like. Subsequently, in step S209, it is examined whether or not the predicted pattern dimension accords with the dimension of a desired target pattern. When they do not accord with each other, the CD adjustment edges are moved on the basis of a difference between the predicted pattern dimension and the desired dimension in step S210, so as to deform the outline shape of the principal pattern, namely, the outline shape of the transparent portion. In this manner, the mask pattern can be deformed.

Figure 28:
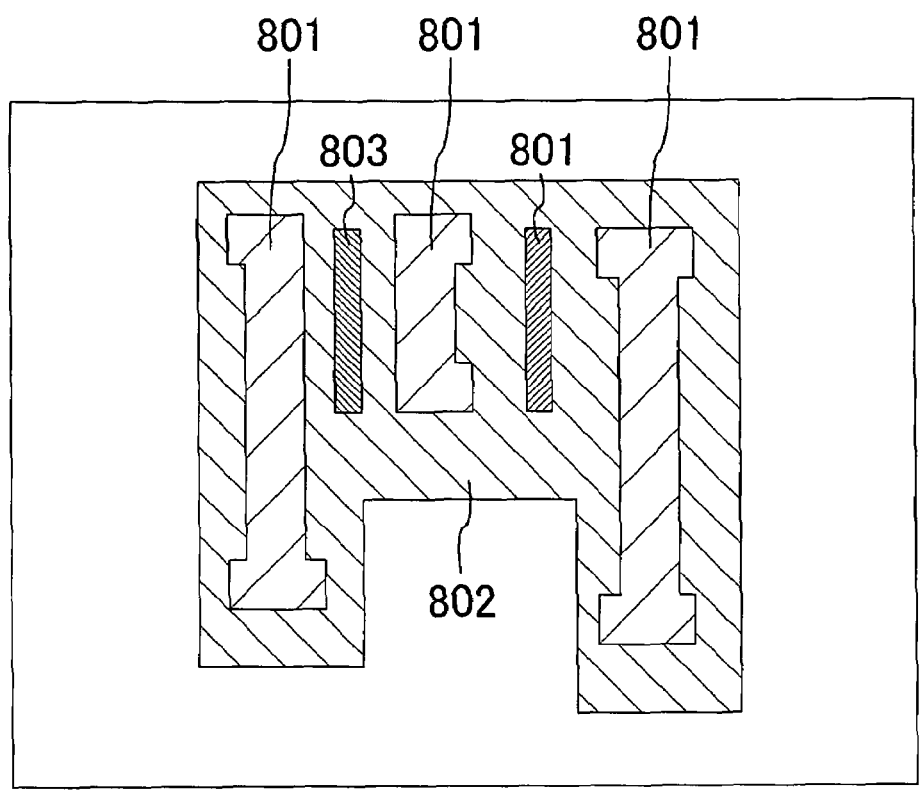
FIG. 28 is a diagram of an exemplified specific mask pattern obtained by the mask data creation method according to Embodiment 5 of the invention.
Figure 29A:
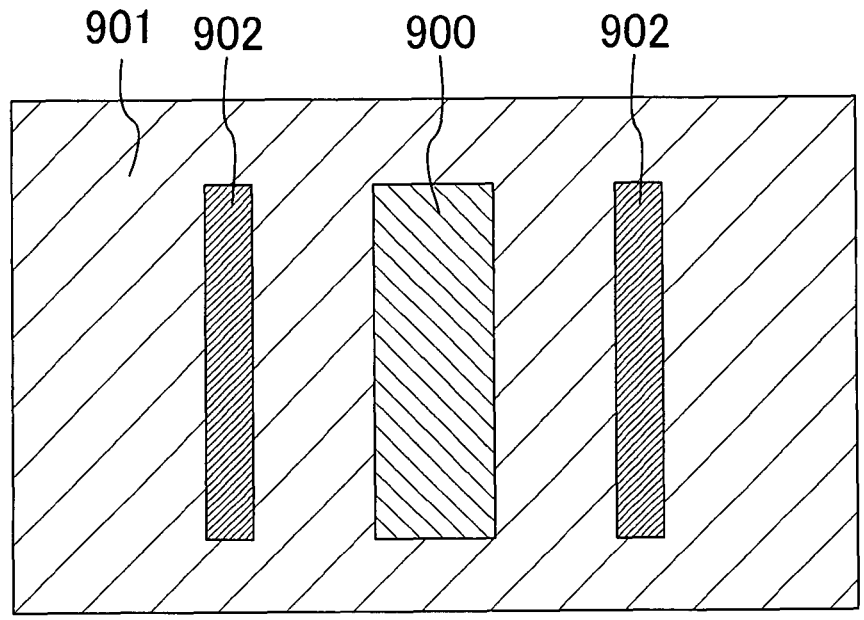
FIGS. 29A and 29B are plan views of conventional photomasks.
Figure 29B:
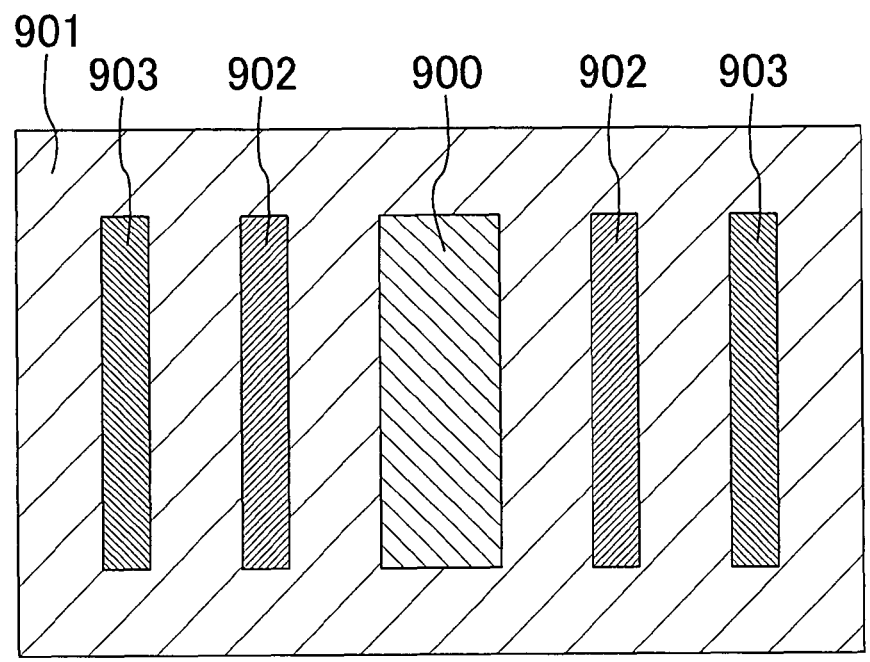

As a characteristic of this embodiment, an auxiliary pattern, a light-shielding portion pattern and a semi-light-shielding portion pattern used for improving the contrast are created in steps S203 through S206 and the outline shape of a principal pattern is changed in steps S208 through S210, so as to realize a mask pattern capable of forming a pattern with a desired dimension. Specifically, the procedures of steps S208 through S210 are repeatedly carried out until the predicted pattern dimension accords with the desired dimension, so that a mask pattern capable of forming a pattern with a desired dimension can be ultimately output in step S211. FIG. 28 shows an example of the mask pattern output in step S211. As shown in FIG. 28, as pattern data of a mask whose background is set as an exposed region made of a semi-light-shielding portion, pattern data of a transparent portion 801, a phase shifter portion 803 and a light-shielding portion 802 is created.

When the photomask having the mask pattern created by the aforementioned mask data creation method of this embodiment, namely, the photomask of this invention, is used for exposing a wafer on which a resist has been applied, the contrast of light having passed through an opening pattern (namely, a principal pattern made of a transparent portion) is improved. Therefore, a fine space pattern can be formed in a portion of the resist corresponding to the opening pattern.

Although mask data of a photomask including both an auxiliary pattern for transmitting light in an opposite phase with respect to a principal pattern and an auxiliary pattern for transmitting light in the same phase with respect to the principal pattern is created in this embodiment, either of the auxiliary patterns may be omitted instead. Specifically, either of the procedures of steps S204 and S205 may be omitted.

Although the description is given with respect to a transmission photomask in this embodiment, this does not limit the invention. It goes without saying that mask data creation for a reflection mask can be performed in a similar manner to this embodiment by replacing all the transmission phenomenon of the exposing light with the reflection phenomenon by, for example, replacing the transmittance with the reflectance.

What is claimed is:

1. A photomask comprising a principal pattern made of a plurality of isolated transparent portions and formed in a light-shielding portion disposed on a transparent substrate having a transparent property against exposing light,
   wherein said principal pattern includes a first principal pattern and a second principal pattern adjacent to each other at a given distance,
   a first auxiliary pattern made of a phase shifter portion for transmitting the exposing light in an opposite phase to the exposing light passing through said transparent portion is formed between said first principal pattern and said second principal pattern,
   said first auxiliary pattern is provided such that a light intensity in a position corresponding to said first auxiliary pattern does not expose a resist,
   said transparent portions have a transmittance substantially equal to said transparent substrate, and
   a second auxiliary pattern made of a semi-light-shielding portion for partially transmitting the exposing light in the same phase to the exposing light passing through said transparent portion is formed on a side, opposite to said first auxiliary pattern, of at least one of said first principal pattern and said second principal pattern.

2. The photomask of claim 1, wherein a single phase shifter portion is provided, as said first auxiliary pattern, between said first principal pattern and said second principal pattern with a part of said light-shielding portion sandwiched between each of said first principal pattern and said second principal pattern and said first auxiliary pattern.

3. A photomask comprising a principal pattern made of a plurality of isolated transparent portions and formed in a light-shielding portion disposed on a transparent substrate having a transparent property against exposing light,
   wherein said principal pattern includes a first principal pattern, a second principal pattern adjacent to said first principal pattern at a first distance and a third principal pattern adjacent to said first principal pattern at a second distance larger than said first distance,
   an auxiliary pattern made of a semi-light-shielding portion for partially transmitting the exposing light in the same phase to the exposing light passing through said transparent portion is formed between said first principal pattern and said third principal pattern, an auxiliary pattern made of the semi-light-shielding portion is not formed between said first principal pattern and said second principal pattern, and said transparent portions have a transmittance substantially equal to said transparent substrate.

4. A photomask comprising a principal pattern made of a plurality of isolated transparent portions and formed in a light-shielding portion disposed on a transparent substrate having a transparent property against exposing light, wherein said principal pattern includes a first principal pattern, a second principal pattern adjacent to said first principal pattern at a first distance and a third principal pattern adjacent to said first principal pattern at a second distance larger than said first distance, a first auxiliary pattern made of a phase shifter portion for transmitting the exposing light in an opposite phase to the exposing light passing through said transparent portion is formed between said first principal pattern and said second principal pattern, an auxiliary pattern made of the phase shifter portion is not formed between said first principal pattern and said third principal pattern, said first auxiliary pattern is provided such that a light intensity in a position corresponding to said first auxiliary pattern does not expose a resist, said transparent portions have a transmittance substantially equal to said transparent substrate, and a second auxiliary pattern for transmitting the exposing light in the same phase to the exposing light passing through said transparent portion is formed between said first principal pattern and said third principal pattern.

5. The photomask of claim 4, wherein a single phase shifter portion is provided, as said first auxiliary pattern, at a center between said first principal pattern and said second principal pattern with a part of said light-shielding portion sandwiched between each of said first principal pattern and said second principal pattern and said first auxiliary pattern.

6. The photomask of claim 4, wherein said first distance is not more than $0.8 \times M \times \lambda/NA$ (wherein $\lambda$ indicates a wavelength of the exposing light and M and NA respectively indicate a reduction ratio and numerical aperture of a reduction projection optical system of a projection aligner).

7. The photomask of claim 4, wherein said first auxiliary pattern has a width not more than $0.4 \times M \times \lambda/NA$ (wherein $\lambda$ indicates a wavelength of the exposing light and M and NA respectively indicate a reduction ratio and numerical aperture of a reduction projection optical system of a projection aligner).

8. The photomask of claim 4, wherein said second auxiliary pattern is singly provided between said first principal pattern and said third principal pattern with a part of said light-shielding portion sandwiched between each of said first principal pattern and said third principal pattern and said second auxiliary pattern.

9. The photomask of claim 4, wherein said second distance is not less than $1.0 \times M \times \lambda/NA$ (wherein $\lambda$ indicates a wavelength of the exposing light and M and NA respectively indicate a reduction ratio and numerical aperture of a reduction projection optical system of a projection aligner).

10. The photomask of claim 4, wherein said second auxiliary pattern transmits the exposing light in a phase difference not less than $(-30+360 \times n)$ degrees and not more than $(30+360 \times n)$ degrees with respect to said transparent portion (wherein n is an integer).

11. The photomask of claim 4, wherein said second auxiliary pattern is made of a semi-light-shielding portion for partially transmitting the exposing light.

12. The photomask of claim 11, wherein said semi-light-shielding portion is made of a metal thin film with a thickness of 30 nm or less.

13. The photomask of claim 11, wherein said second auxiliary pattern has a region that is away from said first principal pattern by a distance not less than $0.3 \times M \times \lambda/NA$ and not more than $0.8 \times M \times \lambda/NA$ (wherein $\lambda$ indicates a wavelength of the exposing light and M and NA respectively indicate a reduction ratio and numerical aperture of a reduction projection optical system of a projection aligner).

14. The photomask of claim 11, wherein said semi-light-shielding portion has transmittance of 20% or less against the exposing light.

15. The photomask of claim 14, wherein said second auxiliary pattern has a region that has a width not less than $0.4 \times M \times \lambda/NA$ (wherein $\lambda$ indicates a wavelength of the exposing light and M and NA respectively indicate a reduction ratio and numerical aperture of a reduction projection optical system of a projection aligner).

16. The photomask of claim 4, wherein said second auxiliary pattern is made of another transparent portion.

17. The photomask of claim 4, wherein said phase shifter portion transmits the exposing light in a phase difference not less than $(150+360 \times n)$ degrees and not more than $(210+360 \times n)$ degrees with respect to said transparent portion (wherein n is an integer).

18. The photomask of claim 17, wherein said phase shifter portion is formed by trenching said transparent substrate.

19. A photomask comprising at least two or more principal patterns made of a plurality of isolated transparent portions and formed in a light-shielding portion disposed on a transparent substrate having a transparent property against exposing light, wherein said light-shielding portion surrounds said principal patterns, a semi-light-shielding portion for partially transmitting the exposing light in the same phase to the exposing light passing through said transparent portion is provided so as to surround an outline of said light-shielding portion, at least one auxiliary pattern having a transparent property against the exposing light is provided between said principal patterns so as to be surrounded with said light-shielding portion, said auxiliary pattern is provided such that a light intensity in a position corresponding to said auxiliary pattern does not expose a resist, said transparent portions have a transmittance substantially equal to said transparent substrate, and said semi-light-shielding portion transmits the exposing light in a phase difference not less than $(-30+360 \times n)$ degrees and not more than $(30+360 \times n)$ degrees with respect to said transparent portion (wherein n is an integer).

20. The photomask of claim 19, wherein a portion of said light-shielding portion sandwiched between each of said principal patterns and said semi-light-shielding portion has a region that has a width not less than $0.3 \times M \times \lambda/NA$ and not more than $0.8 \times M \times \lambda/NA$ (wherein $\lambda$ indicates a wavelength of the exposing light and M and NA respectively indicate a reduction ratio and numerical aperture of a reduction projection optical system of a projection aligner).

21. The photomask of claim 19, wherein said auxiliary pattern is made of a phase shifter portion for transmitting the exposing light in an opposite phase to the exposing light passing through said transparent portion.

22. The photomask of claim 21, wherein said auxiliary pattern is provided for a distance between said principal patterns not more than 0.8×M×λ/NA (wherein λ indicates a wavelength of the exposing light and M and NA respectively indicate a reduction ratio and numerical aperture of a reduction projection optical system of a projection aligner).

23. The photomask of claim 21, wherein said auxiliary pattern has a width not more than 0.4×M×λ/NA (wherein λ indicates a wavelength of the exposing light and M and NA respectively indicate a reduction ratio and numerical aperture of a reduction projection optical system of a projection aligner).

24. The photomask of claim 21, wherein said phase shifter portion transmits the exposing light in a phase difference not less than (150+360×n) degrees and not more than (210+360×n) degrees with respect to said transparent portion (wherein n is an integer).

25. The photomask of claim 24, wherein said phase shifter portion is formed by trenching said transparent substrate.

26. The photomask of claim 19, wherein said auxiliary pattern is made of another transparent portion.

27. The photomask of claim 26, wherein said auxiliary pattern is provided for a distance between said principal patterns not less than 1.0×M×λ/NA (wherein λ indicates a wavelength of the exposing light and M and NA respectively indicate a reduction ratio and numerical aperture of a reduction projection optical system of a projection aligner).

28. The photomask of claim 19, wherein said semi-light-shielding portion is made of a metal thin film with a thickness of 30 nm or less.

29. A photomask comprising a principal pattern made of a plurality of isolated reflection portions for reflecting exposing light and formed in a non-reflection portion disposed on a substrate,
wherein said principal pattern includes a first principal pattern and a second principal pattern adjacent to each other at a given distance,
a first auxiliary pattern made of a phase shifter portion for reflecting the exposing light in an opposite phase to the exposing light reflected by said reflection portion is formed between said first principal pattern and said second principal pattern,
said first auxiliary pattern is provided such that a light intensity in a position corresponding to said first auxiliary pattern does not expose a resist, and
a second auxiliary pattern made of a semi-reflection portion for partially reflecting the exposing light in the same phase to the exposing light reflected by said reflection portion is formed on a side, opposite to said first auxiliary pattern, of at least one of said first principal pattern and said second principal pattern.

30. The photomask of claim 19, wherein a single phase shifter portion is provided, as said first auxiliary pattern, between said first principal pattern and said second principal pattern with a part of said non-reflection portion sandwiched between each of said first principal pattern and said second principal pattern and said auxiliary pattern.

31. A photomask comprising a principal pattern made of a plurality of isolated reflection portions for reflecting exposing light and formed in a non-reflection portion disposed on a substrate,
wherein said principal pattern includes a first principal pattern, a second principal pattern adjacent to said first principal pattern at a first distance and a third principal pattern adjacent to said first principal pattern at a second distance larger than said first distance,
an auxiliary pattern made of a semi-reflection portion for partially reflecting the exposing light in the same phase to the exposing light reflected by said reflection portion is formed between said first principal pattern and said third principal pattern, and
an auxiliary pattern made of the semi-reflection portion is not formed between said first principal pattern and said second principal pattern.

32. A photomask comprising a principal pattern made of a plurality of isolated reflection portions for reflecting exposing light and formed in a non-reflection portion disposed on a substrate,
wherein said principal pattern includes a first principal pattern, a second principal pattern adjacent to said first principal pattern at a first distance and a third principal pattern adjacent to said first principal pattern at a second distance larger than said first distance,
a first auxiliary pattern made of a phase shifter portion for reflecting the exposing light in an opposite phase to the exposing light reflected by said reflection portion is formed between said first principal pattern and said second principal pattern,
an auxiliary pattern made of the phase shifter portion is not formed between said first principal pattern and said third principal pattern,
a second auxiliary pattern for reflecting the exposing light in the same phase to the exposing light reflected by said reflection portion is formed between said first principal pattern and said third principal pattern.

33. The photomask of claim 32, wherein said second auxiliary pattern is made of a semi-reflection portion for partially reflecting the exposing light.

34. A photomask comprising at least two or more principal patterns made of a plurality of isolated reflection portions for reflecting exposing light and formed in a non-reflection portion disposed on a substrate,
wherein said non-reflection portion surrounds said principal patterns,
a semi-reflection portion for partially reflecting the exposing light in the same phase to the exposing light reflected by said reflection portion is provided so as to surround an outline of said non-reflection portion,
at least one auxiliary pattern having a reflecting property against the exposing light is provided between said principal patterns so as to be surrounded with said non-reflection portion, and
said auxiliary pattern is made of a phase shifter portion for reflecting the exposing light in an opposite phase to the exposing light reflected by said reflection portion.

35. A pattern formation method using the photomask of claim 1, comprising the steps of:
(a) forming a resist film on a substrate;
(b) irradiating said resist film with the exposing light through said photomask; and
(c) forming a resist pattern by developing said resist film having been irradiated with the exposing light.

36. The pattern formation method of claim 35, wherein oblique incident illumination is employed in the step (b).

* * * * *

UNITED STATES PATENT AND TRADEMARK OFFICE
CERTIFICATE OF CORRECTION

| | |
|---|---|
| PATENT NO. | : 7,790,337 B2 |
| APPLICATION NO. | : 11/701511 |
| DATED | : September 7, 2010 |
| INVENTOR(S) | : Akio Misaka |

It is certified that error appears in the above-identified patent and that said Letters Patent is hereby corrected as shown below:

Specifically, in Column 45, line 50 reads -- The photomask of claim 19..., but it should read -- The photomask of claim 29...

Signed and Sealed this
First Day of February, 2011

David J. Kappos
*Director of the United States Patent and Trademark Office*